United States Patent
Lockhart et al.

(10) Patent No.: US 7,474,228 B2
(45) Date of Patent: Jan. 6, 2009

(54) BATTERY MONITOR

(75) Inventors: Bradley W. Lockhart, South Boardman, MI (US); Jason W. Toomey, Traverse City, MI (US)

(73) Assignee: Tarma, LLC, Indianapolis, IN (US)

( * ) Notice: Subject to any disclaimer, the term of this patent is extended or adjusted under 35 U.S.C. 154(b) by 98 days.

(21) Appl. No.: 11/209,519

(22) Filed: Aug. 23, 2005

(65) Prior Publication Data

US 2006/0017582 A1    Jan. 26, 2006

Related U.S. Application Data

(63) Continuation-in-part of application No. 10/924,036, filed on Aug. 23, 2004, which is a continuation-in-part of application No. 10/465,755, filed on Jun. 19, 2003, now Pat. No. 6,885,307.

(60) Provisional application No. 60/390,016, filed on Jun. 19, 2002.

(51) Int. Cl.
 *G08B 21/00* (2006.01)
(52) U.S. Cl. .............. 340/636.1; 340/636.12; 340/636.13; 340/636.15; 340/636.16; 340/636.17; 340/636.18; 340/636.19; 324/433; 324/435
(58) Field of Classification Search .............. 340/636.1, 340/636.11, 636.12, 636.13, 636.14, 636.15, 340/636.16, 636.17, 636.18, 636.19, 636.2, 340/636.21; 324/426, 433, 435; 320/107, 320/137, 116, 120, 161, 162, 163, 164
See application file for complete search history.

(56) References Cited

U.S. PATENT DOCUMENTS

| | | | |
|---|---|---|---|
| 4,697,134 A | 9/1987 | Burkum et al. | 320/48 |
| 4,968,942 A | 11/1990 | Palanisamy | 324/430 |
| 5,250,904 A | 10/1993 | Slander et al. | 324/430 |
| 5,321,627 A * | 6/1994 | Reher | 702/63 |
| 5,349,282 A | 9/1994 | McClure | 320/32 |
| 5,546,003 A | 8/1996 | Noworolski | 324/434 |
| 5,572,136 A * | 11/1996 | Champlin | 324/426 |
| 5,596,262 A * | 1/1997 | Boll | 340/636.12 |
| 5,661,463 A | 8/1997 | Letchak et al. | 340/636.1 |
| 5,705,929 A * | 1/1998 | Caravello et al. | 324/430 |
| 5,710,503 A | 1/1998 | Sideris et al. | 320/6 |
| 5,811,975 A | 9/1998 | Bernardo | 324/414 |
| 5,862,515 A | 1/1999 | Kobayashi et al. | 702/63 |
| 5,900,734 A * | 5/1999 | Munson | 324/433 |
| 5,969,625 A | 10/1999 | Russo | 340/636.1 |
| 6,037,777 A | 3/2000 | Champlin | 324/430 |
| 6,094,030 A | 7/2000 | Gunthorpe et al. | 320/116 |
| 6,268,710 B1 * | 7/2001 | Koga | 320/116 |

(Continued)

OTHER PUBLICATIONS

GBN Technologies, Intelligent Monitoring System, Publication No. GB-3909, Jul. 2000.

(Continued)

*Primary Examiner*—Toan N Pham
(74) *Attorney, Agent, or Firm*—Young Basile, PC

(57) ABSTRACT

An apparatus and method for monitoring at least one battery condition. An ac signal is applied to a battery. A difference between a signal output from the battery and a threshold determines a battery condition. The determined battery condition is transmitted remotely from the battery location either wirelessly or through a network to controller and/or is visibly displayed at the battery location.

14 Claims, 51 Drawing Sheets

U.S. PATENT DOCUMENTS

| | | |
|---|---|---|
| 6,316,914 B1 | 11/2001 | Bertness ..................... 320/139 |
| 6,384,608 B1 | 5/2002 | Namaky ...................... 324/430 |
| 6,437,574 B1 | 8/2002 | Robinson et al. ............ 324/426 |
| 6,442,494 B1 | 8/2002 | Baalu et al. ................... 702/63 |
| 6,456,036 B1 * | 9/2002 | Thandiwe ................... 320/106 |
| 6,456,045 B1 | 9/2002 | Troy et al. .................. 320/139 |
| 6,677,759 B2 * | 1/2004 | Friel et al. .................. 324/430 |
| 6,768,309 B2 | 7/2004 | Liebermann et al. ........ 324/426 |
| 6,850,037 B2 * | 2/2005 | Bertness ..................... 320/132 |
| 6,864,665 B2 * | 3/2005 | Yoshida ...................... 320/132 |
| 6,885,307 B2 * | 4/2005 | Lockhart et al. ....... 340/636.15 |
| 2002/0171428 A1 | 11/2002 | Bertness ..................... 324/426 |
| 2004/0006440 A1 | 1/2004 | Kim et al. ...................... 702/63 |
| 2004/0027094 A1 * | 2/2004 | Sanders et al. .............. 320/150 |
| 2004/0108856 A1 | 6/2004 | Johnson ...................... 324/426 |
| 2005/0071093 A1 * | 3/2005 | Stefan ......................... 702/60 |

OTHER PUBLICATIONS

International Preliminary Report on Patentability which issued on Mar. 8, 2007 for PCT Application No. PCT/US2005/030600.

* cited by examiner

ALARM(MAJOR)                                                          <<back to map
Location:              Cabinet #:                    Type:
Traverse City, MI
Park Dr. & Airport Rd  1044                          Battery Vitality Failure
Device:                12SLA25 VRLA Stand-By Battery
Condition:             Battery Impedance Out of Range
Battery #:             3
String #:              1
Type:                  12SLA25
Manufacturer:          Fiamm
Date Stamp:            9/28/2002
    
map/          location      print work    notify         override
directions    history       order         technician
Map Detail
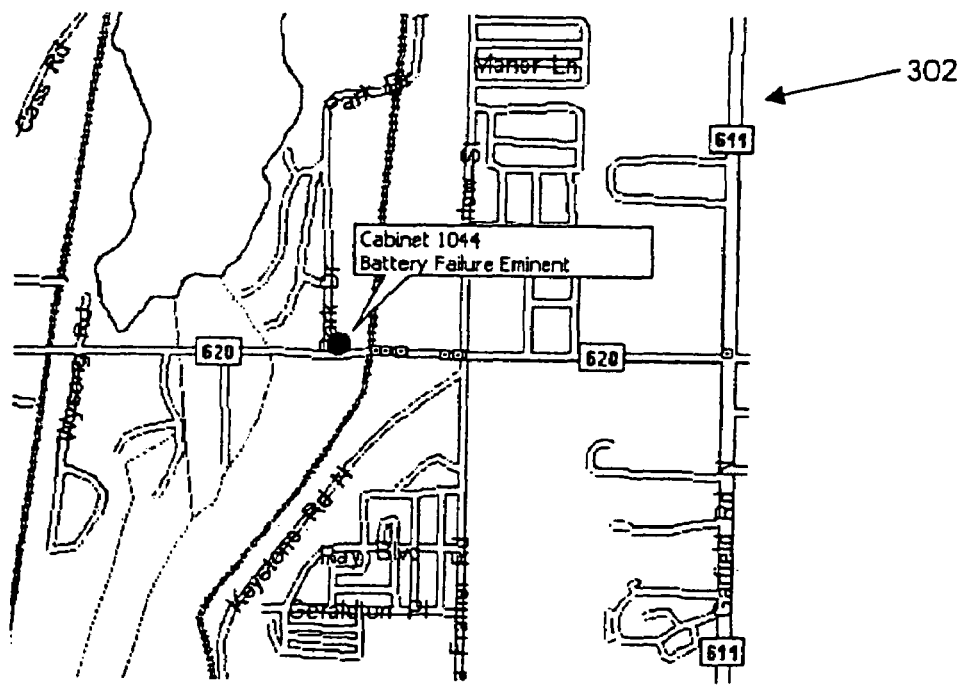
FIG. 18

ALARM(MAJOR)                                                              <<back to map
Location:                  Cabinet #:                    Type:
Mt. Pleasant, MI
Bard Rd. & Beaverton Rd.   3409                          Battery Overtemp
Device:                    12SLA25 VRLA Stand-By Battery
Condition:                 Battery Thermal Overload / Breakdown
Battery #:                 2
String #:                  2
Type:                      12SLA25
Manufacturer:              Fiamm
Date Stamp:                10/10/2002
map/          location      print work     notify        override
directions    history       order          technician
Map Detail
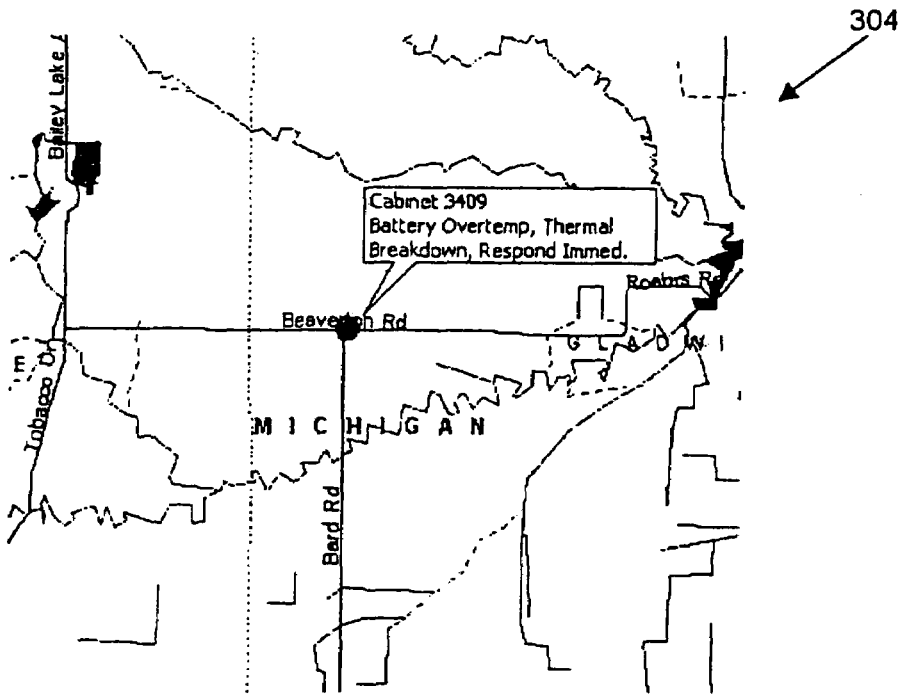
FIG. 19

ALARM(MAJOR)                                                                <<back to map
Location:                  Cabinet #:                    Type:
Grand Rapids, MI
Bard Rd. & Beaverton Rd.   2446                          String Voltage Low
Device:                    Telecom Battery String
Condition:                 Voltage Below Set Threshold
Battery #:                 n/a
String #:                  2
Type:                      12SLA25 String of (4)
Manufacturer:              Fiamm
Date Stamp:                10/04/2002
    
map/    location    print work    notify    override
directions    history    order    technician
Map Detail
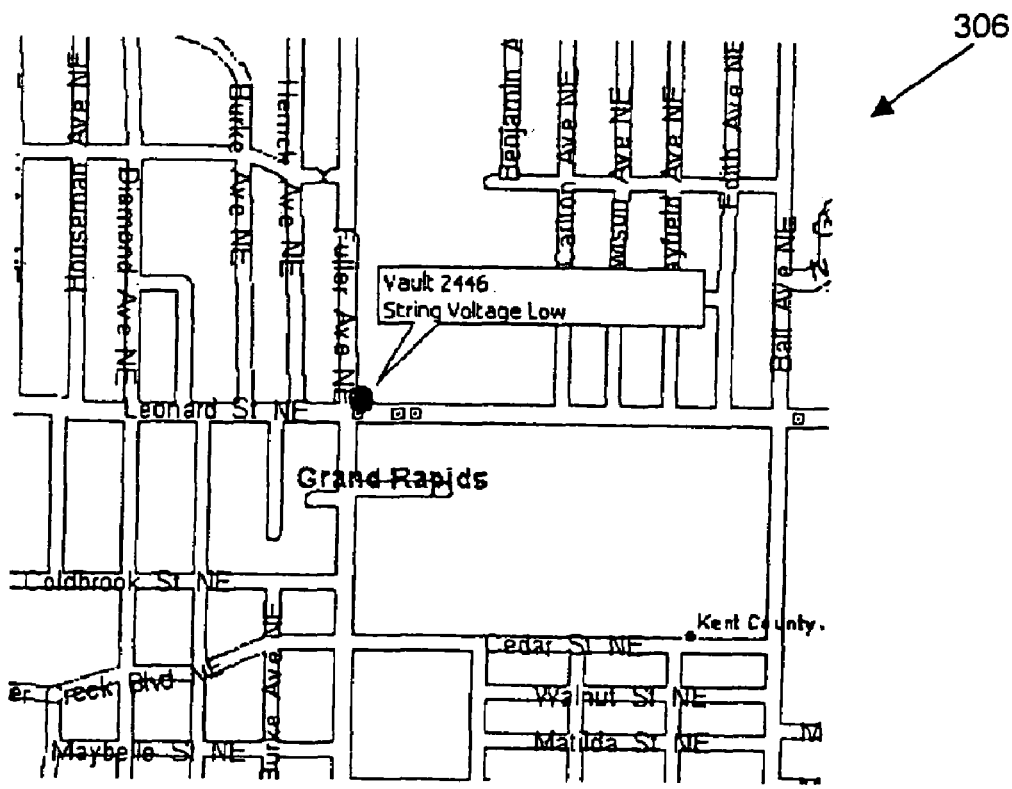
FIG. 20

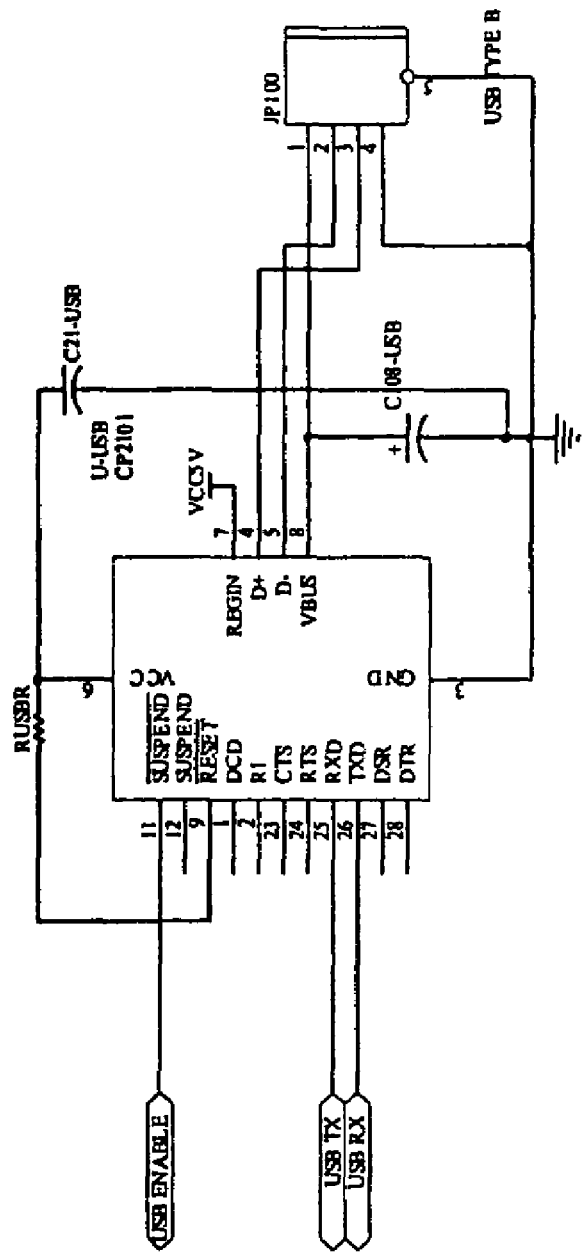

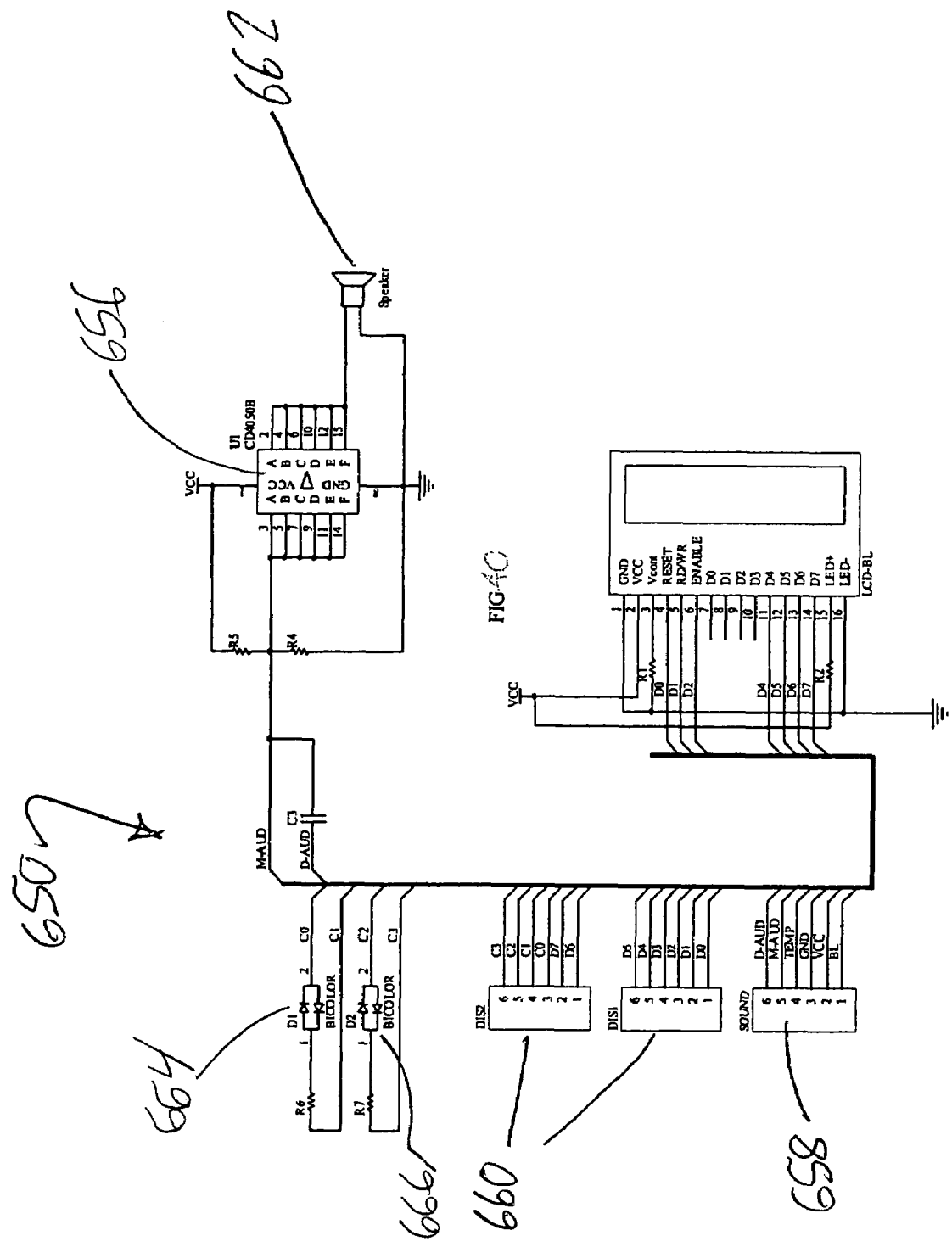

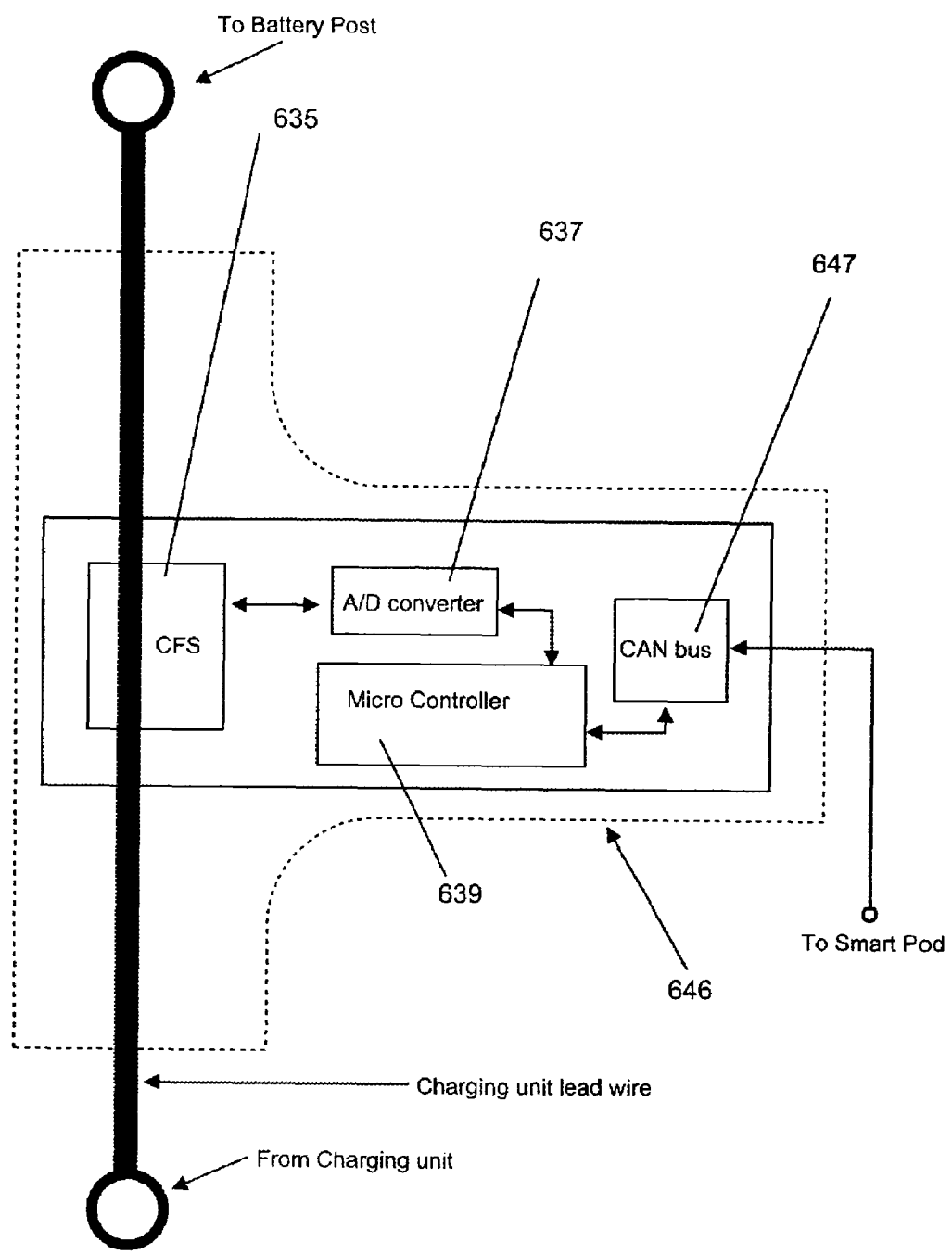
FIG. 42-A

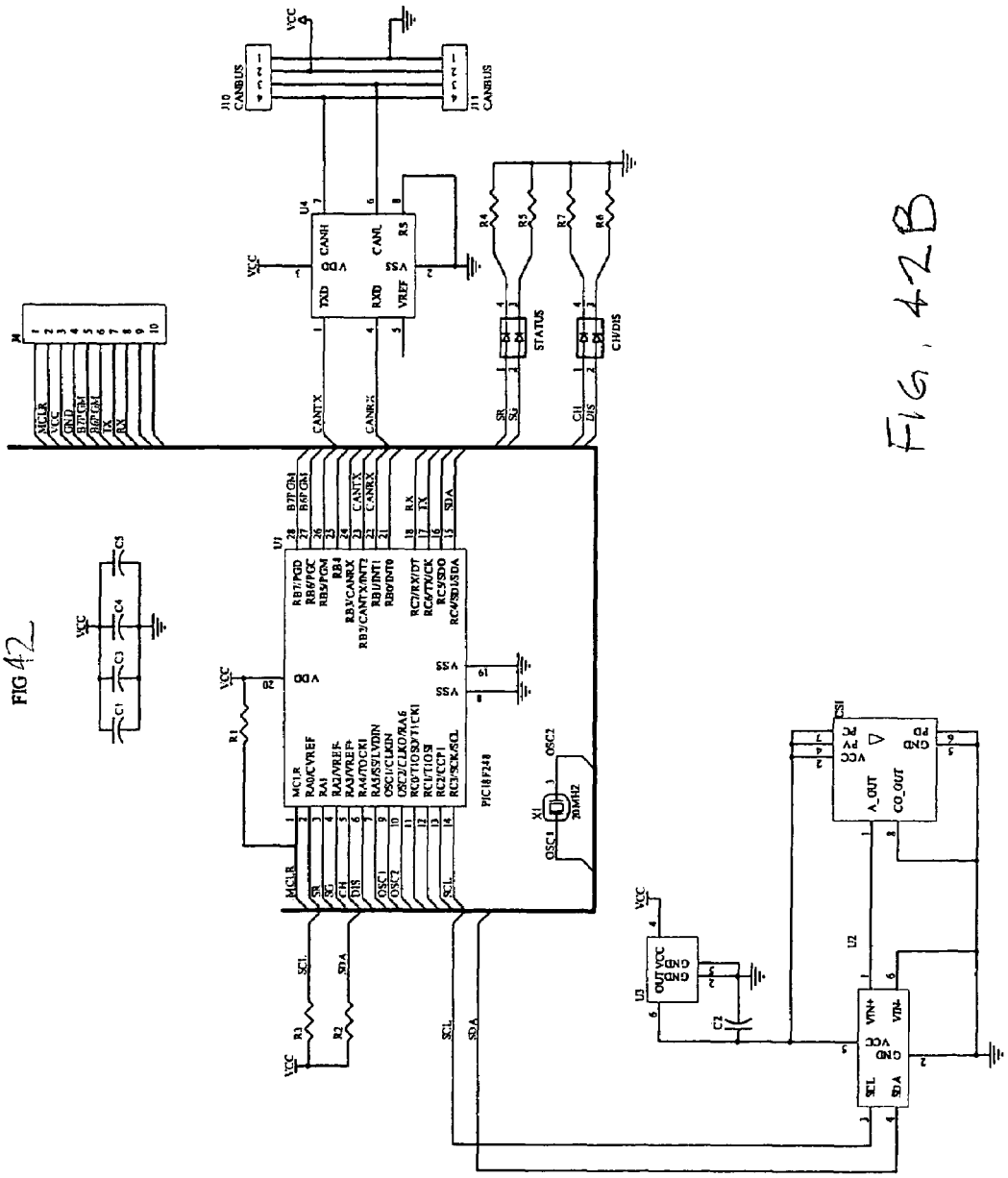

LOG FILE SENT VIA E-MAIL

| | |
|---|---|
| 01/23/05 1:25:00 | LINE 01 |
| DCM TEMP. 77f | LINE 02 |
| BLANK | LINE 03 |
| POD ID 09 | LINE 04 |
| STRING NUM. 2 | LINE 05 |
| POD NUM. 04 | LINE 06 |
| ? TIME OUT | LINE 07 |
| POD VOLTS DC 13.76 | LINE 08 |
| POD MILLI-OHM 6.32 | LINE 09 |
| POD TEMP 78F | LINE 10 |
| BASE LINE ERROR | LINE 11 |

FIG. 43

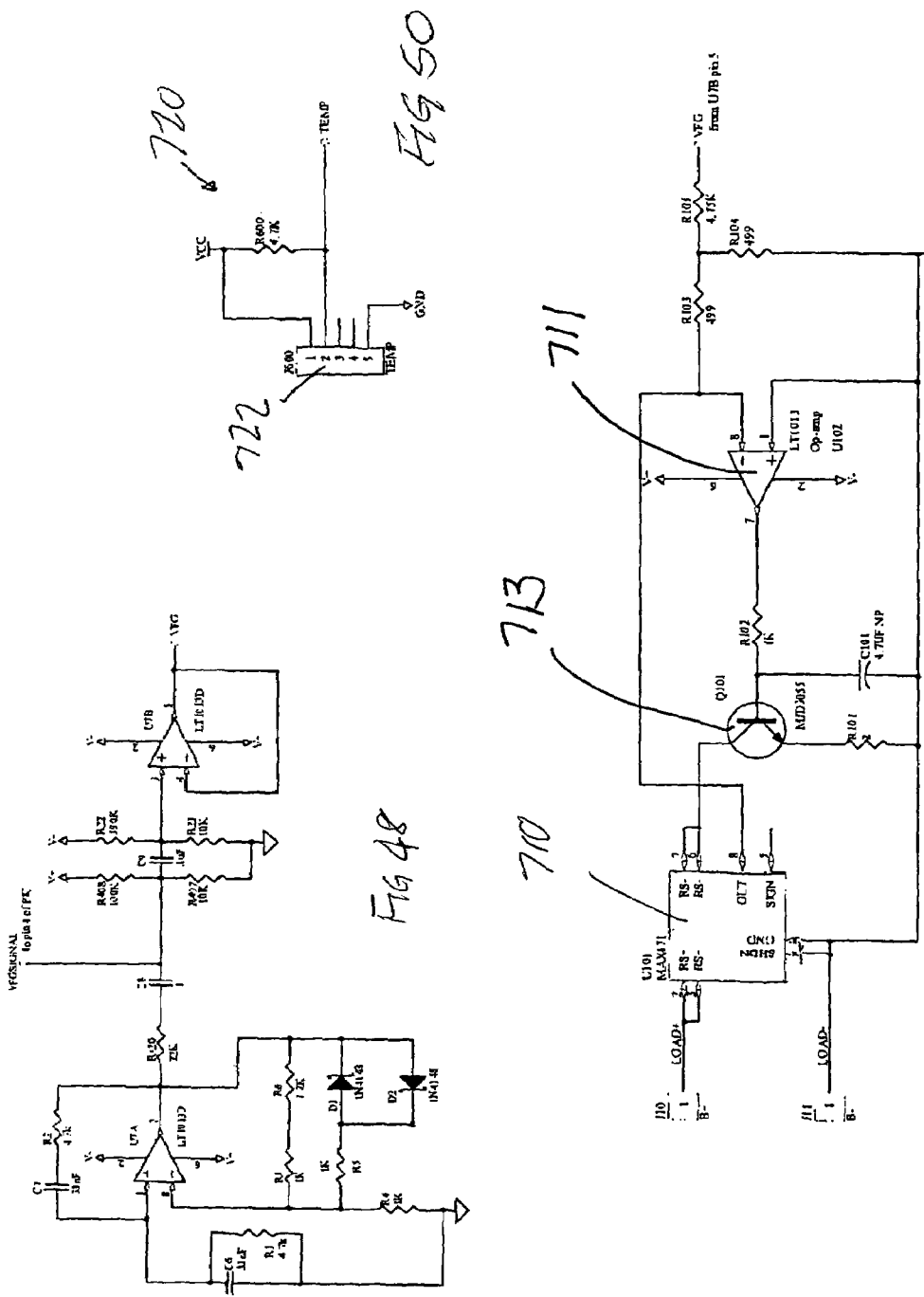

BATTERY MONITOR

CROSS REFERENCE TO CO-PENDING APPLICATIONS

This application is a continuation-in-part of application Ser. No. 10/924,036, filed Aug. 23, 2004, which is a continuation-in-part of application Ser. No. 10/465,755 filed Jun. 19, 2003 and entitled "Battery Monitor" now U.S. Pat. No. 6,885,307, issued Apr. 26, 2005, which claims the benefit of the filing date of co-pending provisional patent application Ser. No. 60/390,016, filed Jun. 19, 2002, the contents of each of which are incorporated herein in its entirety.

BACKGROUND

The present invention relates, in general, to battery monitors and, more particularly, to apparatus for monitoring the status of one battery or a battery string under load.

Telephone systems are required by regulatory agencies to provide telephone service in the event of an electrical utility power outage for a predetermined period of time, such as eight hours, for example. Thus, while the telephone system is normally powered by the electric utility power, a backup battery system must be employed to provide the necessary emergency power.

The typical telephone system includes a large number of distributed telephone or cabinets or huts usually at widely spaced locations in metropolitan and rural areas. It is common to have a plurality of DC batteries connected in various serial and parallel arrangements or in so-called "strings". Such battery strings are charged by a trickle charger for the electric utility power. However, the battery strings provide the necessary backup power during an electric utility power outage which switched on via a suitable power outage detection and switching circuit.

As such, while the batteries may sit idle under a state of trickle charge for a considerable amount of time, it is important that each battery be operative in the event of a random power outage.

Monitoring the status of each of a plurality of batteries in each widely spaced telephone cabinets or huts is a time consuming and expensive task. One problem is simply the widespread nature of the telephone cabinet. Particularly in rural areas, such cabinets can be spaced many miles apart thereby making frequent and easy battery condition tests difficult.

The battery strings contain a number of batteries to provide a typical forty-eight volt supply. Depending on the telephone network, two volt, four volt, six volt and twelve volt batteries may be connected in series or series/parallel arrangements to provide the necessary forty-eight voltage DC backup power supply. Such batteries must be tested on a periodic basis and while being charged so as not to render the backup power supply inoperative during the battery test.

It would be desirable to provide an improved battery monitoring apparatus and method which monitors the condition of each one or more batteries which may be under load.

SUMMARY

An apparatus and method for monitoring one or more batteries for battery operating conditions is disclosed.

In one aspect, the method of monitoring an operating condition of a battery comprises the steps of:
  injecting an ac signal across one pair of battery terminals;
  detecting an analog ac signal output from the battery, the ac signal output being proportional to the injected ac signal;
  determining the battery internal resistance based on the analog ac signal output and the injected ac signal; and
  comparing the battery internal resistance with a threshold resistance to determine an operative condition of the battery.

The method further comprises the step of wirelessly communicating the determined operative condition of the battery to a remote controller.

In another aspect, the method comprises the step of providing a visual indication of the determined operative condition of the battery.

In another aspect, an apparatus is provided for monitoring the operative condition of a battery, the apparatus includes:
  means for injecting an ac signal across a pair of battery terminals;
  means for detecting an analog ac signal output from the battery, the ac signal output being proportional to the injected ac signal;
  means for determining the battery internal resistance based on the analog ac signal output and the injected ac signal; and
  means for comparing the battery internal resistance with a threshold resistance to determine an operative condition of the battery.

In another aspect, the apparatus includes means, coupled to a control means, for wirelessly communicating the determined operative condition of the battery to a remote controller.

In another aspect, the apparatus includes means, activated by the control means, for providing a visual indication of the determined operative condition of the battery.

In another aspect, an apparatus for monitoring an operative condition of a battery including a control means, coupled to one battery, the control means including means for injecting an A/C signal across the battery terminals, means for detecting an analog A/C signal output from the battery proportional to the injected A/C signal, means for determining the battery internal resistance based on the analog A/C signal output and the injected A/C signal, and means for comparing the battery internal resistance with the threshold resistance to determine an operative condition of the battery; a data collection module network coupled to the control means therefore receiving one of data and alarm information from the control means.

The present battery monitoring apparatus provides an easily installed and reliable battery monitoring capability using battery monitoring means or pods mounted on each battery and a remotely located controller. All testing and battery condition determinations are made by the control means or pod mounted on each battery.

BRIEF DESCRIPTION OF THE DRAWING

The various features, advantages and other uses of the present invention will become more apparent by referring to the following detailed description and drawing in which:

FIGS. 18, 19 and 20 are detailed screen displays of each alarm alert depicted in FIG. 17;

FIG. 38 is schematic diagram of the controller area network bus used in the battery monitoring apparatus shown in FIG. 34;

FIG. 39 is a schematic diagram of the universal serial bus circuit shown in FIG. 34;

FIG. 40 is a schematic diagram of the display shown in FIG. 34;

FIG. 42A is a block diagram of the CFM;

FIG. 42B is a schematic diagram of the CFM shown in FIG. 42A;

FIG. 43 is an example of an email log report issued by the battery monitoring apparatus as shown in FIG. 34;

FIG. 48 is a schematic diagram of the battery test waveform generator circuit;

FIG. 49 is a schematic diagram of the test signal input circuit used in the batter monitoring apparatus shown in FIG. 34;

FIG. 50 is schematic diagram of the temperature sensor circuit;

DETAILED DESCRIPTION

Figure 1:
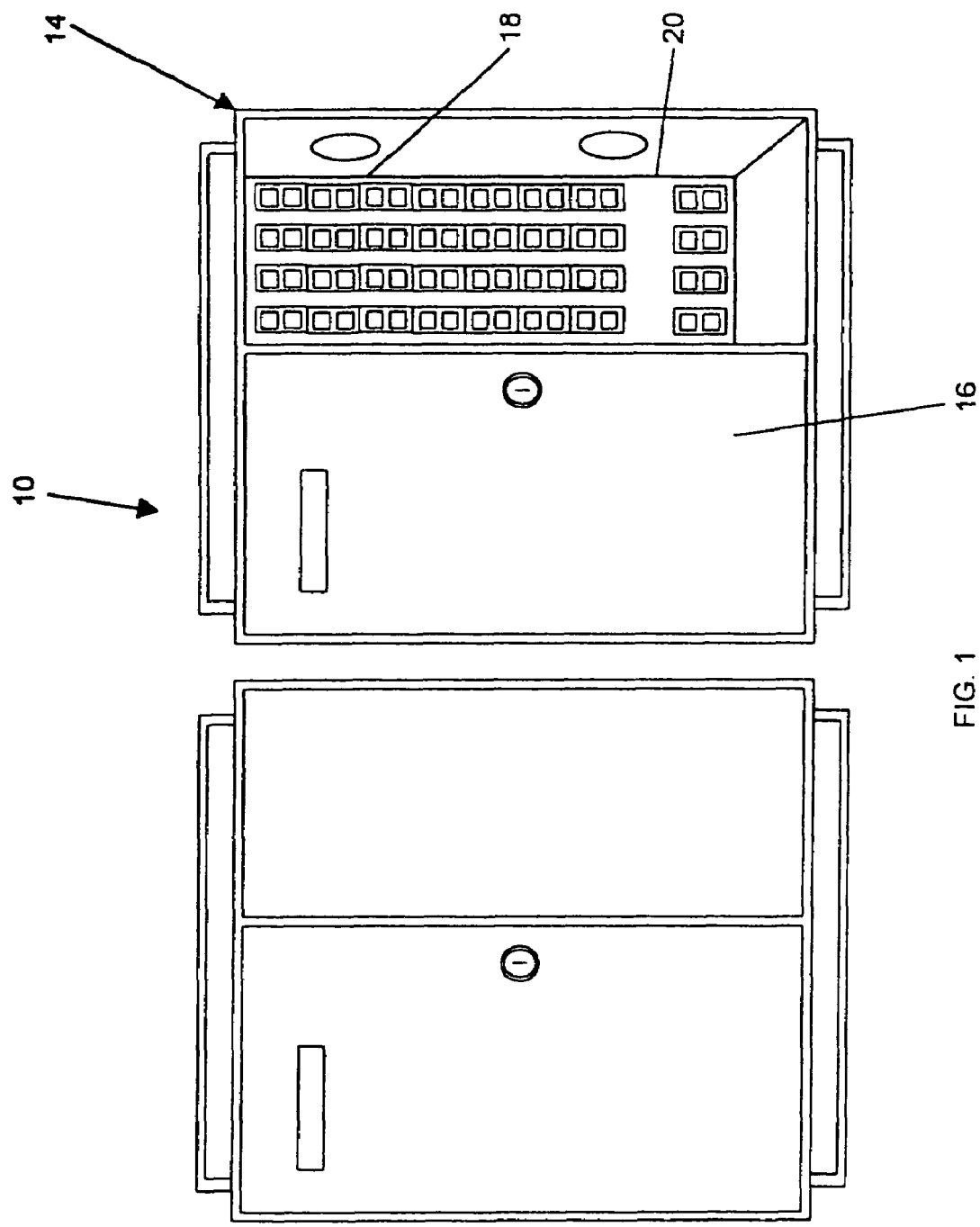
FIG. 1 is a front elevational view of a battery monitoring apparatus according to the present invention.
Figure 2:
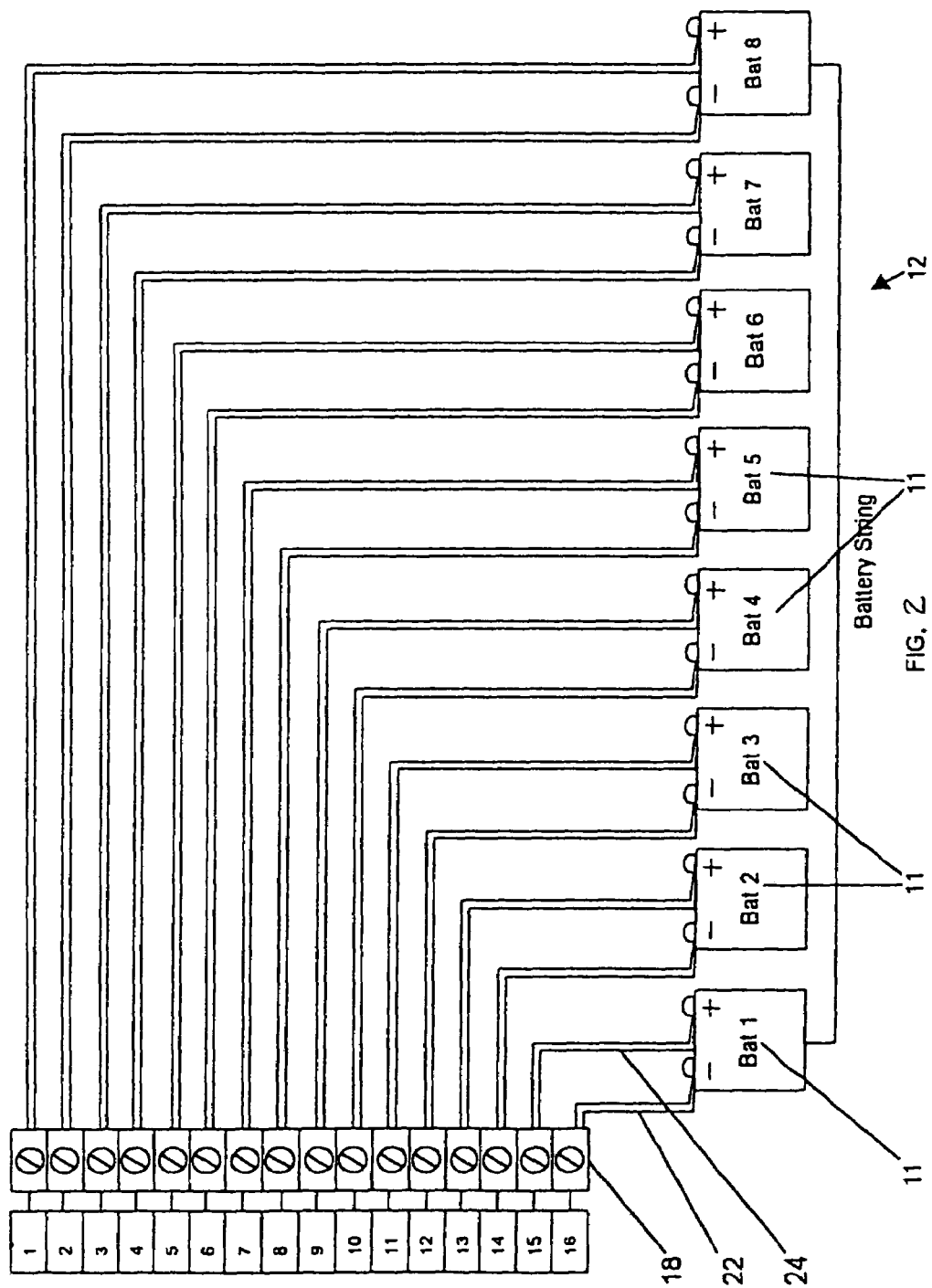
FIG. 2 is a circuit diagram of the battery string connections for the apparatus shown in FIG. 1.

Although the following description of a battery monitor and apparatus 10 is described as monitoring the condition of a plurality of batteries arranged in a serial or serial/parallel connected string, it will be understood that the battery monitoring apparatus 10 and accompanying method of operation as described herein is equally applicable to other battery monitoring applications, including the monitoring of a single battery which may or may not be under load, in various applications, such as automobiles, etc.

Referring now to FIGS. 1-6 of the drawing, there is depicted one aspect of a battery monitoring apparatus 10 which automatically monitors the operative status of each battery of a plurality of batteries arranged in a serial and/or serial/parallel connected string and detects when one of more batteries are below operative performance or condition.

As shown in FIG. 1, the apparatus 10 is includes a housing 14 which is mountable within a conventional telephone cabinet or hut, not shown. By way of example only, the housing 14 is provided with two lockable doors, with only one door 16 being shown. The lockable doors 16 may be provided with different keyed locks thereby providing distinct access to the interior of each section of the housing 14, if necessary.

As shown in FIG. 1, a plurality of terminals 18 and 20 are mounted in one section of the housing 14. The operative circuits, described hereafter, are mounted in the other closable section of the housing 14.

The terminals 18 provide power connections to the apparatus 10 from the electric utility power terminals normally found in the overall telephone hut. The terminals 18 also provide connections to each battery 11 in a battery string 12 shown in FIG. 2. Two connections 22 and 24 extend from two terminals 18 to the positive and negative terminal on each battery 11. This provides independent selection of each battery 11 for a battery monitoring test as described hereafter. The connections 22 and 24 are in addition to the normal battery cables which interconnect the various batteries 11 together in the string 12 as well as to an external power input trickle charger and power output connections, not shown, to the other operative elements in the telephone cabinet.

The terminals 20 which are arranged in one strip, by example only, below the terminals 18 and provide connection to environmental sensors located in the overall telephone cabinet, such as an interior cabinet temperature sensor, a water level sensor, a smoke detector sensor and an intrusion sensor. These sensor outputs are provided as inputs to the battery monitoring apparatus 10 as described hereafter.

A communication port, preferably an RS232 serial interface, is provided to enable the central processing unit 30 to be connected to a portable or laptop computer carried by the service person for programming of the CPU 30, responding to a battery failure signal from the CPU 30, etc.

A dialer modem 32 provides external signals via a telephone connection to a remote server to interconnect the CPU 30 with a global communication network, such as the Internet. This communication link allows the CPU 30 to report an inoperative battery 11 to a remote data collection site, such as the telephone company office.

A keypad 52 mounted on the exterior of the telephone cabinet or hut 14 allows a pass code to be entered to the CPU 30. The proper pass code allows a service technician to gain access to the interior of the telephone cabinet. After receiving a pass code, the CPU 30 checks for authorization and disables the intrusion alarm for the amount of time set by the end user. The CPU 30, upon receiving the proper authorization and pass code, also allows access to the CPU 30. The CPU 30 also sends data to the modem 32 for input in a remote database which contains the time, date of entry and pass code used to gain access to the telephone cabinet. Upon leaving the hut or cabinet, the service technician will reset the CPU 30 by entering the pass code followed by the star key.

Figure 3:
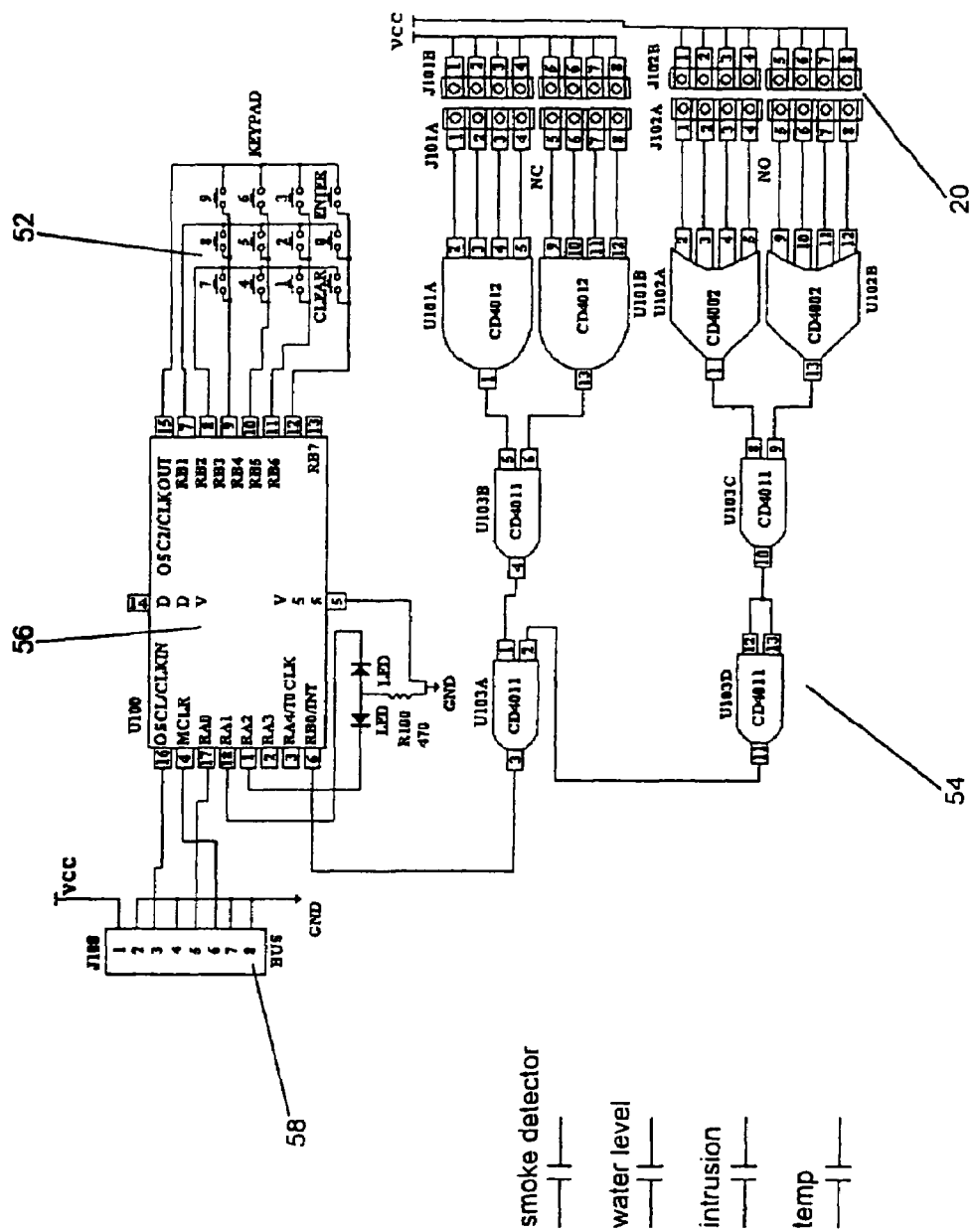
FIG. 3 is a circuit diagram of the alarm circuit shown in FIG. 2.

The environmental sensor signals, which are typically electrical contact signals from the temperature, water level, intrusion and smoke detectors or sensors are connected across the terminals 20 shown in FIGS. 1 and 3. The terminals 20 are connected through a gate logic array 54 and combined to form an interrupt signal in a 16F84 circuit 56. The circuit 56 also receives the outputs from the keypad 52. The output of the circuit 56 is input by a connector 58 to the CPU 30 as shown in FIG. 3. In this manner, the existence of any alarm signal will generate an interrupt to the CPU 30 which will identify the particular alarm signal and transmit a signal through the modem 32 to the remote data collection site.

Figure 8:
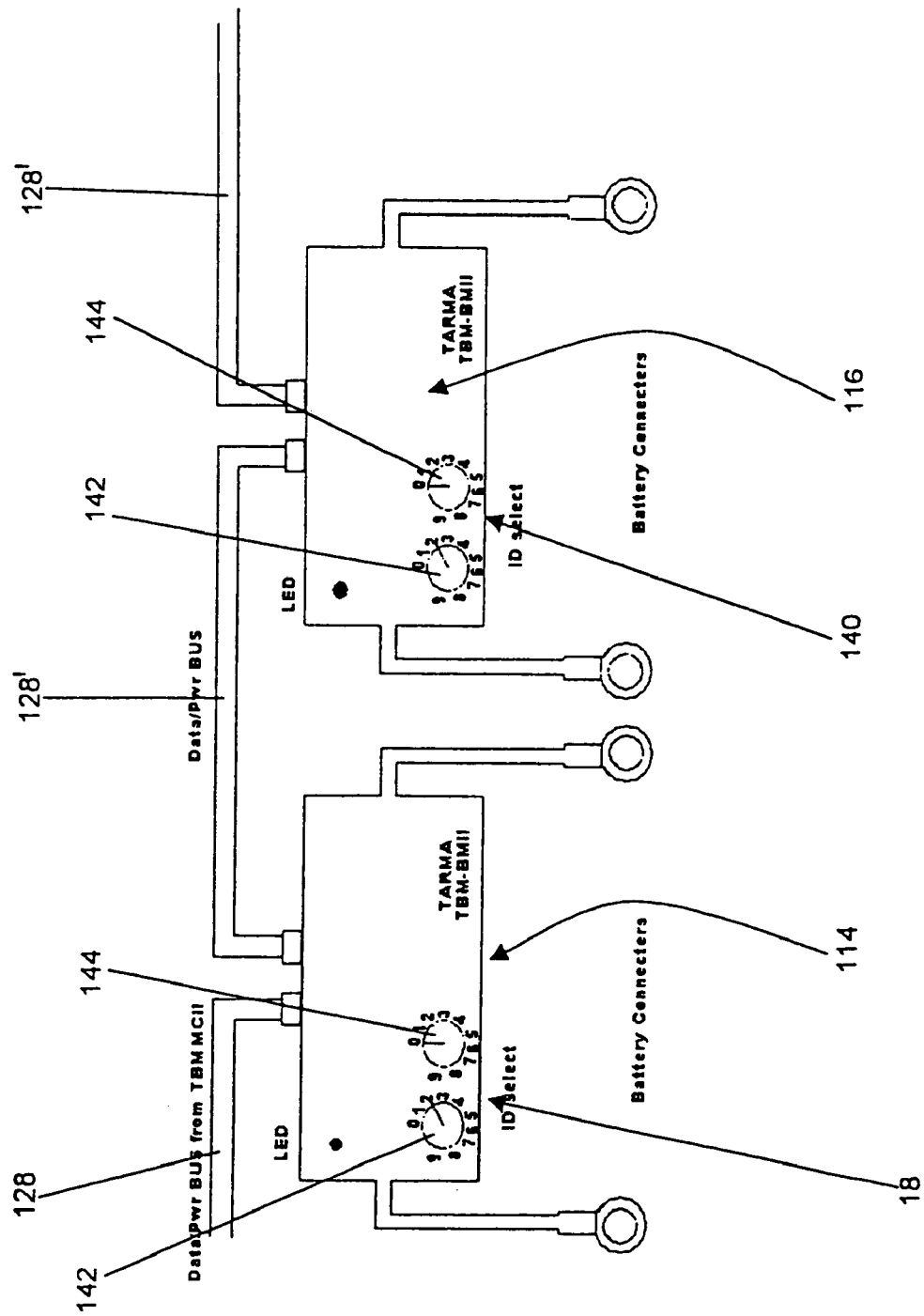
FIG. 8 is a pictorial representation of the battery controller and connections according to another aspect of the present invention.

A test signal generator is preferably in the form of a DC ramp generator 80 shown in FIG. 8. Two transistors 82 and 84 form a current mirror. Transistor 86 receives a pulse on line 88 from the CPU 30 to generate a reference pulse. This pulse is then fed into capacitors 90 and 92 and sent to the battery 11 under test.

The pulse is also sent to transistor 82. The transistor 84 receives the pulse from transistor 82, amplifies it and then sends it to the CPU 30. Transistor 94 is used as a ground reference through resistor 96. Transistor 94 is pulled high by the signal from the CPU 30 to calibrate the DC ramp generator 80 to zero Ohms. The reset to zero function of transistor 94 can be accomplished by firmware in the CPU 30 rather than by the transistor 94.

In this manner, the CPU 30 receives two signals: one, the pulse which is the reference ramp signal with respect to ground, and the other being the ramp output signal after passing through the battery 11 under test. This is shown more clearly in FIG. 7 where the DC ramp signal input from the capacitors 90 and 92 and identified by reference number 100 is input through the positive terminal or post of the battery 11 under test. This pulse is transmitted through the cells of the battery to the negative post wherein it is output on lead 102 to the CPU 30.

The CPU 30 then compares the ramp amplitude and, possibly, the ram signal length with the reference ramp amplitude and length to get the internal electrical series resistance of the battery 11 under test. The controller 30 can also sample battery voltage from the reference ramp signal level.

The electric serial resistance of the battery 11 can be used as a predictor of battery failure. The peak or maximum voltage of the reference ramp signal and the output ramp signal is compared by the CPU 30 to each other. A lookup table stored in memory is accessed by the CPU 30 to convert the ramp peak voltage to a resistance measurement, typically in milliohms. A threshold difference is preset or programmed into the CPU 30. The threshold difference is selected by a particular telephone company and can vary from 10% high to 20% low with respect to the reference peak voltage. The present battery monitoring apparatus and method, by using the DC ramp voltage as an input signal to create a reference signal and an output signal from the battery 11 under test, eliminates fluctuations in voltage measurements due to ambient temperature. As both the reference and output ramp signals will be equally affected, the battery monitoring test is immune to temperature effects. The threshold differences, either one or both of the high or low readings, can be varied.

The present apparatus 10 can be programmed to conduct a battery monitoring test on each battery 11 in a string 12 on a fairly quick periodic basis, such as once every hour of each twenty-four hour day. In this manner, an incipient battery failure can be promptly detected.

To eliminate false readings, the CPU 30 can set a flag when the threshold, such as either of the high or low thresholds are exceeded during one battery test. The CPU 30 can repeat the test at the preset periodic interval with a maximum number of flags equating to a battery failure which is reported by the CPU 30 to the remote data collection site. For example, three consecutive tests in which a battery ramp peak voltage is detected outside of one of the battery thresholds can be utilized by a telephone company as an indication of battery failure thereby prompting corrective action.

Referring now to FIGS. 6-9, there is depicted another aspect 110 of the present invention. In this aspect, the functions of the CPU 30 are replaced by a distributed network formed of a main controller 112 and a plurality of battery monitors or controllers 114, 116, 118, 120, etc., each of which is connected to a single battery 11, etc.

Figure 7:
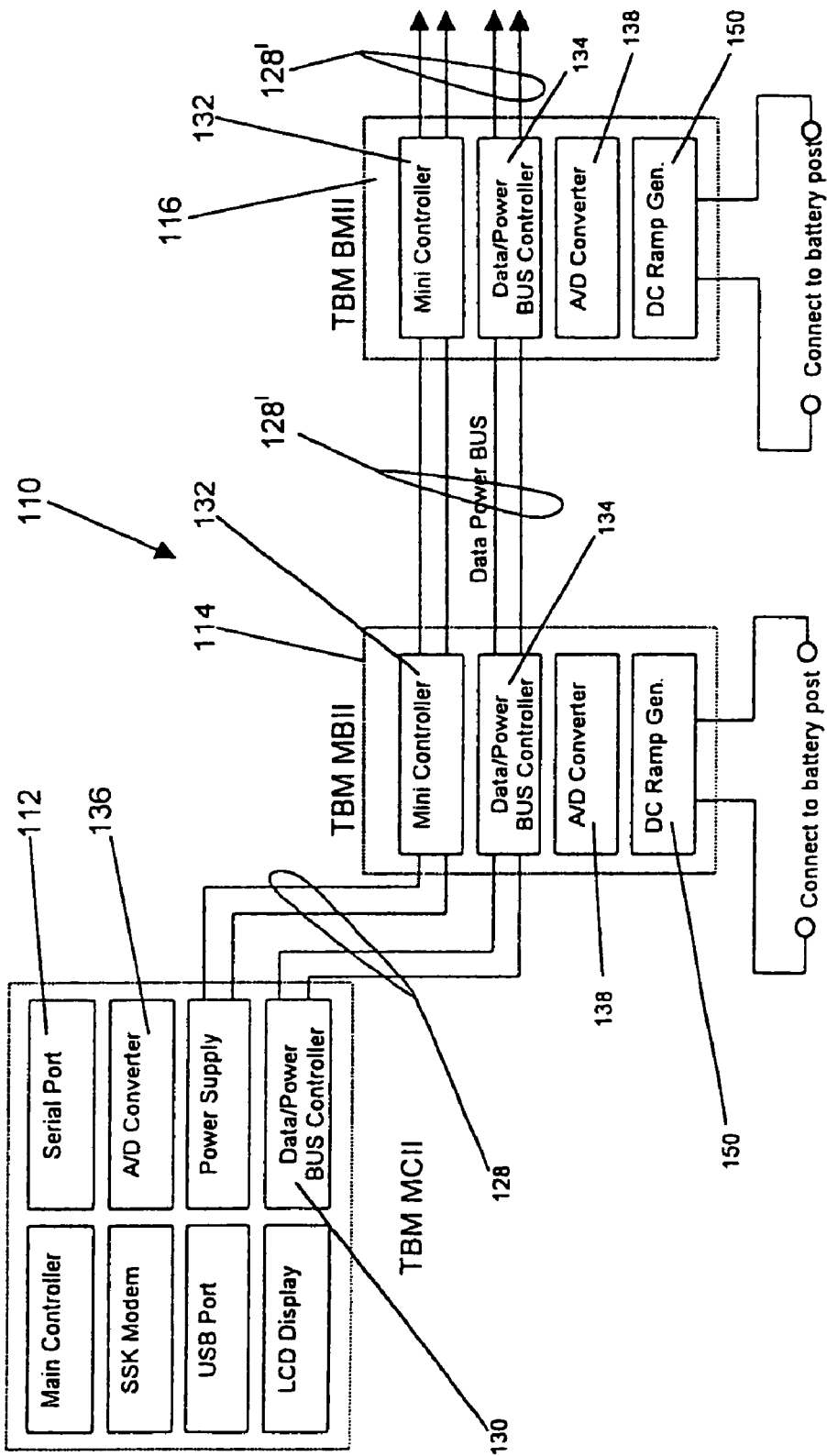
FIG. 7 is a detailed block diagram of the aspect of the invention shown in FIG. 6.

The main controller 112, shown in FIG. 7, includes essentially the same elements as the controller 30 described above. Thus, only the different or new features will be described for this aspect of the present invention.

A four wire cable 120 connects the main controller 112 to the first battery monitor 114.

Two of the wires in the cable, VCC+5 and ground extend between the power supply in a data/power bus controller 130 in the main controller 112 to the first battery monitor 114. As shown in FIG. 7, the power connections from the power supply in the main controller 112 are connected to a mini controller 132 in the battery monitor 114. The two cables of the data cable 128 extending from the data/power bus controller 130 to a similar data/power bus controller 134 in the first battery monitor 114 are transmit and receive lines, respectively.

A/D converters 136 and 138 are respectively provided in the main controller 112 and in each battery monitor 114, 116, etc., for any analog/digital conversion that may be required, such as the use of the keypad in the main controller 112 to set the resistance threshold values in the respective battery monitors 114, 116, etc.

A second data power bus 128' containing +5V and ground power lines and receive and transmit lines extends from the mini controller 132 and the data/power bus controller 134 in the first battery monitor 114 to a similar mini controller 132 and data/power bus controller 134 in the next serially connected battery monitor 116. A similar third data cable 128' connects similar circuits in the second battery monitor 116 to the third battery monitor 118 and so on through the plurality of battery monitors connected to a single controller 112. This arrangement connects the battery monitors 114, 116, etc., in a "daisy chain" arrangement.

As shown in FIG. 8, address or position select means 140 are provided on each battery monitor 114, 116, etc. The address or position select means 140 is, by way of example only, in the form of a pair of dial switches containing selectable positions, each providing an output representing addresses from zero to nine. Adjusting the two dials 142 and 144 in the input address select means 140 to zero one, respectively, sets the ID or address of the first battery monitor 114 to zero one. Turning the dials 142 and 144 of the address select means 140 in the second battery monitor to zero and two, respectively, will make the ID address of the second battery monitor 116 zero two.

Each battery monitor 114, 116, etc., includes a DC ramp generator 150 substantially the same as the DC ramp generator 80 described above and shown in the first aspect of the present invention.

Figure 9:
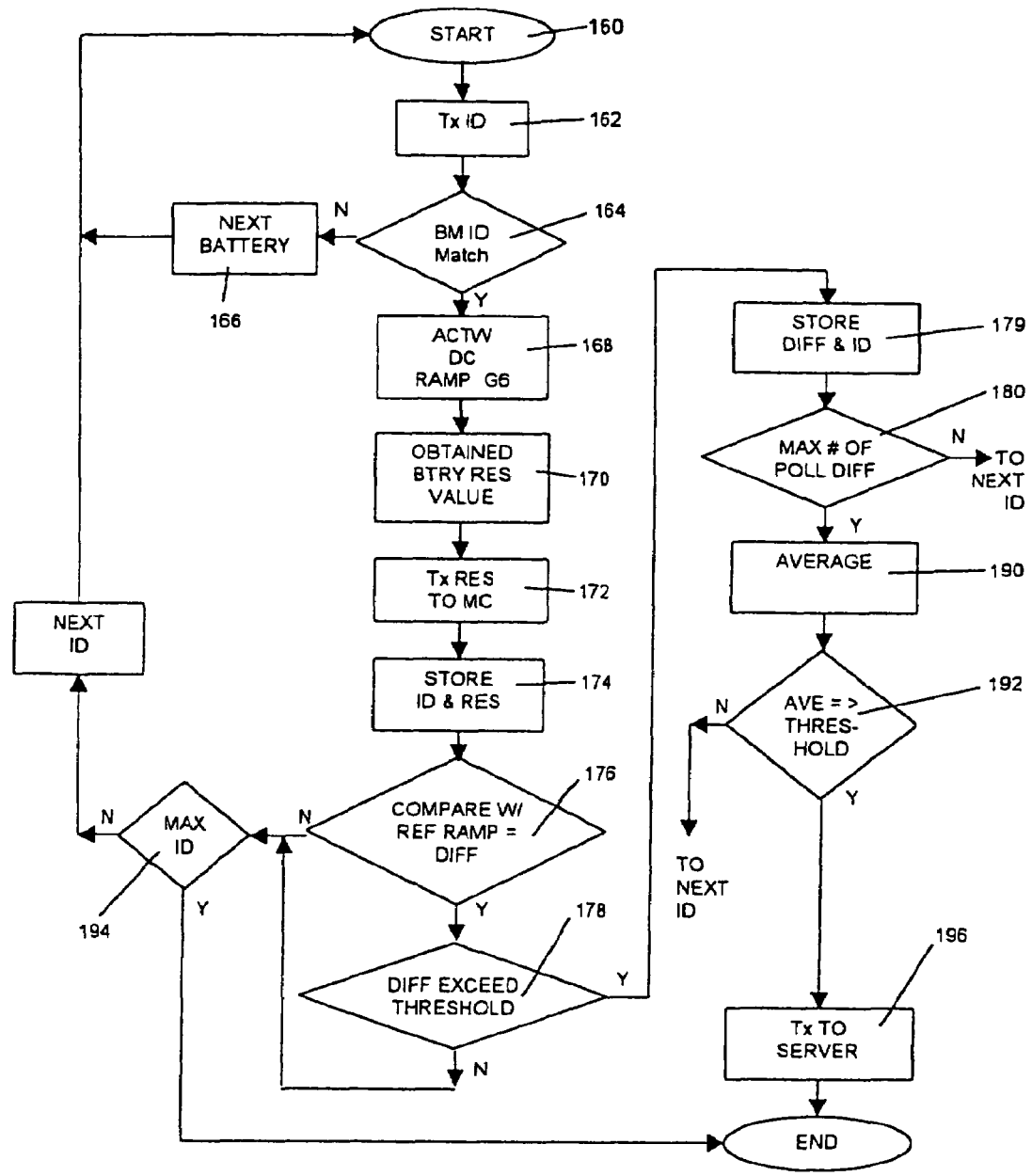
FIG. 9 is a flow diagram depicting the sequence of operation of another aspect of the present invention.

In operation, as shown in FIG. 9, step 160 starts the battery polling process. The main controller 112 will generate a battery monitor address and transmit the address or ID in step 162 to the first battery monitor 114. The battery monitor 114 will decode the address and determine whether or not the transmitted address matches its address or ID. If the transmitted ID comparison in step 164 does not yield a match, the ID from the main controller 112 is transmitted from the first battery monitor 114 in step 166 to the next battery monitor 116 and the process continued through the succeeding battery monitors 118, 120, etc., in the daisy chain until an ID match is made.

When the ID match is determined, the mini controller 132, in the first battery monitor, assumed to have an ID match, will activate the DC ramp generator 150 in step 168. The mini controller 132 reads the DC ramp output voltage in step 170 and then transmits the output battery serial resistance in step 172 over the data cable 128 to the main controller 112 by the receive or Rx line in the data cable 128.

In step 174, the main controller 112 stores the measured battery resistance and compares it to a threshold or threshold range set by the end user as depicted in step 176 and as described above.

A measured battery resistance out of the threshold range is a possible failure. The main controller 112 tags this event as a failure in step 178.

As described above in the first aspect of the present invention, the main controller 112 maintains the error reading during the next battery polling cycle in step 179. If the second reading for the same battery 11 is also out of the threshold range, the second reading is also tagged as a failure. If the third reading from the same battery monitor 114, etc., is out of the threshold range, step 180, the main controller 112 in step 190 takes all three battery resistance readings, forms an average in step 190, and then compares the average with the threshold range in step 192. If the threshold range is not exceeded, the main controller 112 checks to see if the maximum number of battery monitors have been checked in step 194 and, if not, returns to the beginning of the polling sequence and generates the next battery monitor ID in step 164.

However, if the average battery monitor readings for a particular battery 11 have been exceeded in step 192, the main controller 112 generates a battery failure signal and transmits the battery failure signal, along with a battery ID and the location of the battery enclosure 10 in step 196 to the server for transmission to the central office or facility for action.

Alternately, the main controller 112 can poll each battery 11 in one string or many strings, (four batteries in one string or eight batteries in two strings of four, for example) to obtain test results of each battery 11 in the same manner as described above. The main controller 112 can calculate a running average of all the battery tests in the string(s) as each battery test is completed and then compare the average with the individual data from one battery 11. Individual battery readings that are significantly different from the average could indicate a potentially bad battery.

The average battery reading for each battery in a string or strings at a particular location, or all of the batteries in many different locations can be averaged together to provide a baseline average which could be used for comparison with individual battery test results. The baseline average would be a dynamic average which can change as battery test results are continually added to the average poll. This baseline could also have a programmable threshold rather than a preset, hardware implemented threshold.

Refer now to FIGS. 10-16, there is depicted yet another aspect of a battery monitor apparatus 200 according to the present invention. The apparatus 200 shown generally in FIG. 13 functions in the same manner as the previously described battery monitor apparatus in that it is capable of monitoring of at least one and, preferably, a plurality of series connected batteries or battery strings in one or more locations and transmitting the battery condition signals, as well as other environmental alarm signals, to a remote server or processing unit for comparison, responsive action and data storage.

Figure 10:
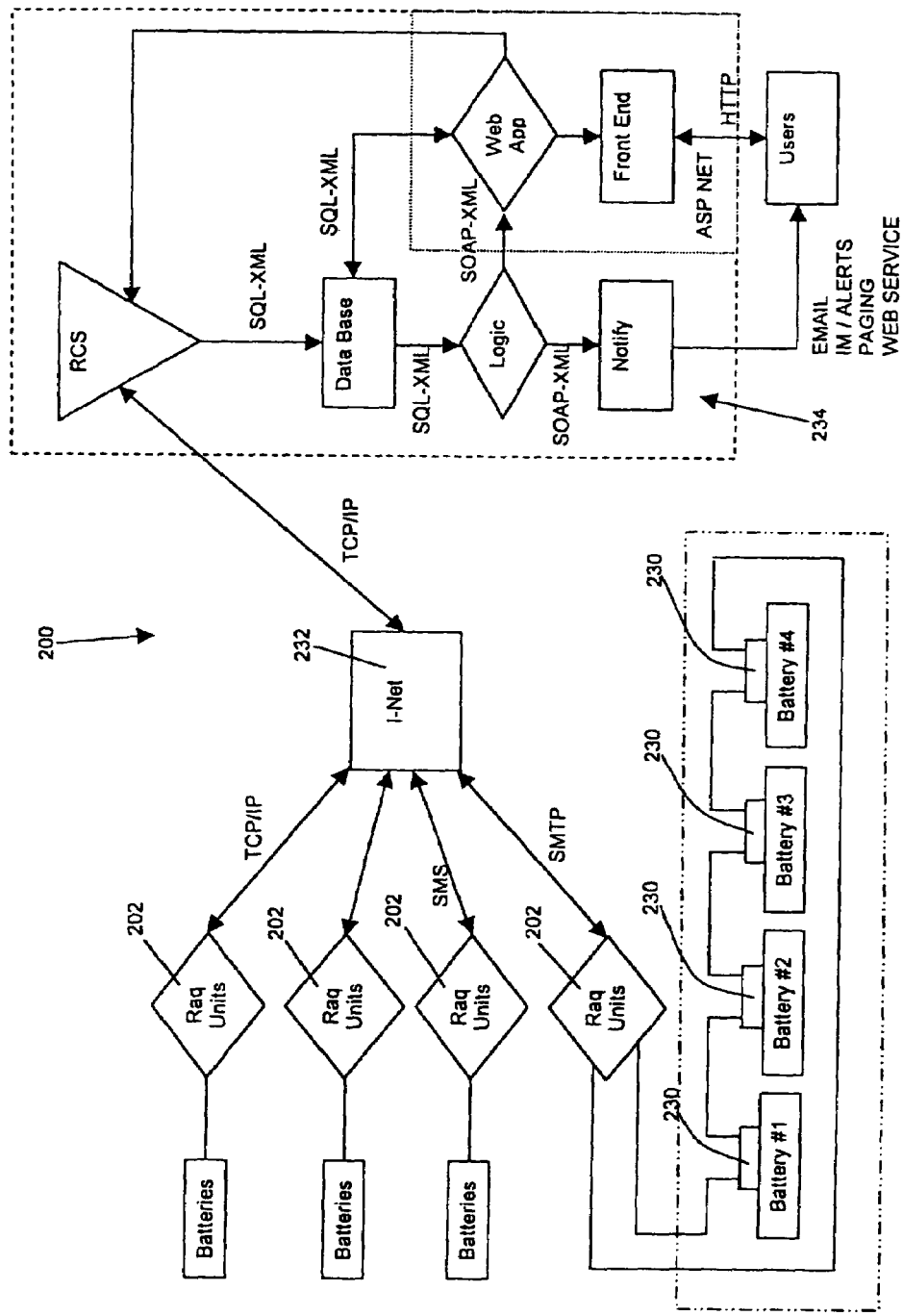
FIG. 10 is a pictorial representation of another implementation of the battery monitor apparatus of the present invention.
Figure 11:
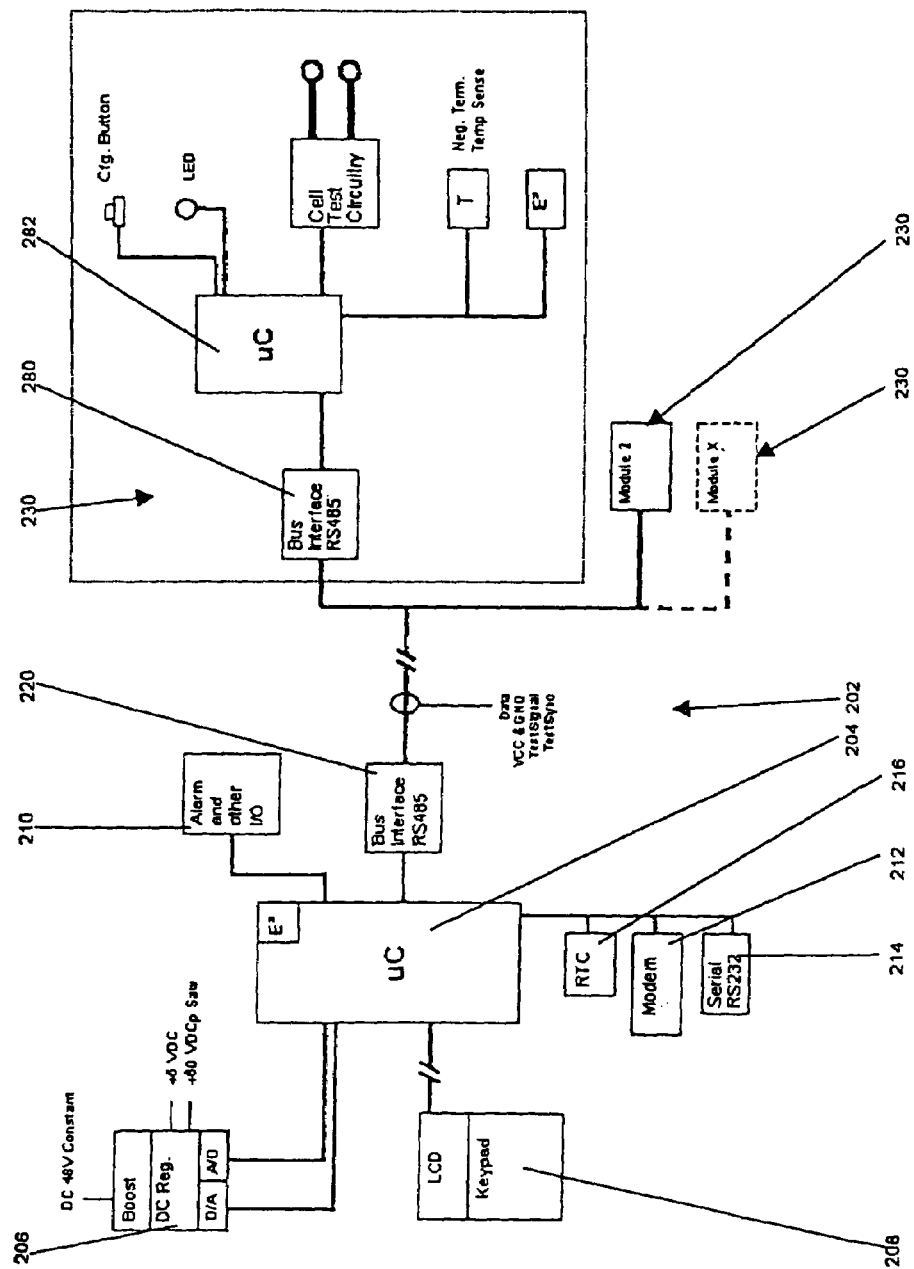
FIG. 11 is a block diagram of the major components of the host controller and the monitor module of the apparatus shown in FIG. 10.

As shown in FIGS. 10 and 11, the apparatus 200 includes a host controller 202 which includes a central processor 204 executing the control program stored in a memory. The processor 204 of the controller 202 receives power from a power supply 206 and inputs from a user input device, such as a keypad or portable computer 208, as well as inputs from environmental detectors, such as cabinet temperature, cabinet door open switch, etc., via sensors, all denoted by reference number 210. The processor 204 has output connections to a computer modem 212, a serial RS232 databus connector 214 and a real time clock (RTC) 216. The processor 204 is also connected through an RS485 bus interface 220 to at least one or more battery module controllers each denoted by reference number 230.

Primarily through the modem 212, the processor 204 is capable of connection through hardline, cable and/or wireless communication through the Internet 232 to a remote processor, such as a server 234, for reporting battery conditions, cabinet monitoring alarms, as well as to archive data on battery conditions at a particular battery location.

The actual circuits and connections for the host controller 202 are shown in FIGS. 12A, 12B, 13, 14 and 15.

Figure 12A:
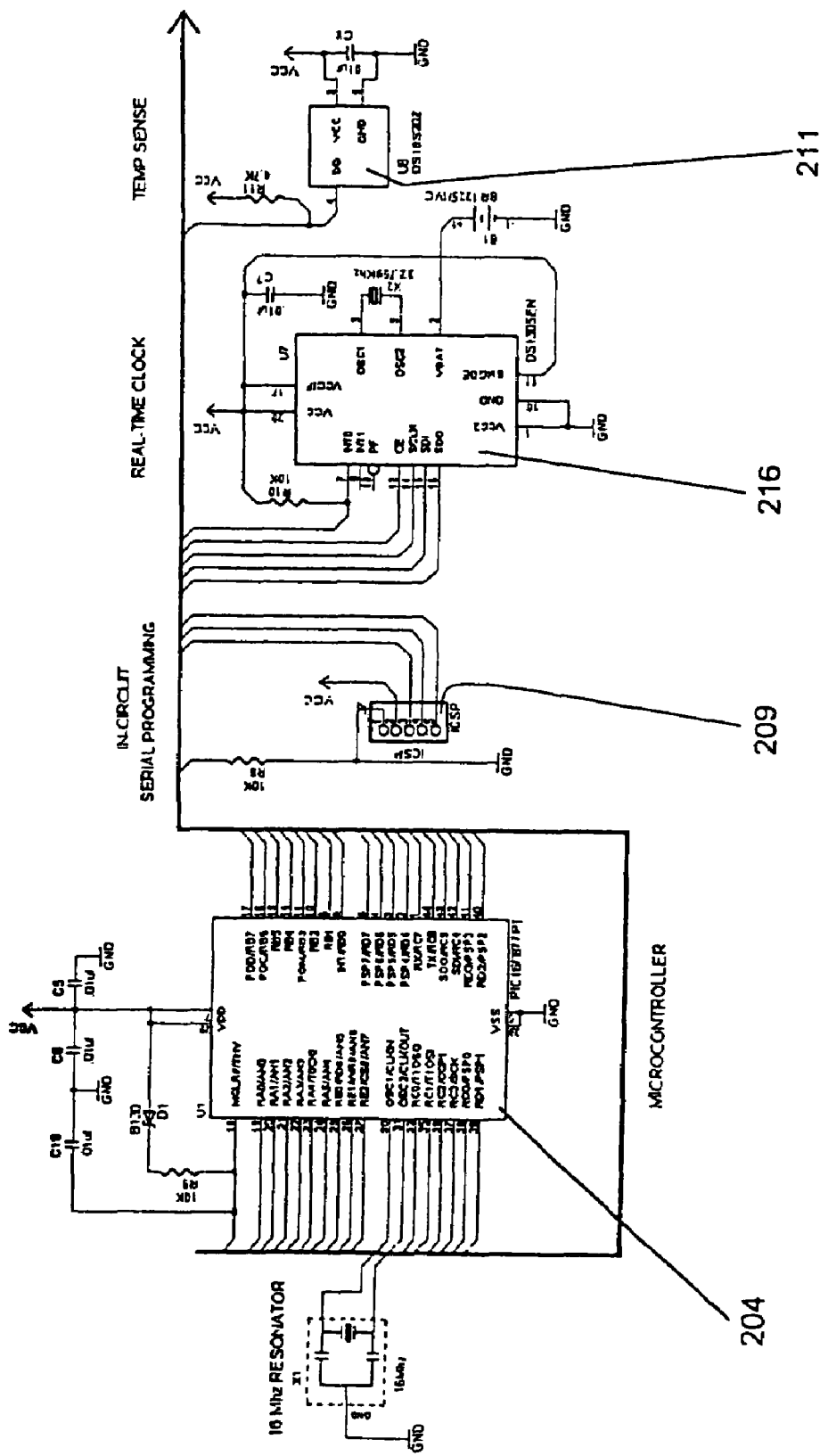
FIGS. 12A-15 are schematic diagrams of the host controller shown in FIG. 14.
Figure 12B:
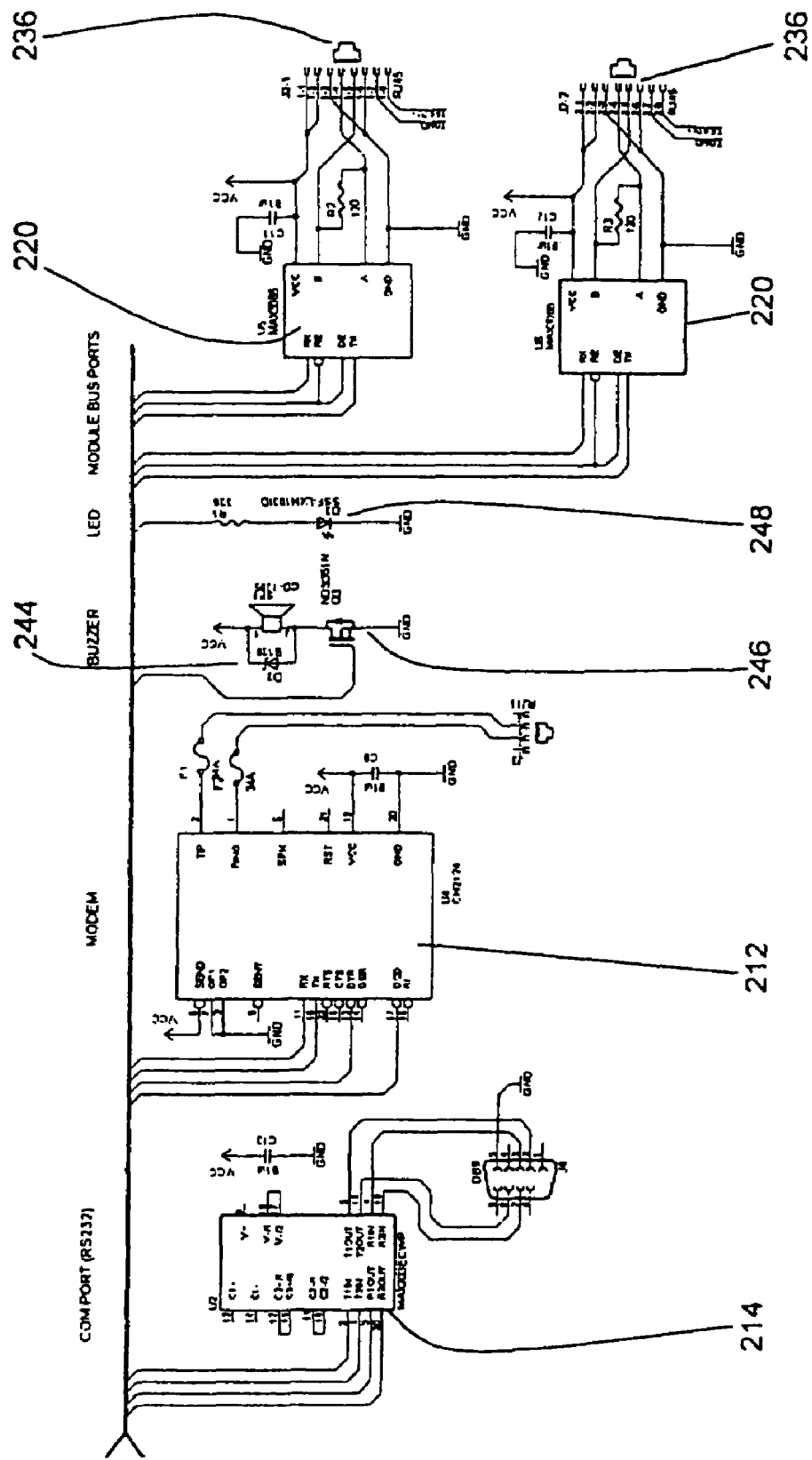
Figure 13:
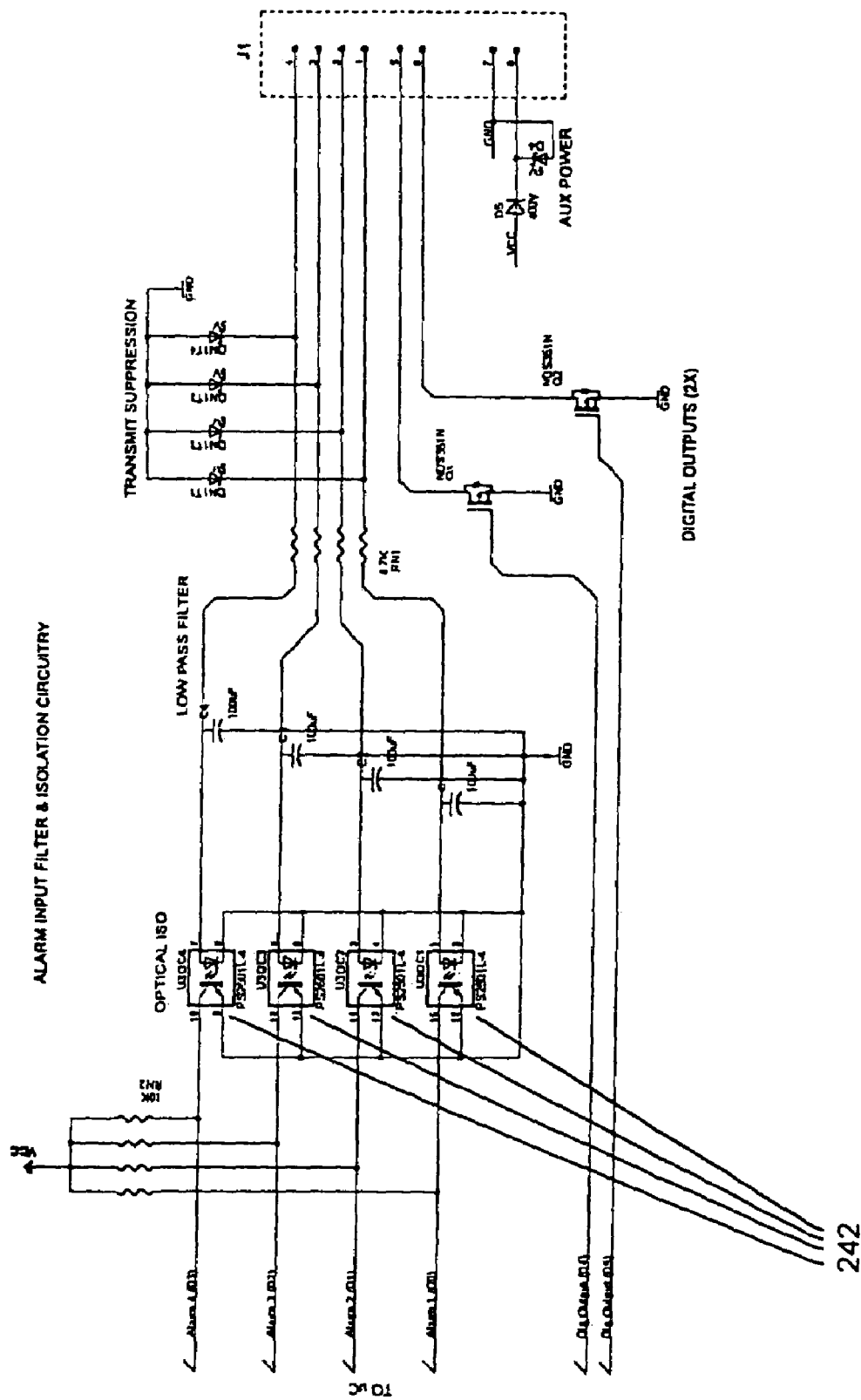
Figure 14:
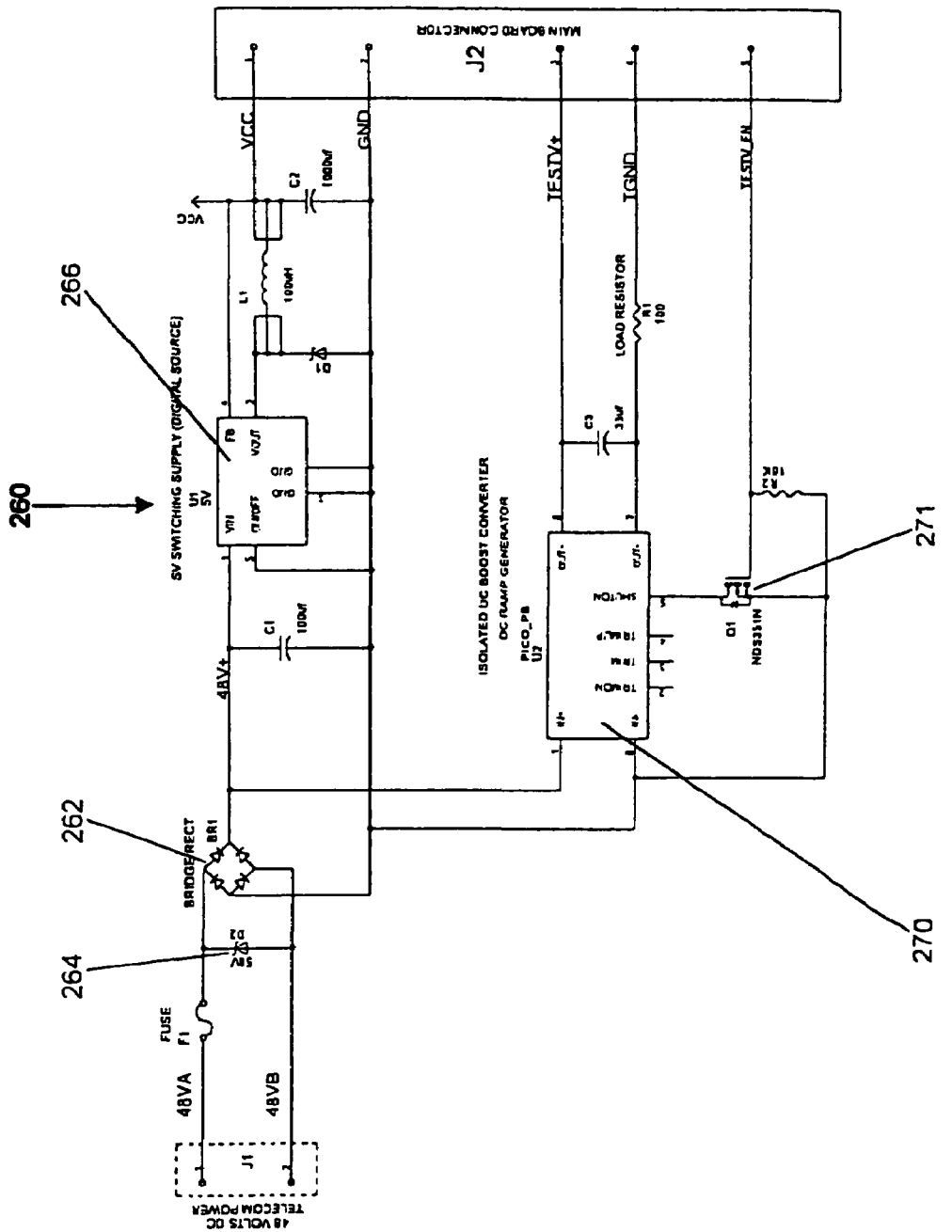
Figure 15:
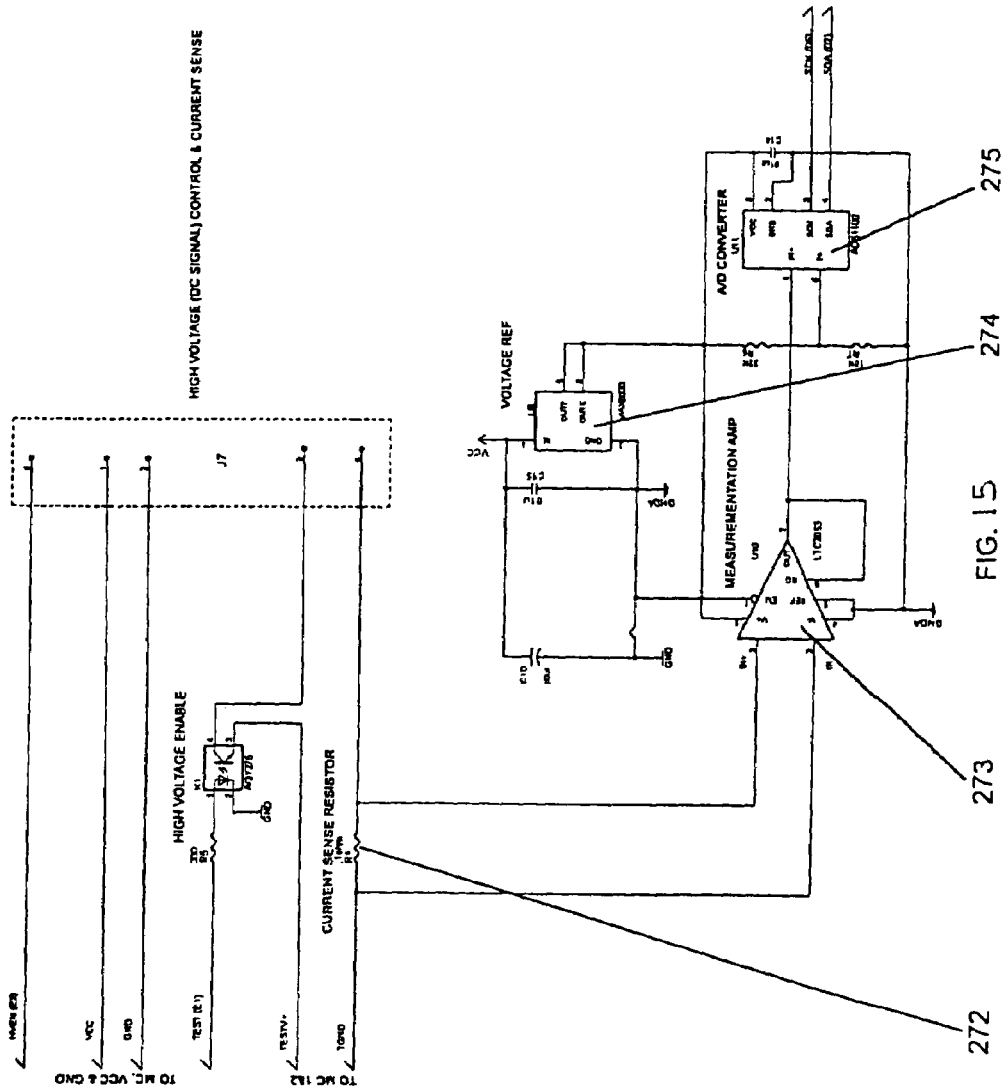
Figure 16:
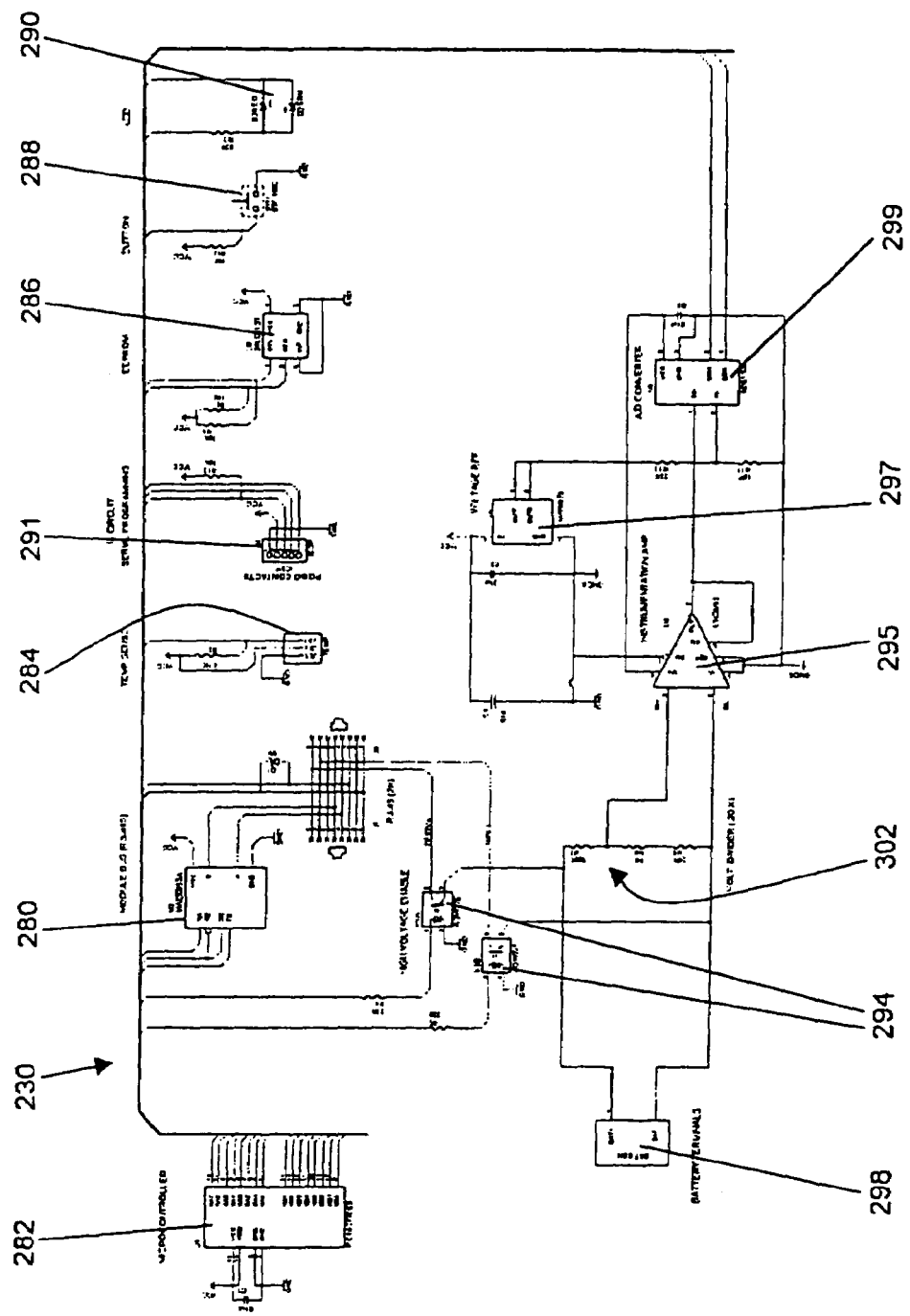
FIG. 16 is a block and schematic diagram of a battery cell test signal conditioning and measurement circuit according to the aspect of the invention shown in FIGS. 10 and 11.

As shown in FIGS. 12A and 12B, suitable connections are provided between the central processor 204, which may be a micro-controller, MicroChip model number PIC 16F877, and the real time clock 216, the RS232 driver 214, the modem 212, a cabinet temperature sensor 211, a serial data programmer input 209, and, at least one and, preferably, a pair of RS485 line drivers 220, each connected to a separate RJ45 jack 236.

The inputs from the alarms and other I/O 210 are supplied through a terminal block 240 to a signal conditioning circuit formed of opto-couplers 242, the outputs of which are connected to inputs of the micro-controller 204.

The operation of the battery monitor 230 is similar to that described above for the previously described and illustrated battery monitors of the present invention. In operation, a square wave pulse from the controller 202 is provided to begin DC ramp voltage flow to the one battery monitor 230 selected by the host controller 202. As the DC ramp signal is sent across the battery 298, the battery resistance is read back into the microcontroller 282 through the voltage divider 302. This value is transmitted by the microcontroller 282 of the server 234.

Figure 6:
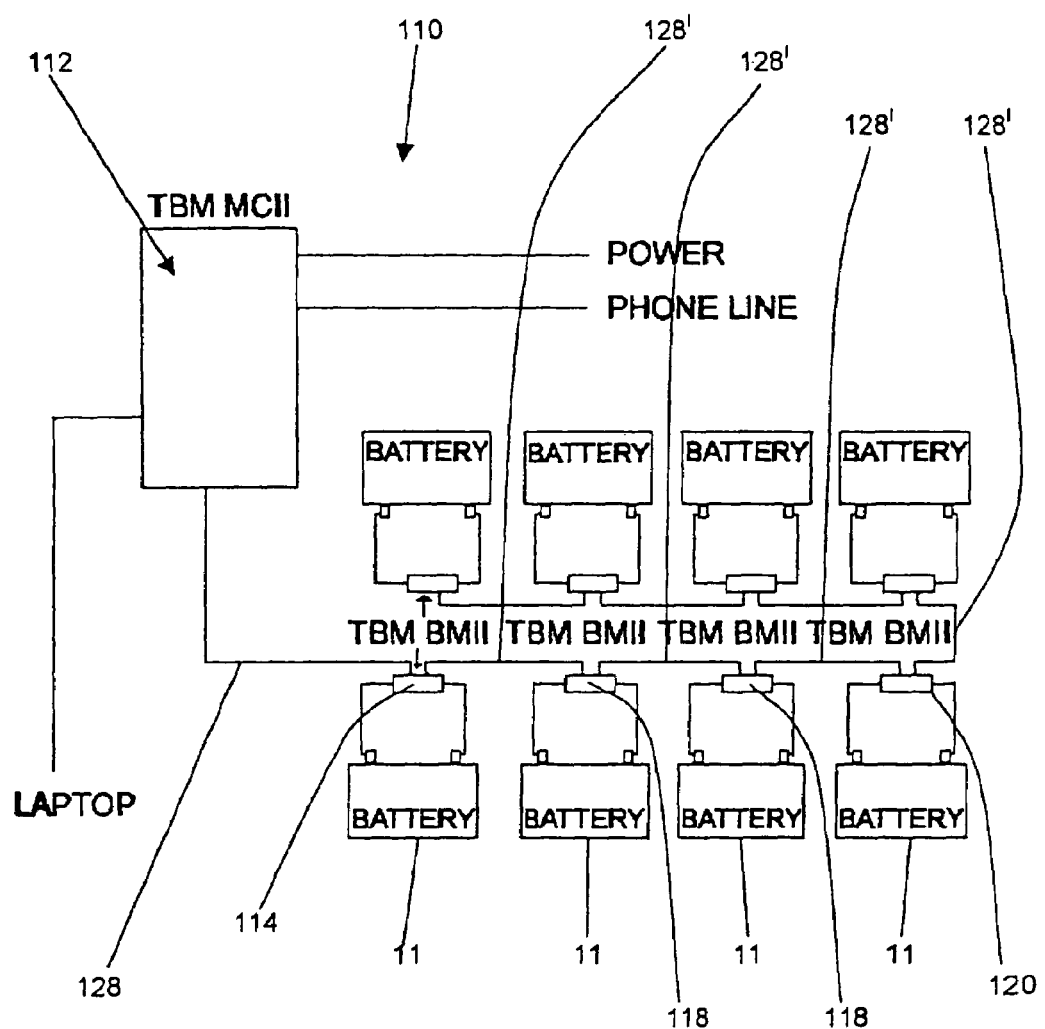
FIG. 6 is a general block diagram of another aspect of the present invention.

Each battery module 230 has a built in serial bus port to allow a plurality of like battery modules to be connected in a daisy-chain type connection as shown in FIGS. 6 and 10. Each battery module 230 has setable switches or inputs to provide an individual unit ID, as described above. This allows the host controller 202 to identify the battery condition data received by the host controller 202 for a particular battery.

The bus from the host controller 202 to the first battery monitor 230 and from the battery monitor to battery monitor in each string may be an eight-wire bus, such as an Ethernet-type RD-45 patch cable. The cable includes two +5 VCC signals which provide power to each battery monitor 230 to run the internal circuitry, two +5 VCC wires, two ground wires, two half duplex RS-485 data signal wires operating at 9600 band, and two high voltage test signal carriers (one plus and one minus or return). The host controller 202 polls the known IDs of each battery monitor 230 starting with ID 01 and continuing through all of the remainder of the battery monitors 230 connected in the battery string. As each battery monitor 230 receives request from the host controller 202, the DC ramp signal is supplied to the associated battery. The monitor 230 then sends the battery resistance reading data back through the host controller 202 to the server 234.

Each time the server 234 receives condition data from one battery monitor 230 or host controller 202, the data is stored and then compared to a threshold. If the data value is out of range of the set threshold, the data is tagged as a possible failure. The server 234 keeps track of this status and the indication of out-of-range threshold value as the polling cycle starts over. The second reading from the same battery monitor 230 is then received and compared to the last tagged or stored reading. If the reading is still out of the threshold range, the second reading is tagged. If the third reading from the same battery monitor 230 is still out of the threshold range, the server 234 averages all three readings. If the average is still out of the threshold range, the server 234 generates an indication of a failing battery.

Once each polling cycle of all the batteries in a particular string or strings in a location has been completed either once for each battery or multiple times as described above to obtain an average reading for each battery, the battery data is sent by the controller 202 to the server 234. In addition to the battery test data, the ambient cabinet temperature and individual battery temperature of each of the batteries, other alarm status and other data are also transmitted to the server 234. These additional data values enable the server 234 to determine an out of limit voltage or current to any particular battery, an out of range cabinet or battery temperature, etc.

The server 234 can also calculate a running average of all the batteries with which it communicates, thereby providing an average battery condition over large numbers of batteries as a comparison threshold. The battery data average is also a dynamic average, as new test data is continually added to the average.

Alternately, the out of threshold limit can be a programmable value rather than a preset, hardwired value entered by the end user. The user can simply program in a dynamic threshold against which the difference between each battery test data and the average battery test data is compared to determine in or out of threshold data.

The server 234 can also be programmed to determine the root-mean-square average or use a standard deviation analysis on the battery test data from all the batteries with which it communicates to provide a dynamic battery test data average which continually changes during the life of the batteries.

Referring back to FIG. 10, the data base manager or server 234 is formed of at least one or more processors which collect data from the remotely located controllers 202. An exemplary implementation, one server receives and scans the data for battery alarm conditions and the other server archives the data for later retrieval. The stored data is easily accessible and displayable via internet web pages enabling a customer to obtain a complete picture of current battery conditions or across an entire region in one glance.

Figure 17:
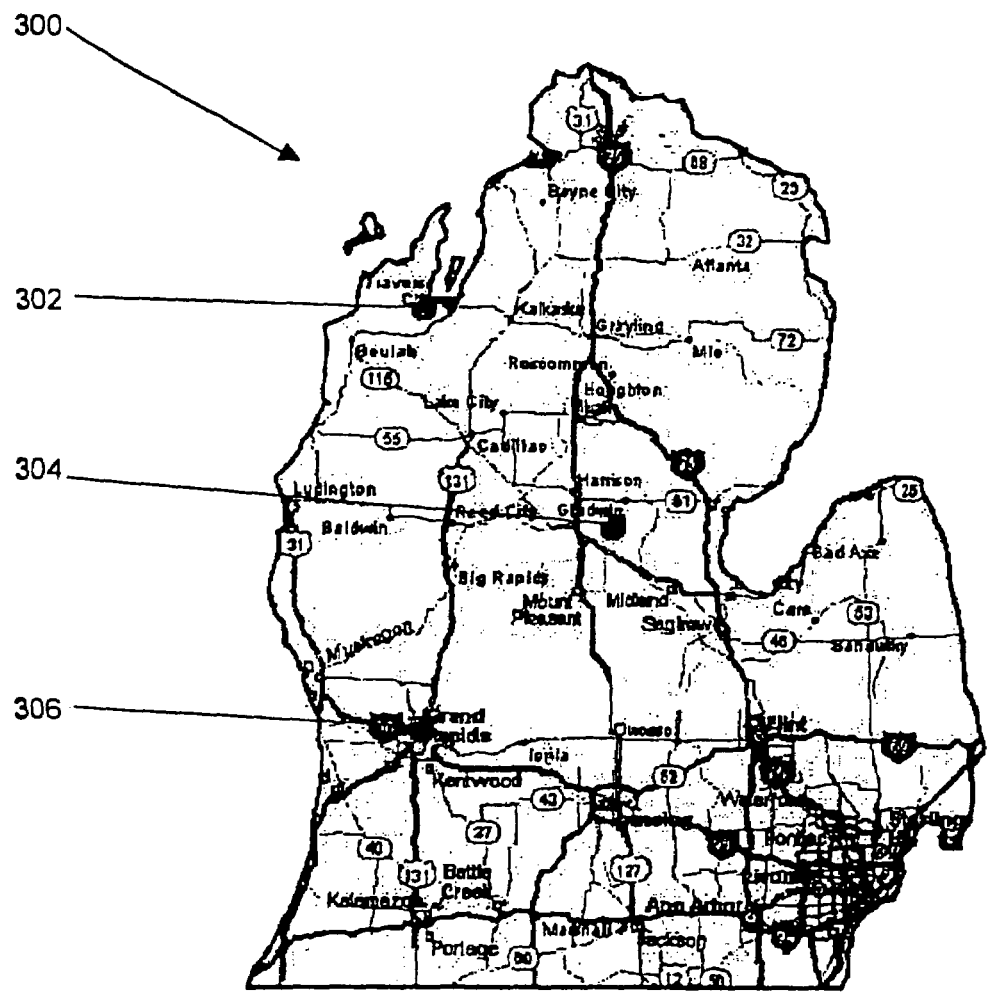
FIG. 17 is a screen display of a regional battery alarm alert according to the present invention.
Figure 21:
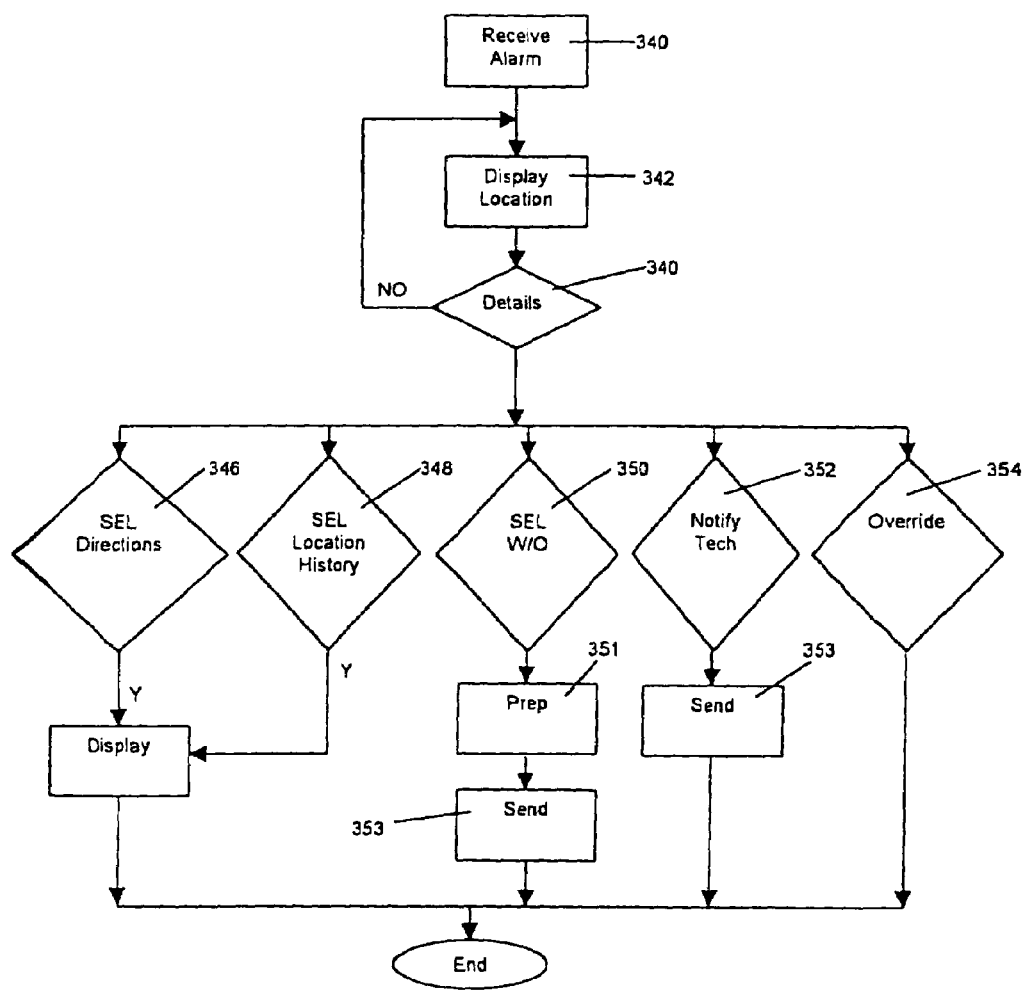
FIG. 21 is a block sequence diagram showing the operation of the central processor/server.

For example, FIG. 17 depicts a screen display 300 for a user connected via a web interface to the server/database manager 234. The illustrated screen 300 is one of many alert methods which can additionally or alternately include e-mail, paging, facsimile and/or voice messaging.

The red dots 302, 304 and 306 show alarms generated from remote host controllers 202 indicating that the status of one or more batteries at each indicated location is out of parameter. The red dots 302, 304 and 306 may flash on and off to draw attention to the alarm condition.

Clicking on each of the dots, such as dot 302 brings up the details of the alarm condition as shown in FIG. 18. The screen display shown in FIG. 18 includes information concerning the location of the specific battery equipment, including its street address, as well as battery specifications and indication of the alarm condition. Various actions are selectable including the displayed map as shown in FIG. 18 and directions to the battery location, a location history of the equipment and prior alarm conditions, printing up a work order, and for the notification of a technician for immediate service.

For example, alarm condition, noted by dot 302 in FIG. 18, indicates that one of the batteries at the specified location has an impedance out of a specified range.

Clicking on the dot 304 brings up the screen shown in FIG. 19. Similar information is displayed. By example, the alarm condition shown in FIG. 19 is a battery thermal overload or breakdown. Finally, clicking on the dot 306 brings up a similar screen for a different battery location. In this example, the battery alarm condition is a battery voltage below a set threshold voltage.

Instead of web pages alerts, as shown in FIGS. 18-20, the occurrence of any alarm condition as sent to the data base manager 234 can cause an immediate telephone call, facsimile, e-mail or voice message to a technician, with verbal instructions relating to the information shown in FIGS. 18-20 to enable the technician to facilitate a response and repair of the alarm condition.

When the database server 234 receives an alarm signal in step 340 from one of the post controllers 202, the server 234 generates a battery alarm alert as shown in one of FIGS. 18-20 and displays in step 234 on a suitable monitor battery parameters including battery type, battery location, manufacturer, battery application, number of battery in battery string, and the total number of battery strings at the same location. The display alarm alert also includes a statement of the battery condition alarm.

If the user which can be the customer or a monitoring company desire further detail, the user in step 344 clicks on one of the icons labeled map/directions, location history, print work order, notify technician, and override.

If map/directions icon is chosen in step 346, a detailed map, shown for convenience in FIGS. 18-20, is displayed along with road directions to the location of the battery. If location history is selected in step 348, an archived history of all of the prior battery alerts for the location in which the present battery alarm alert is associated with is displayed on the monitor.

If a print work order is desired, the print work order icon is selected in step 350 which generates a work order for service of the battery alarm alert. The work order is prepared in step 351 and sent in step 353 to the appropriate organization or person by any suitable transmission means, including Internet, e-mail, telephone, pager, etc. A technician or service person can be notified in step 352, by e-mail, pager, fax, telephone, to address the battery alarm alert.

The override icon can be selected in step 354 to delete the alarm alert.

Refer now to FIGS. 22-31, there is depicted another aspect of a battery monitor apparatus 400 for monitoring the condition of a battery 402. The conductor or lead connections to the battery posts or terminals 404 and 406 for the supply of power from the battery 402 to an external load are not shown in FIG. 25 for clarity.

Figure 22:
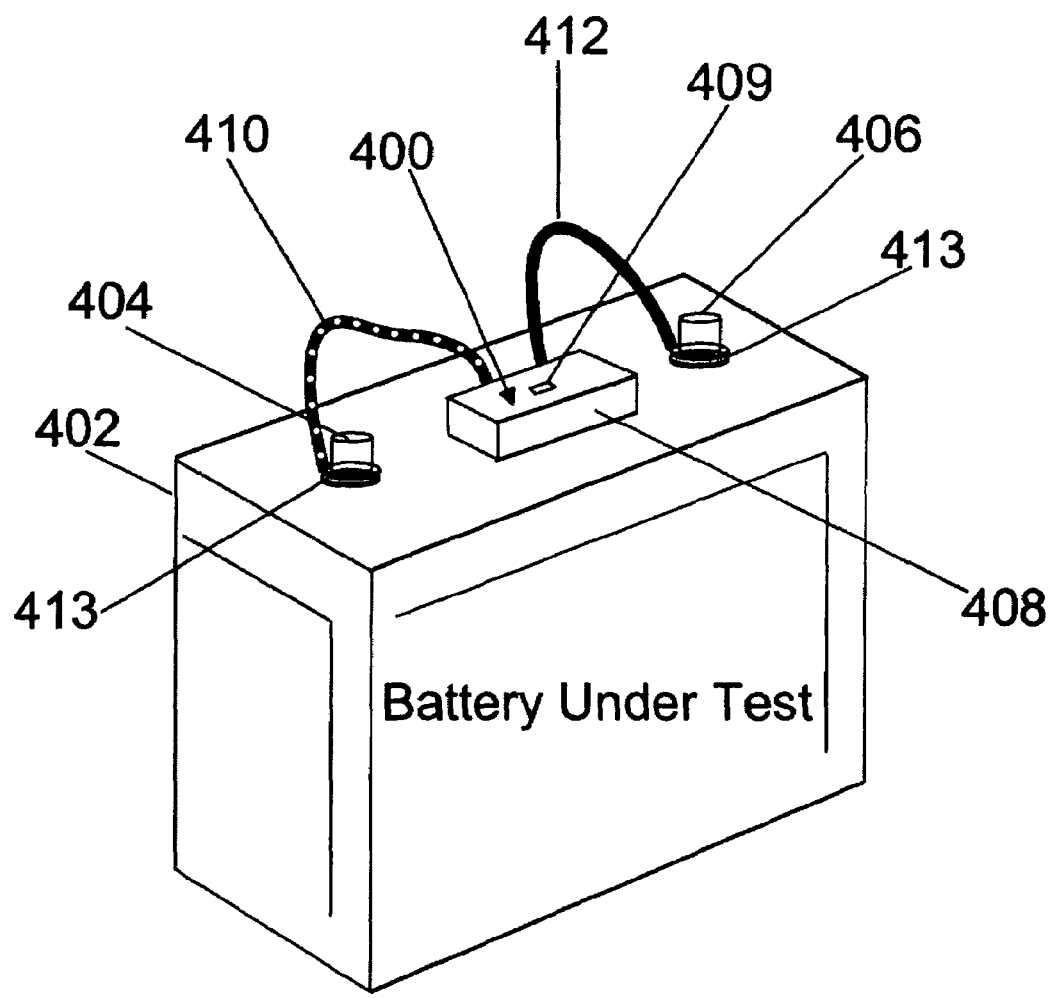
FIG. 22 is another aspect of battery monitoring device or pod.

It will also be understood that the depiction of a single battery 402 in FIG. 22 is representative of a plurality of batteries typically located at a single location, which are independent of each other, connected in a series, connected in parallel, or connected in series and parallel, to supply power to loads.

The battery monitor apparatus 400 includes a battery monitoring means hereafter referred to as a pod 408. The pod 408 including an outer housing is physically mounted on the battery 402 and has leads or conductors 410 and 412 respectively connected to the plus and minus terminals or posts 404 and 406 of the battery 402.

Figure 23:
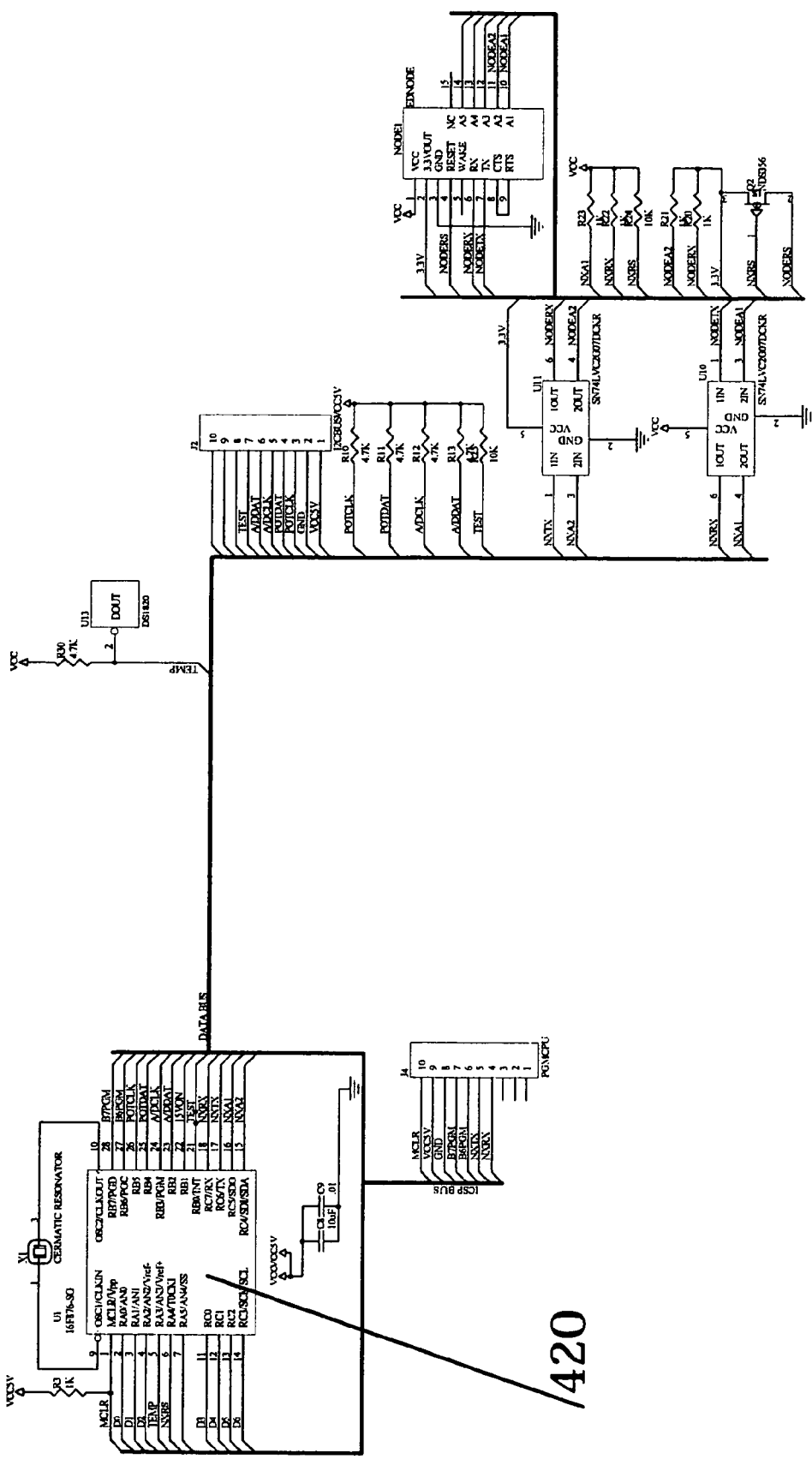
FIG. 23 is a schematic diagram of the microcontroller employed in the pod shown in FIG. 22.

The components of the battery monitoring apparatus 408 mounted within the housing of the pod 408 are shown in FIGS. 23-27. Referring first to FIG. 23, a control means is the form of a microcontroller or processor 420, which is similar to the processor 282 described above and shown in FIG. 11, is mounted in the pod 408.

Figure 24:
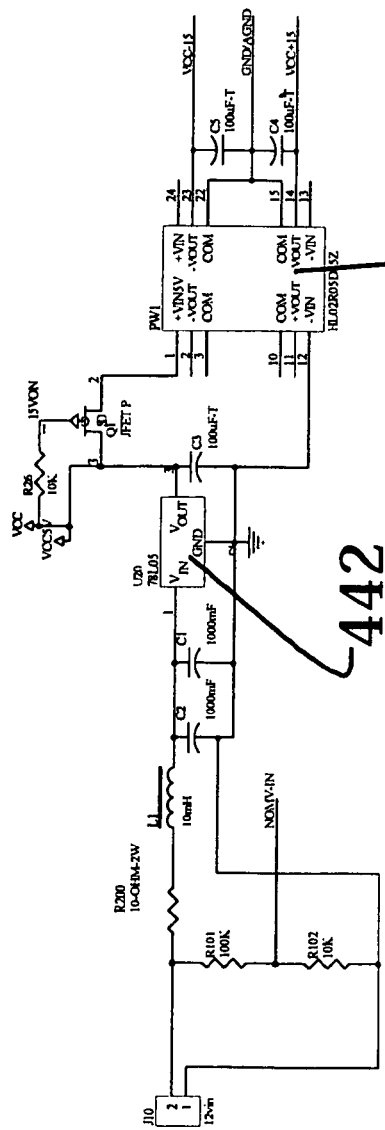
FIG. 24 is a circuit diagram of the power supply employed in the pod shown in FIG. 22.

A power supply 440, shown in FIG. 24, supplies power to the micro controller or processor 420 as well as the other operative elements contained within the pod 408. The power supply 440 uses the battery output J1, typically 12 volt, to power the pod 408. The 12 volt output of the battery 402 is regulated to a five volt primary power source by voltage regulator 442. The five volt primary output from the voltage regulator 442 is fed to a DC to DC charge pump 444 which triples the five volt input to a 15 volt secondary power source. The 15 volt secondary power is split as a railed power supply providing a +15 and −15 volt source at terminals or connectors J2 and J4. The 15 volt rail is fed to a signal amplifier/peak detector circuit, the signal injector and the signal generator circuits described hereafter. The five volt primary is fed to a wireless node, as described hereafter.

Figure 25:
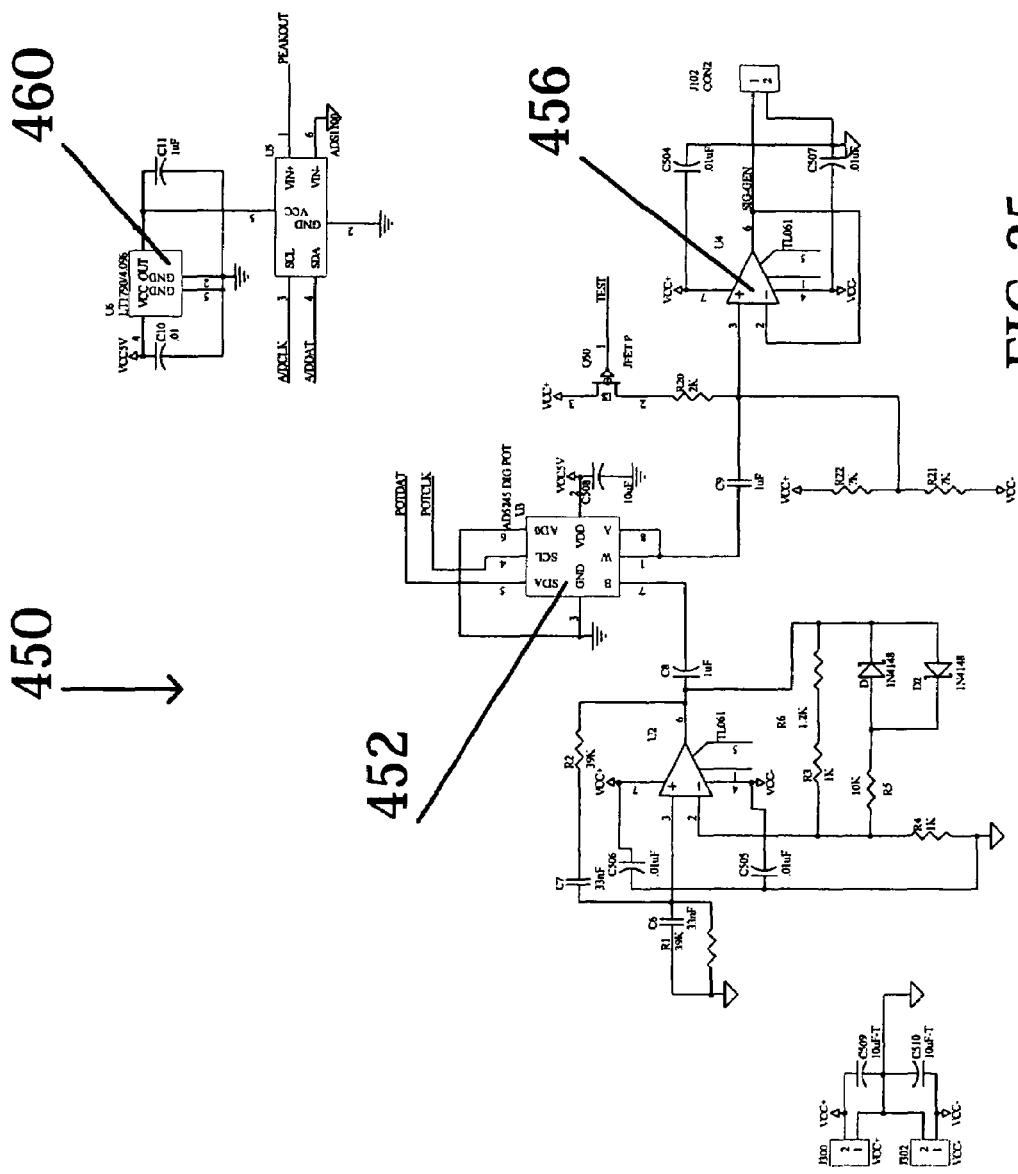
FIG. 25 is a circuit diagram of the signal generator circuit employed in the pod of FIG. 22.

A signal generator means on circuit 450 is shown in FIG. 25 for generating an ac signal waveform applied to the battery 402 undergoing test. The signal generator means 450 uses a resistor/capacitor circuit R1, C6, C7, and R2 to create the ac signal waveform. The waveform is passed through a digital potentiometer 452 which sets the amplitude of the signal waveform. The digital potentiometer 452 is connected to the microcontroller 420 by signals POTDAT and POTCLK.

Figure 26:
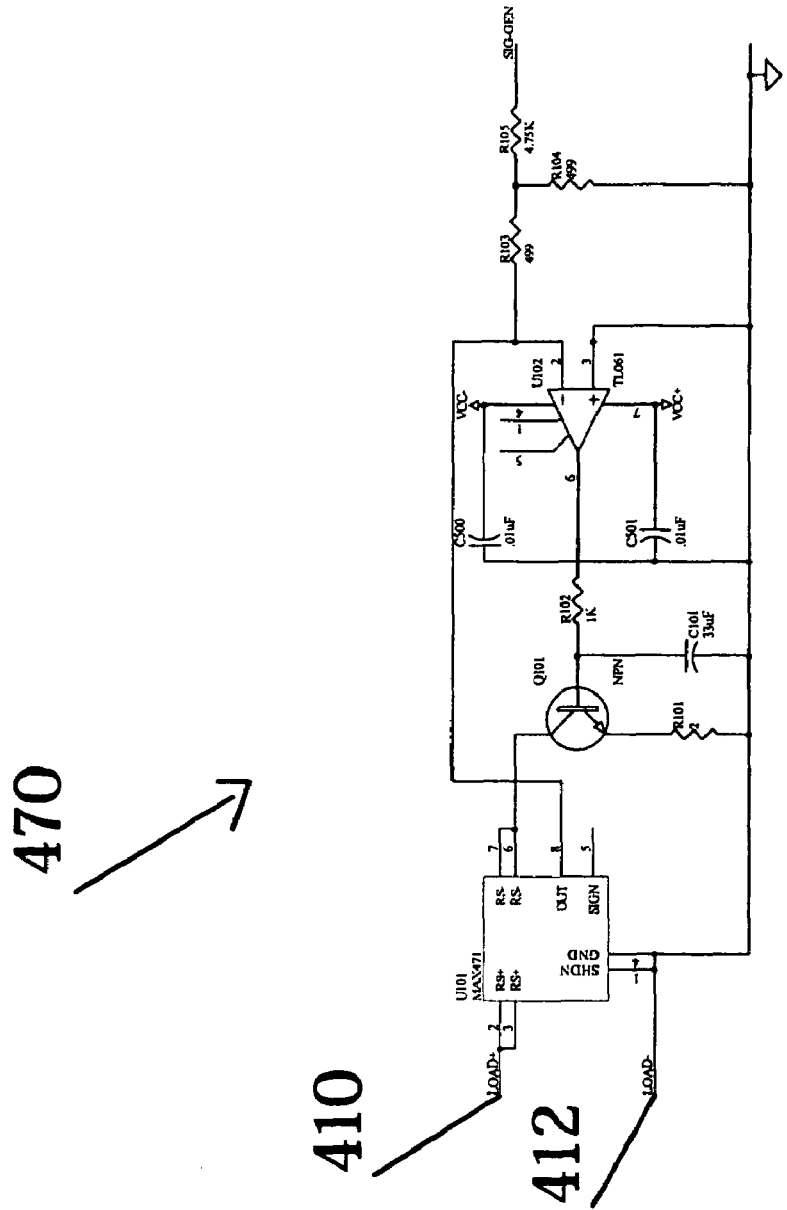
FIG. 26 is a signal injection circuit employed in the pod shown in FIG. 29.

The output of the signal generator 450 through amplifier 456 is fed as a signal input to a signal injector circuit described hereafter and shown in FIG. 26.

Q50 is a test on/test off switch for the signal generator 450. The microcontroller 420 controls the Q50 switch.

The digital potentiometer 452 allows on the fly change in the signal injection amplitude. Typically, the signal injection amplitude range is selectable from 10 millivolt to 1 volt.

A voltage reference circuit 458, is also shown in FIG. 25, supplies a voltage reference to the A/D converter 462.

A signal injector means or circuit 470 is shown in FIG. 26.

Figure 29:
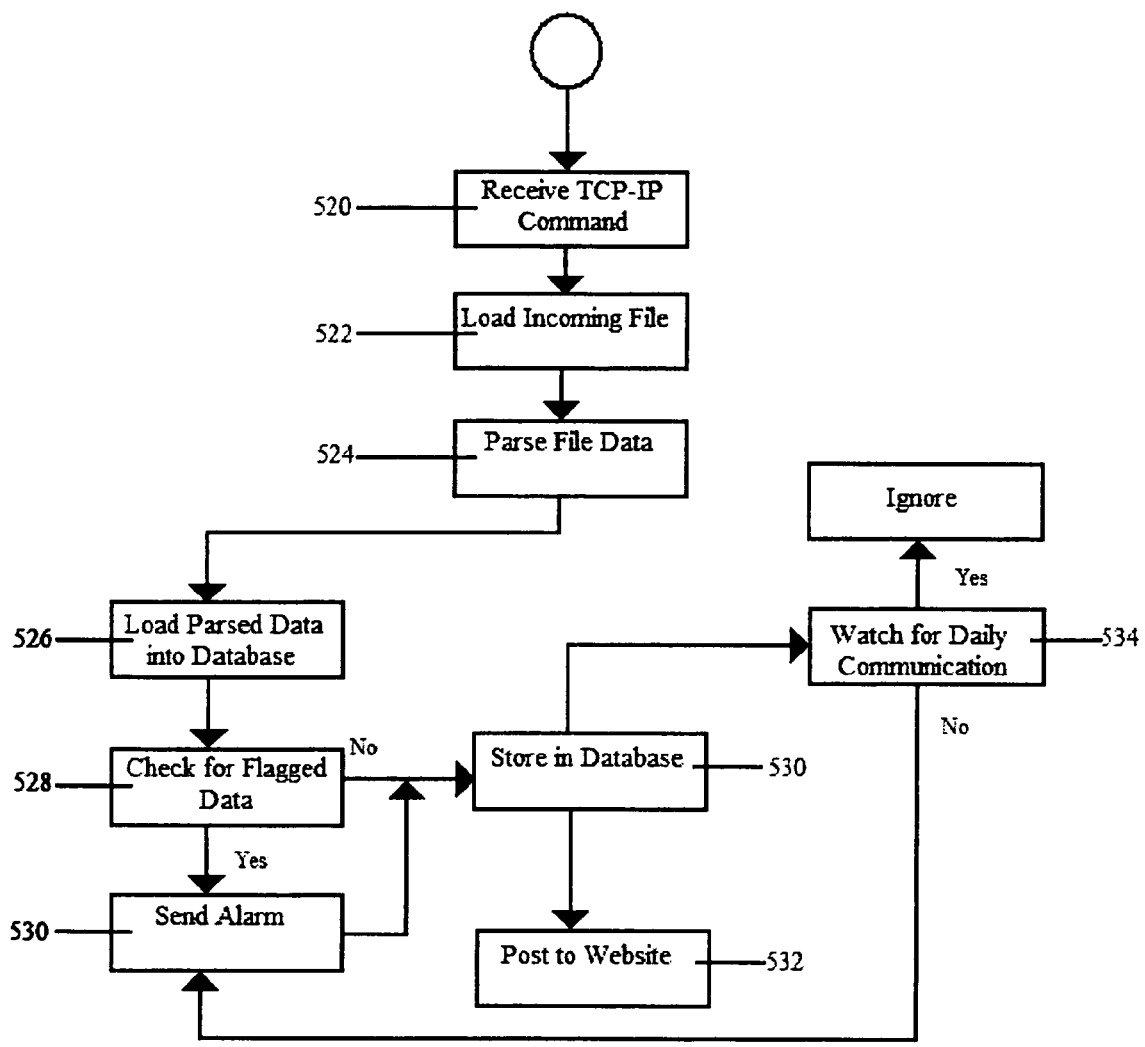
FIG. 29 is a flow diagram of the server control steps.

By applying an ac voltage superimposed on a 10-times larger negative-dc voltage, the signal generator 450 connected to J102 determines the battery current drawn by transistor Q101 shown in FIG. 29. The generator voltage causes the op amp 456 to go high and turn transistor Q101 on, which allows battery current to flow through a high-side, current sensing amplifier U101, such as a Maxim 471 sensing amplifier. The output current of the sensing amplifier U101 equals $\frac{1}{2000}$ of this battery current. Inputs to the sensing amplifier U101 are taken from the leads 410 and 412 connected to the battery terminals or lugs 404 and 406, respectively.

C101, U102, and Q101 form a loop in which the op amp forces a virtual ground on the left end of R103. This virtual ground condition enables the voltage divider formed of resistors R103 and R105 in parallel with resistor R104 and the signal generator 450 to determine the voltage across resistor R103.

Figure 27:
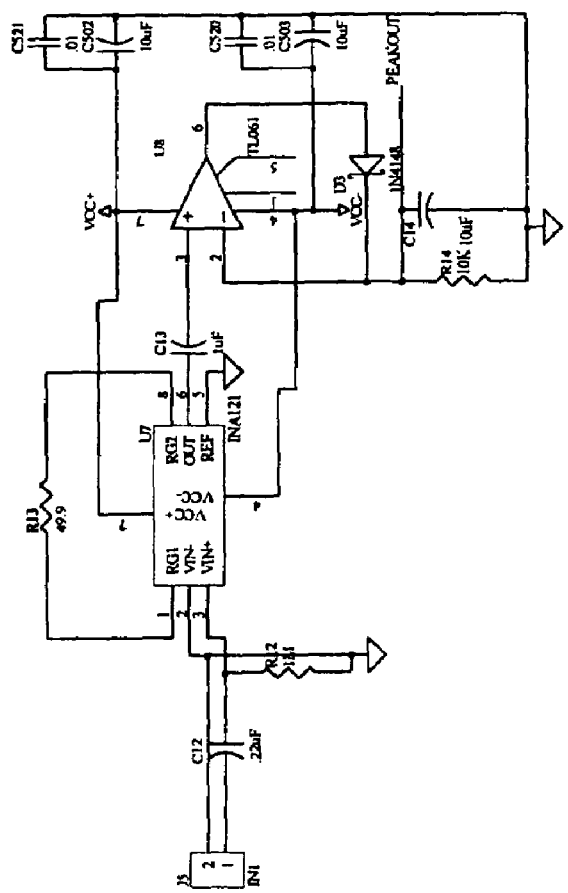
FIG. 27 is a peak detection circuit employed in the pod shown in FIG. 29.

A signal amplifier/peak detector means or circuit 458 is shown in FIG. 27. The signal amplifier circuit is connected in parallel with the signal injector circuit 470 at the +load and −load inputs to the sensing amplifier U101. The peak detector takes the amplified signal and converts it to a dc voltage output (peakout). This dc output is fed into an analog/digital (A/D) converter that converts the analog dc voltage to a digital signal which is then fed to the microcontroller 420.

When the transistor Q101, which can be a FET, conducts, it shorts the battery 402 for a short time. This enables the sensing amplifier U101 to measure the waveform. The control means or microcontroller 420 executes a stored program which determines at least one or more operative conditions of the batter, such as the internal resistance, nominal battery voltage, and/or negative battery host temperature. Any one or any combination of these three measurements can be used to determine the health of the battery under tests. Each of these three threshold or nominal values can be entered by the battery manufacturer or during installation of the pod 408 on a battery 402. The control means 420 and the pod 408 begins the test shortly after the pod 408 is connected to the battery 402 or on a predetermined time schedule internally set within the pod 408. A bi-colored LED 409 visible externally of the case of the pod 408 will flash green when indicating that a test is about to begin. During testing, no light is emitted by the LED 409. After a test is complete, the pod 408 will flash the LED yellow to indicate the end of the test. Once the test is complete, the new values gathered during the test are compared to the threshold values. If any of the newly gathered values are outside the respective threshold, the bi-color LED will emit red.

The use of the LED 409 enables a single pod 408 mounted on a single battery 402 to provide a visual indication of the condition of the battery 402 as the operative condition of the battery. This can be used on a stand alone, single battery basis without any wireless communication to aid the remote control.

It will be understood that the LED 409 forms an illuminatable means which provides a visual indication of an operative condition or state of the battery 402. Broadly, the illuminatable means 409 may comprise bi-color LEDs, individual, different color LEDs, or other forms of illuminatable devices which provide an indication, when illuminated or not illuminated, of a state or condition of the battery 402.

The microcontroller 420 executes a control program stored in an associated memory which calculates a first value of a calculated ac current of the injected ac signal current ×136/499.

A milliohm of battery internal resistance equals peak to peak millivolt input signal/calculated ac current.

The ac current equals (R103 in parallel with R104)/(R103 in parallel with R104+R105)/peak to peak millivolt/R103, where the signal generator output is in the range of 0-500 millivolts.

Since the measured output current from the battery 402 is proportional to the calculated current times the milliohms of battery resistance, the control means 420 can calculate the milliohms of internal battery resistance once it measures the output current from the battery 402 and calculates the calculated ac current as described above.

This determined battery internal resistance, in milliohms, is compared with a threshold, which can be set by the battery manufacturer or can be set or changed by the user. For example, the manufacturer's threshold indicative of a properly operating or good battery is 6 milliohms of internal battery resistance. Such a battery manufacturer has determined that a bad or inoperative battery can be determined if the battery internal resistance is 50% larger or approximately 9 milliohms. Thus, 9 milliohms can be used as threshold indicative of a bad or inoperative battery. Other thresholds between 6 and 9 milliohms may also be employed. Even though the pod 408 may be factory set or subsequently programmed by the user to have a battery internal resistance threshold of 9 milliohms, the user can reprogram the threshold to other values, such as to any value between 6 and 8 to suit the user's preference, or to accommodate changes in battery standards. The threshold reprogramming can be done through the setup utility program shown in FIG. 28.

Figure 32:
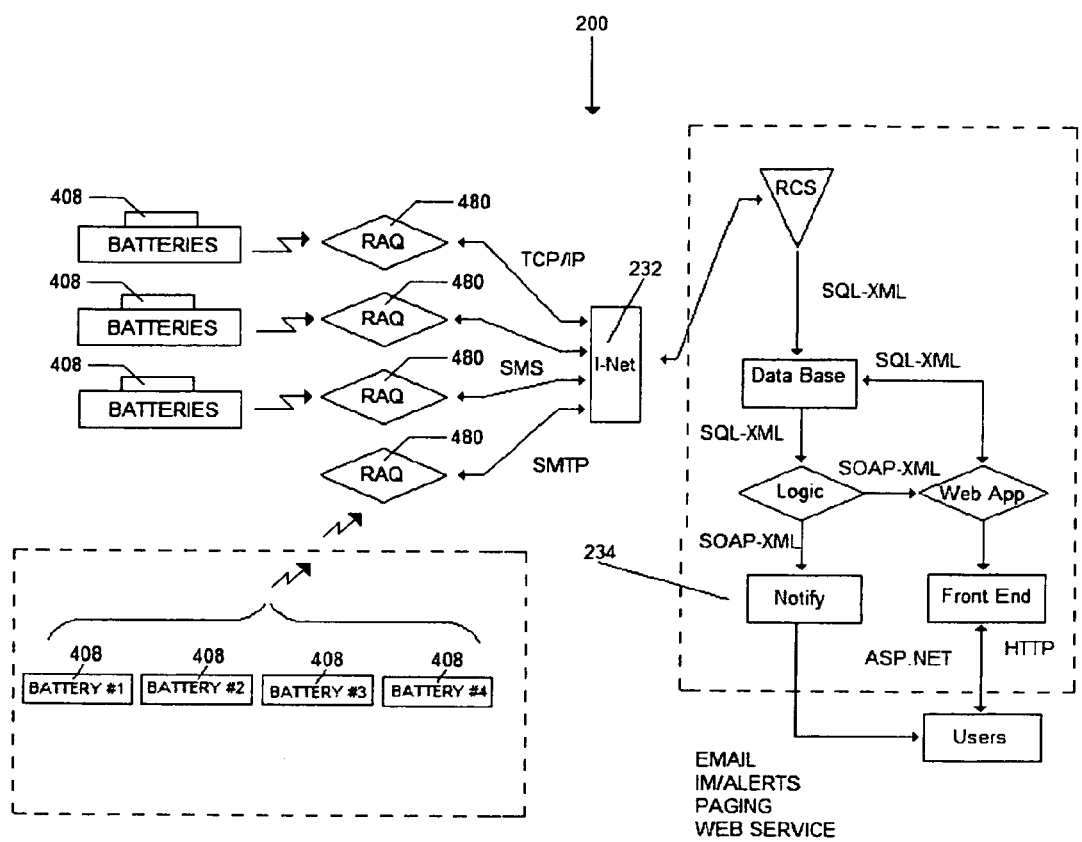
FIG. 32 is a pictorial representation of the battery monitoring apparatus shown in FIGS. 22-31.
Figure 33:
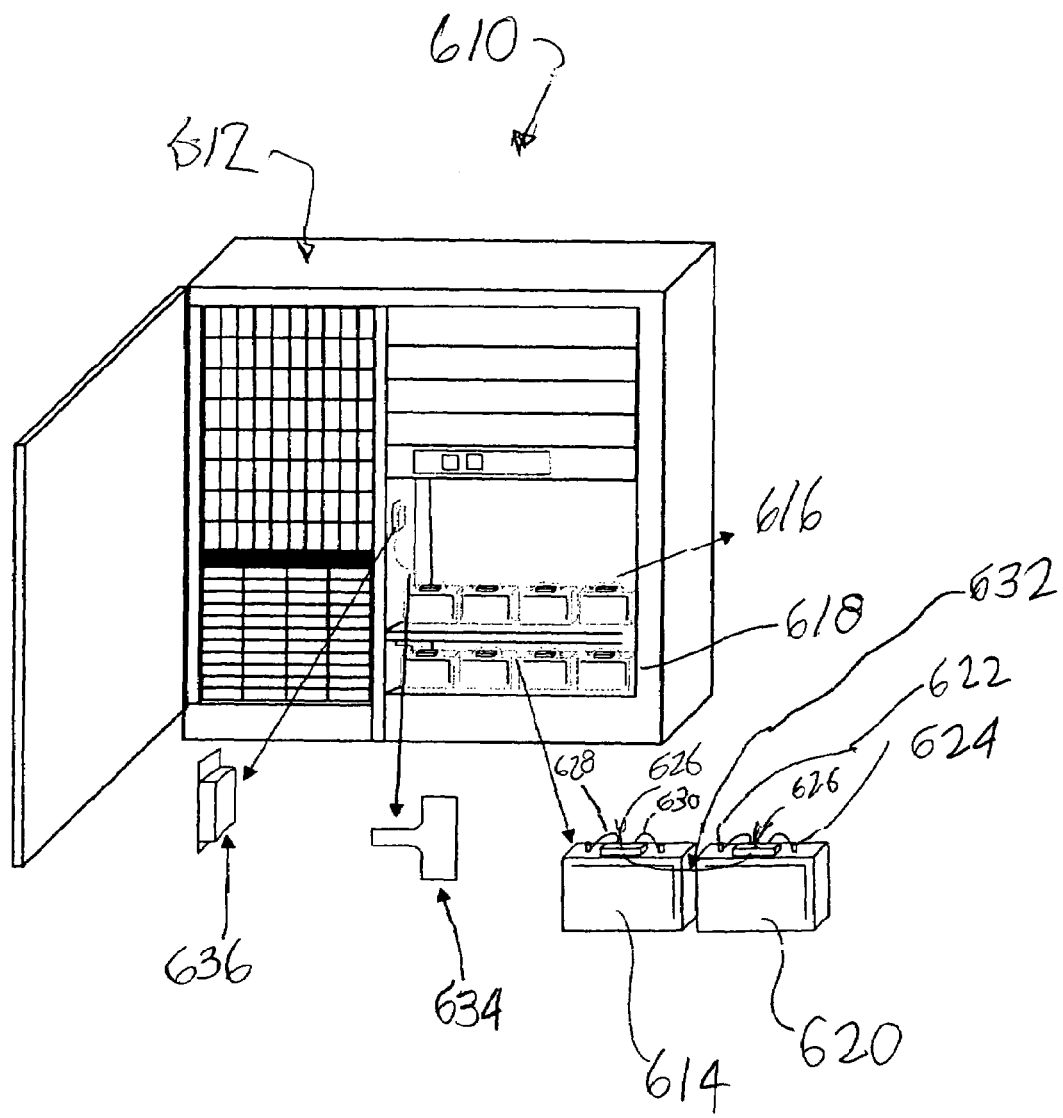
FIG. 33 is a pictorial representation of another aspect of a battery monitoring apparatus.

The microcontroller 420 output is connected to a transceiver 421, FIG. 23. The transceiver 421, which can be a transceiver manufactured by eDevice, model Egate200, acts a wireless node. The microcontroller 420 uses the node to transfer data from the pod 408 to the transceiver. The transceiver 421 then sends the data wirelessly out to a remotely located host controller 480 shown in FIGS. 28 and 32, by a variety of communication formats or protocols, including Ethernet, GSM, or RS232, as well serially. The microcontroller 420 can also be connected to the wireless node by an RS232 connection.

The host controller 480 can be similar to any of the raq controllers 202 shown in FIGS. 10 and 11. Thus, the host controller 480 is mounted in the same telephone cabinet or hut 14 shown in FIG. 1 with the one or more pods 408 and associated batteries 402. The transceiver allows wireless communication between the one or more pods 408 and the controller 480. In an example of one inventive configuration, 1-16 pods 408 may be used with a single controller 480. The host controller 480 can, by example only, be a standard rack mounted housing mountable or affixed to any flat surface in the cabinet 14. The controller 480 may include a front view LCD and a communication port to access software menus. The communication port allows a connection of a lap top or pocket PC type device to the controller 480. With appropriate set up utility software stored in a memory accessed by the controller 480, a user has access to variables in the control program of the host controller 480, which gives the user the ability to change time and date, set threshold values, set test times, log user data, set server communication, set the number of tests to be logged before sending data to the network server.

Referring now to FIGS. 28-31, there are depicted flow diagrams depicting the sequence of operation of the host controller 480 in initiating and receiving a battery condition test for one or more batteries, such as battery 402.

Figure 28:
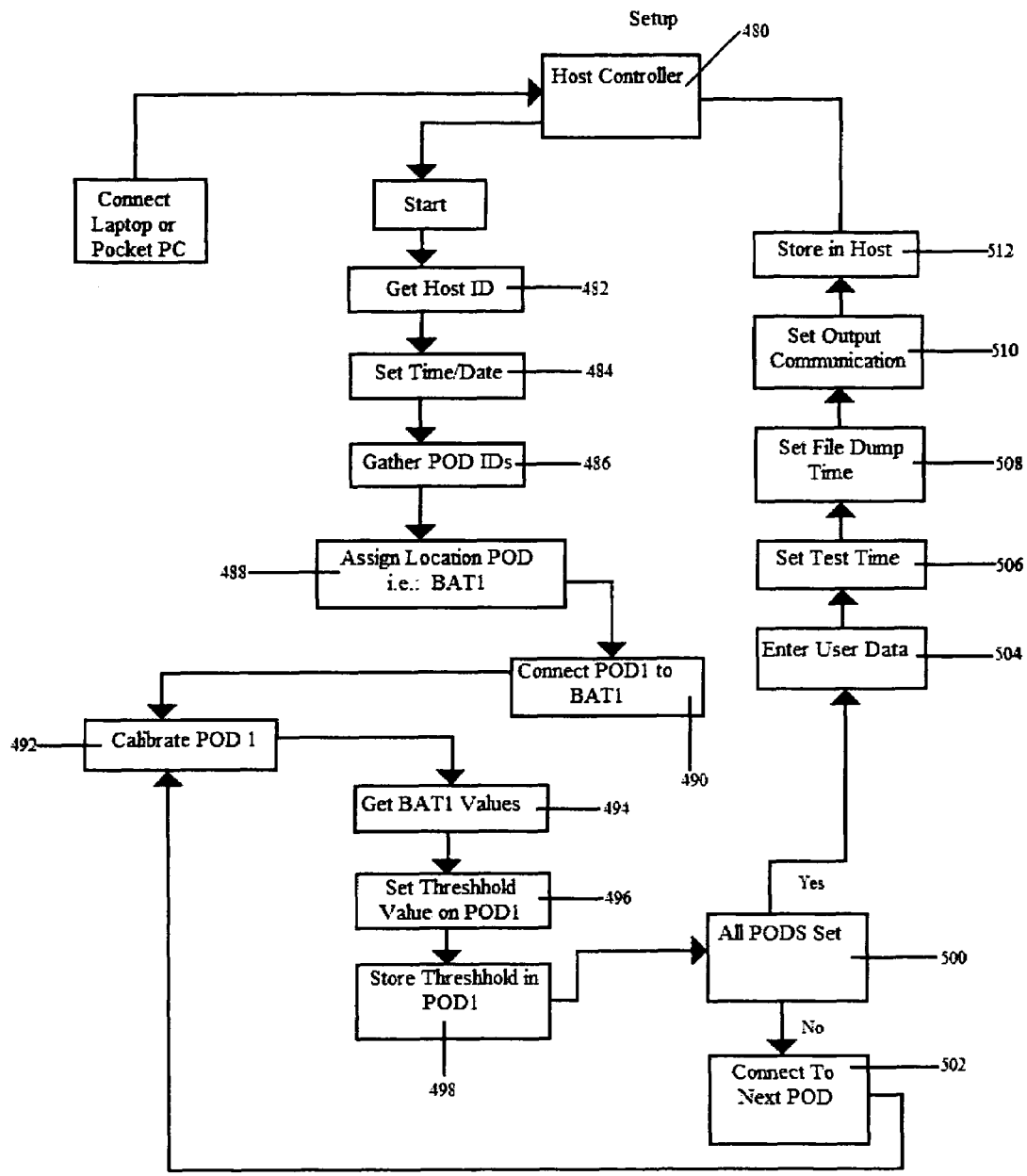
FIG. 28 is a flow control diagram showing the sequence of operation of the host controller set up.

As shown in FIG. 28, the host controller 480 goes through an initialization or set-up procedure in which the host controller 480 establishes the host ID in set 482 sets the current time and date in step 484 and then gathers all of the pod 408 Ids in step 486. The host controller 480 then assigns a location to each pod an associated battery, such as POD 1 =BAT 1 in step 488.

With POD 1 connected to BAT 1 in step 490, the host controller 480 calibrates pod 1 in step 492. The host controller 480 then uses POD 1 to obtain values for BAT1 in step 494 and sets a threshold value on POD 1 in step 496 indicative of an acceptable or normal battery condition. This threshold is stored in POD 1 in step 498. This same process is completed through a loop using steps 500 and 502 until all of the pods 408 on all of the batteries 402 in a serially connected battery string or separately connected batteries are set.

The host controller 480 then enters user data allowing the running of tests in step 504. A test time is set in 506. This could represent a periodic automatic test, such as at 12 o'clock am everyday. The file data dump time is to the host controller 480 as set in step 508. The output communication format is set in step 510 and then stored in the host controller 512.

The host controller 480 is connected by wireless communications, hardline, cable, modem, or other data communication connections to a network server, such as an Internet coupled server, to receive data communications from the pods 408. As shown in FIG. 29, the server receives a TCP-IP command in step 520 and then loads the incoming file data in step 522. The file data is then parsed in step 524 before it is loaded into a database in step 526. The data is checked in step 528 by the server for flagged data. If flagged data is present, an alarm is sent to the host controller 480 in step 530.

If there is no flagged data from step 528, the battery output data is stored in the database in step 530 and posted to a website 532 for display, downloading, etc.

The server watches for daily communications in step 534.

Figure 30:
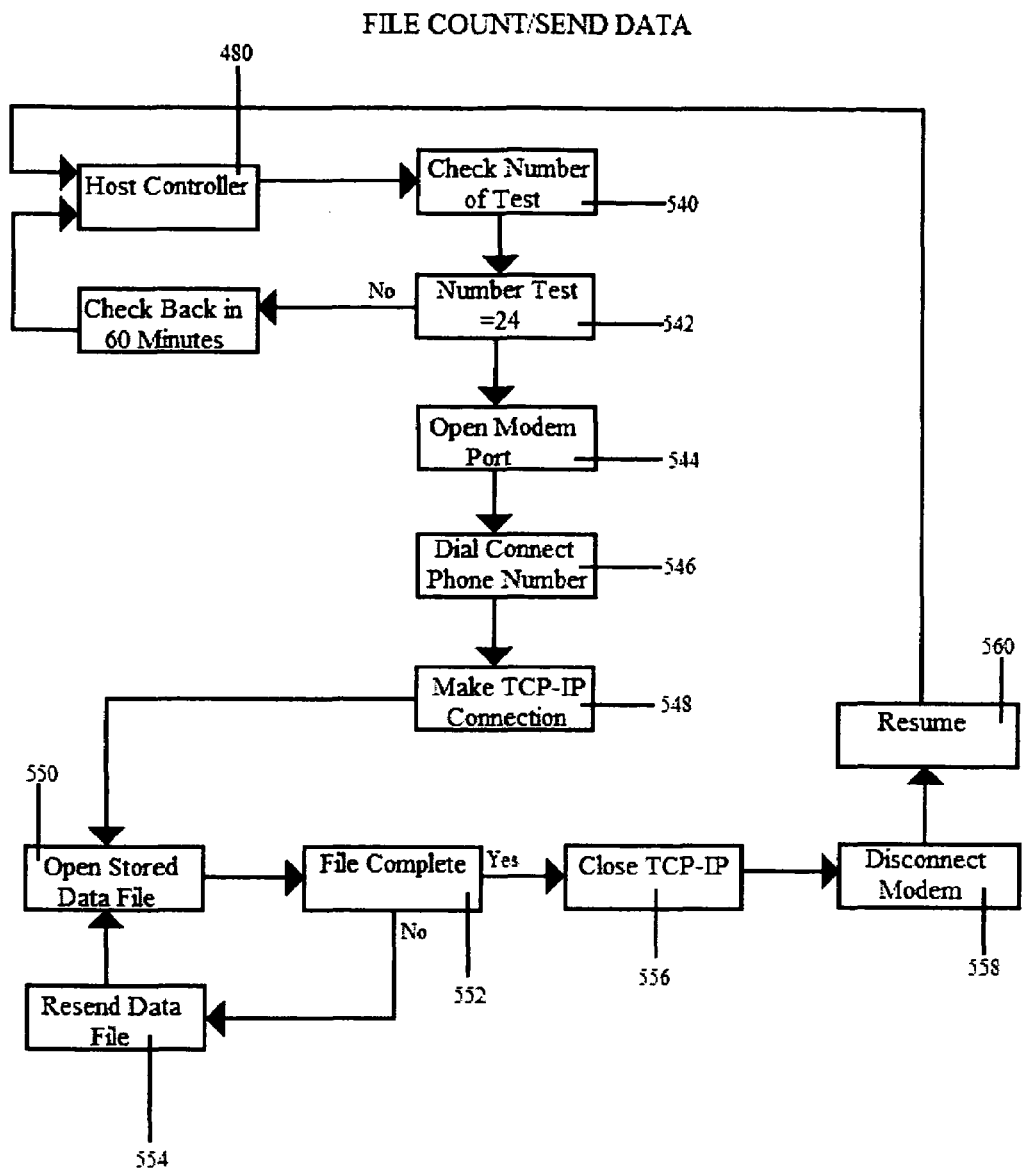
FIG. 30 is a flow control diagram showing the communication connection between the host controller and a battery undergoing test.

As shown in FIG. 30, the host controller 480, in executing a battery test at the test time established in 506 on one battery, such as battery 402, checks the number of the tests in step 540. The test number equals 24 as checked in step 542, the host controller 480 opens the modem port in step 544, dials the connect phone number in step 546 and makes the TCP-IP connection in step 548.

The host controller 480 then opens the stored datafile in step 550, checks for file complete in step 552, and if the file is incomplete, resends the datafile instep 554.

However, if the file is complete as checked in step 552, the host controller 480 closes the TCP-IP connection in step 556, disconnects the modem in step 558 and enters and continues with execution of its controlled program in "resume" step 560.

Figure 31:
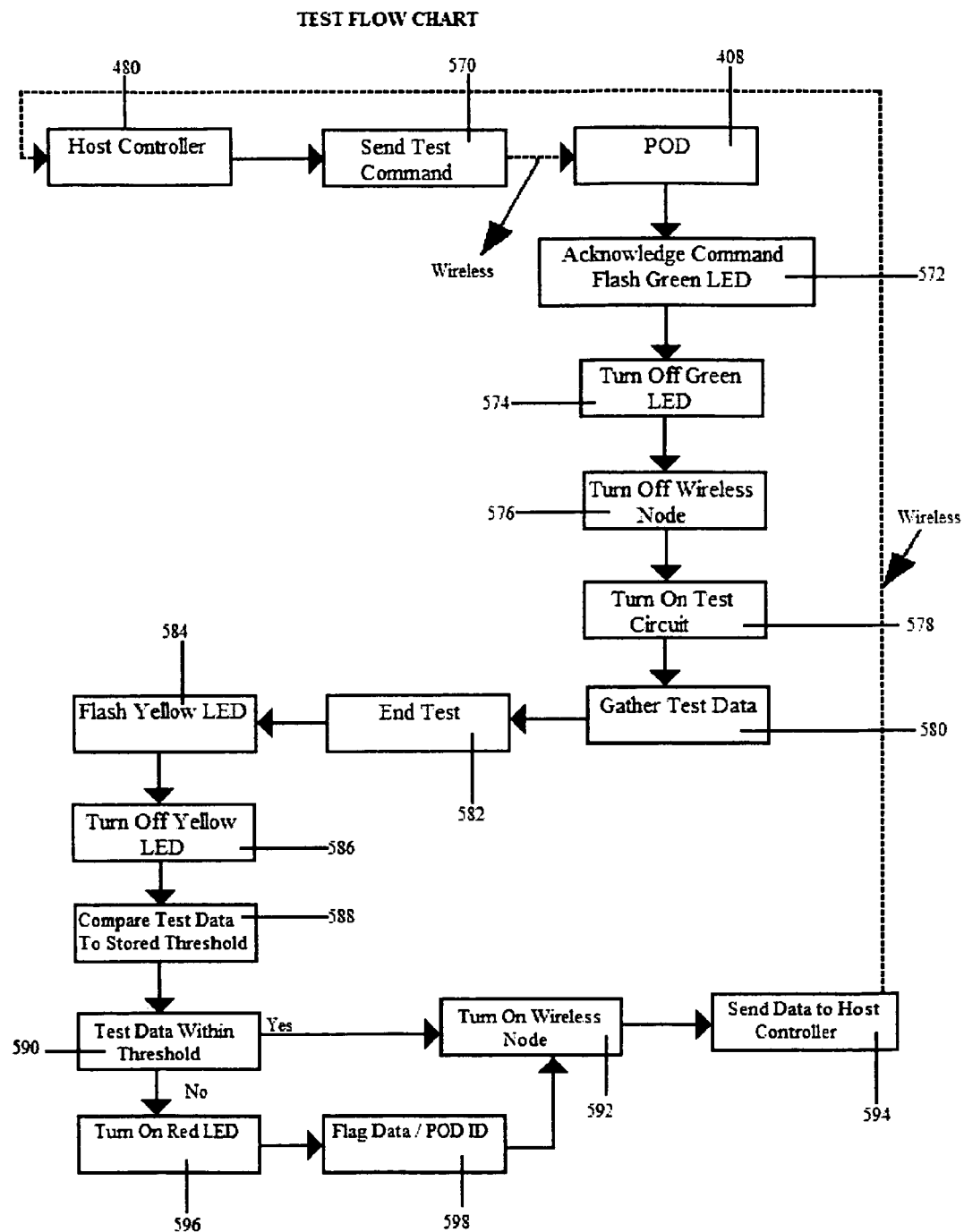
FIG. 31 is flow diagram showing the sequence of steps in a battery test.

FIG. 31 depicts the battery test of flow sequence for executing a test of one battery, such as battery 402. The host controller 480 sends a test command in step 570 to one pod 408. The pod 408 acknowledges the receipt of a test command by flashing a green LED 572 which is mounted on the exterior of the pod 408. The microcontroller 420 in the pod 408 then turns the green LED off in step 574, turns the wireless node off in step 576, and turns on the test circuit in step 578. The microcontroller 420 then gathers test data in step 580 as described above. At the completion of the test, the microcontroller 420 ends the test in step 582, flashes the yellow LED 584 on the exterior of the pod 408 and then turns the yellow LED off in step 586. The microcontroller 420 compares in step 588 the test data gathered in step 580 with the set threshold value for the particular pod set in step 496. If the test data is within the threshold as checked in step 590, the microcontroller 420 turns on the wireless node in step 592 and sends the data in step 594 to the host controller 480.

However, if the test data is not within or below the threshold as checked in step 590, the microcontroller 420 turns on a red LED 596 on the pod 408, flags the data, and couples it with the pod ID in step 598. The microcontroller 420 then turns on the wireless node in step 592 and sends the data to the host controller in step 594.

This sequence is repeated by each of the pods established in the pod ID collection step 486 shown in FIG. 31 until all of the battery tests are completed.

After data from all of the pods 408 is stored in the controller 480, the modem coupled to the controller 480 will dial out to a preset telephone number associated with the network server. Once the connection is made to the server, the controller 480 will send the daily log file over a TCP-IP datastream to the server. After the data has been received in the server software, the data is parsed into a searchable database structure which the user can use to search for information regarding information entered during field setup, battery conditions, etc. Any of the geographic indications described above and shown in FIGS. 17-20 to identify the location of the defective battery or batteries.

The battery monitoring apparatus of the present invention is also capable of executing other battery tests. A nominal battery voltage test uses a resistor divider that divides the nominal voltage of the battery by four and supplies the scaled voltage to the microcontroller 420. A programmable nominal battery voltage threshold equal to a 50% rise or a 50% drop in the nominal battery voltage, for example, can be factory set or programmed by the user to indicate a bad battery.

The internal battery resistance is proportional to the voltage rise, that is, if the voltage goes up, so does the internal resistance. However, internal resistance is only affected on a rising voltage and not a dropping voltage. Thus, a drop in nominal battery voltage below the threshold (for example, 12.5 volt nominal voltage to 6.25 volts) does not have a drop in internal battery resistance.

The battery monitoring means can also monitor or conduct a negative battery post temperature test. A temperature sensor, such a temperature sensor model number Dallas DS1824 is imbedded into or coupled to the negative battery conductor or lead which is tied directly to the microcontroller 420.

The microcontroller 420 can display the negative battery post temperature in either Fahrenheit or Celsius. A threshold is programmed into the microcontroller 420 to detect a temperature rise above a predetermined amount. For example, the negative battery temperature threshold can be set at 50% above the ambient temperature. For example, is the ambient temperature is 77° F., as measured by a temperature sensor in the cabinet or hub 14, and the negative battery post temperature is 115.5° F., the battery is failing due to thermal runaway. The negative battery post temperature threshold can be factory set or programmed by the user using the Setup Utility Program shown in FIG. 28.

Referring now to FIGS. 33-52, there is depicted another aspect of a battery monitor apparatus 610. The apparatus 610 includes a housing 612 which may be mountable within a conventional telephone cabinet or hut, by way of example only. The housing 612 includes at least one battery 614. By way of example only, one or more strings 616, 618, etc., of serially connected batteries 614, 620, etc., are mounted in the housing 612. Each battery 614, 620, etc., includes a pair of battery posts 622 and 624 which are connected by cables, not shown, to telephone equipment within an overall housing in which the housing 612 is mounted or directly within the housing 612.

A battery monitor, hereafter referred to as a pod 626, is mounted on each battery 614, 620, etc., and connected by cables and Kelvin connections 628 and 630 to the individual battery posts 622 and 624 respectfully.

A network bus connection 632, described in greater detail hereafter, is serially connected between each pod 626 in each battery string 616, 618, etc.

A current flow meter (CFM) 634 is also mounted in the housing 612. A data collection module (DCM) 636 is also mounted in the housing and connected by conductors or cables to the pods 626 on the individual battery 614, 620, etc., as described in greater detail hereafter.

Figure 41:
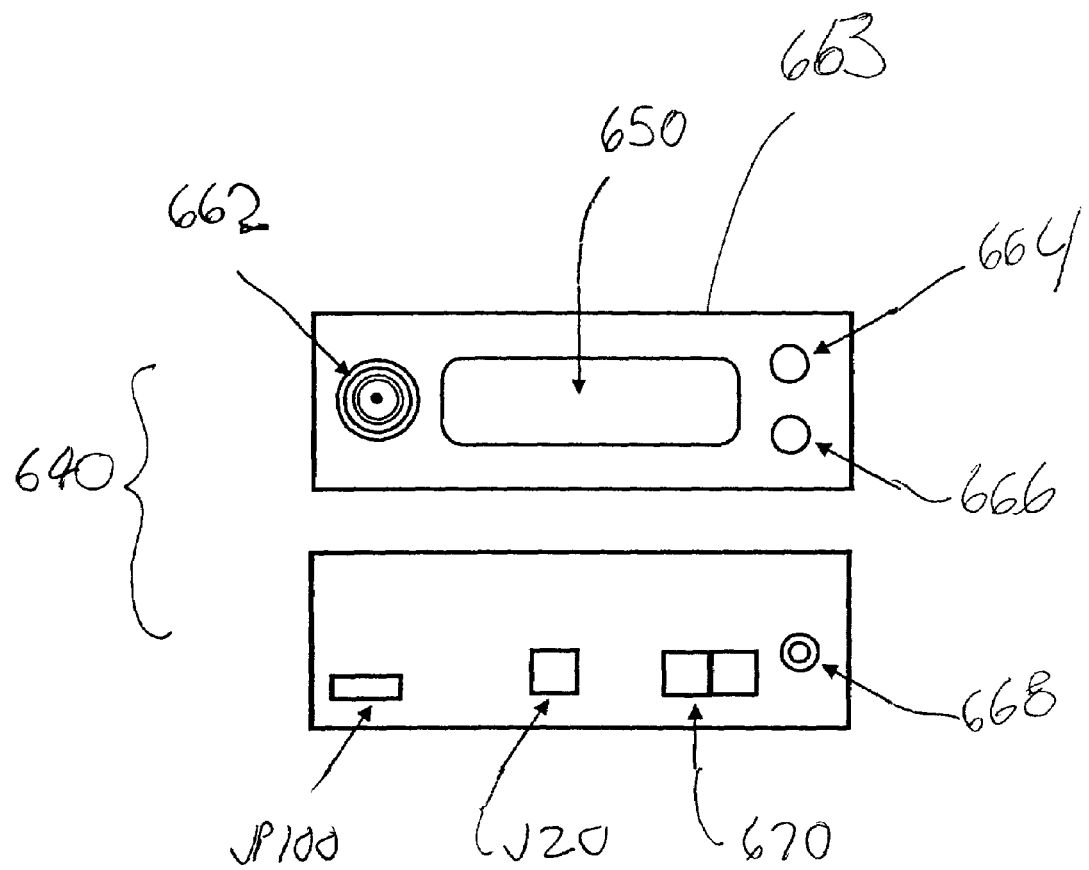
FIG. 41 is a combined front and back view of the data collection module housing layout.

Referring now to FIGS. 33-43, the data collection module 636 includes circuit elements and components mounted within a housing 640 shown in detail in FIG. 41.

The data collection module 636 includes, as its components, a microcontroller or CPU 640, a real time clock (RTC) 642, a memory 644, such as a programmable read only memory or EEPROM1, a telephone communication connection or modem 645, a controller area network or CANbus 646, a universal serial bus 648, and a visual display 650, such as an LCD display, by example only.

Figure 34:
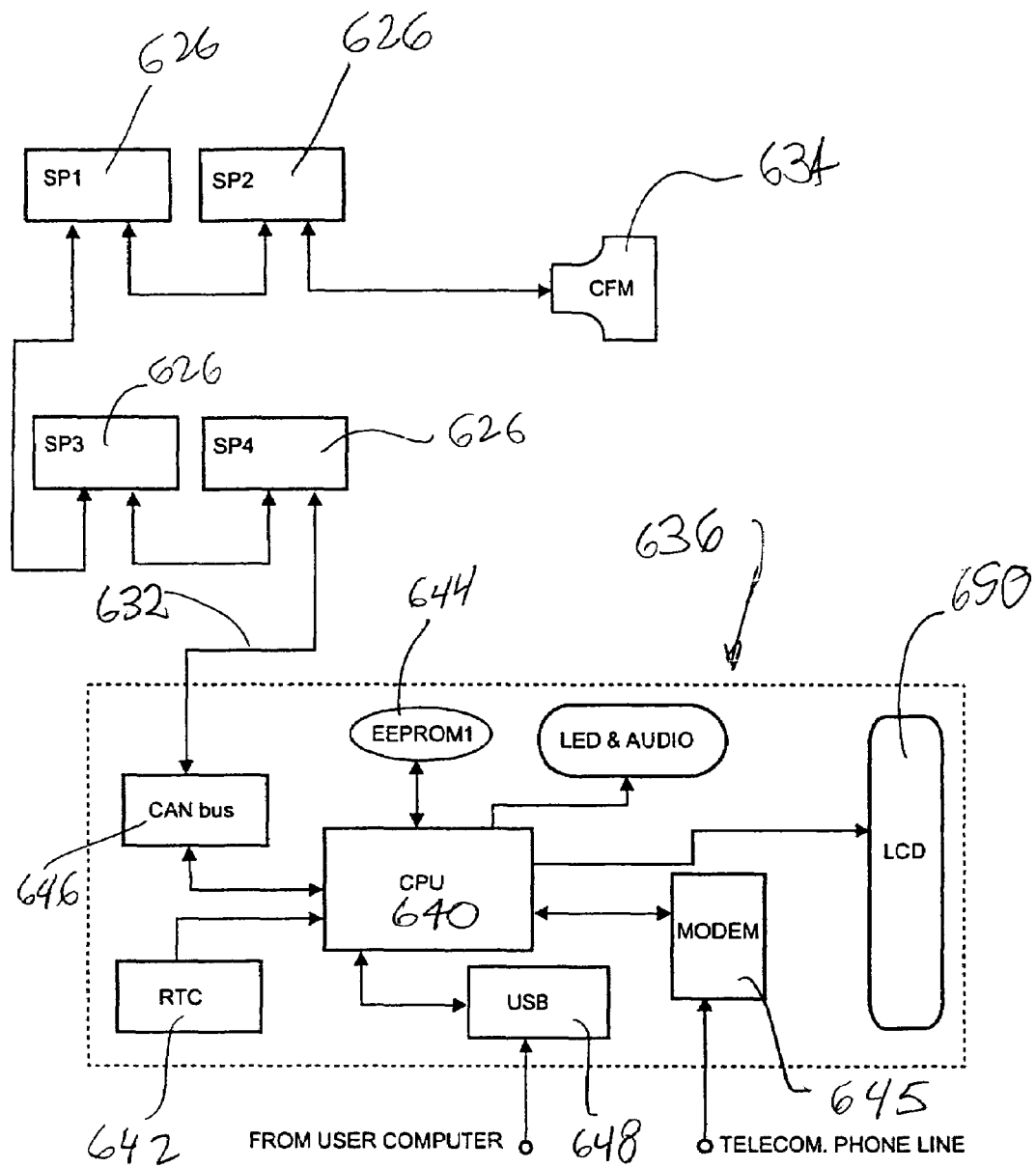
FIG. 34 is a block diagram of the microcontroller of the battery monitoring apparatus shown in FIG. 33.
Figure 35:
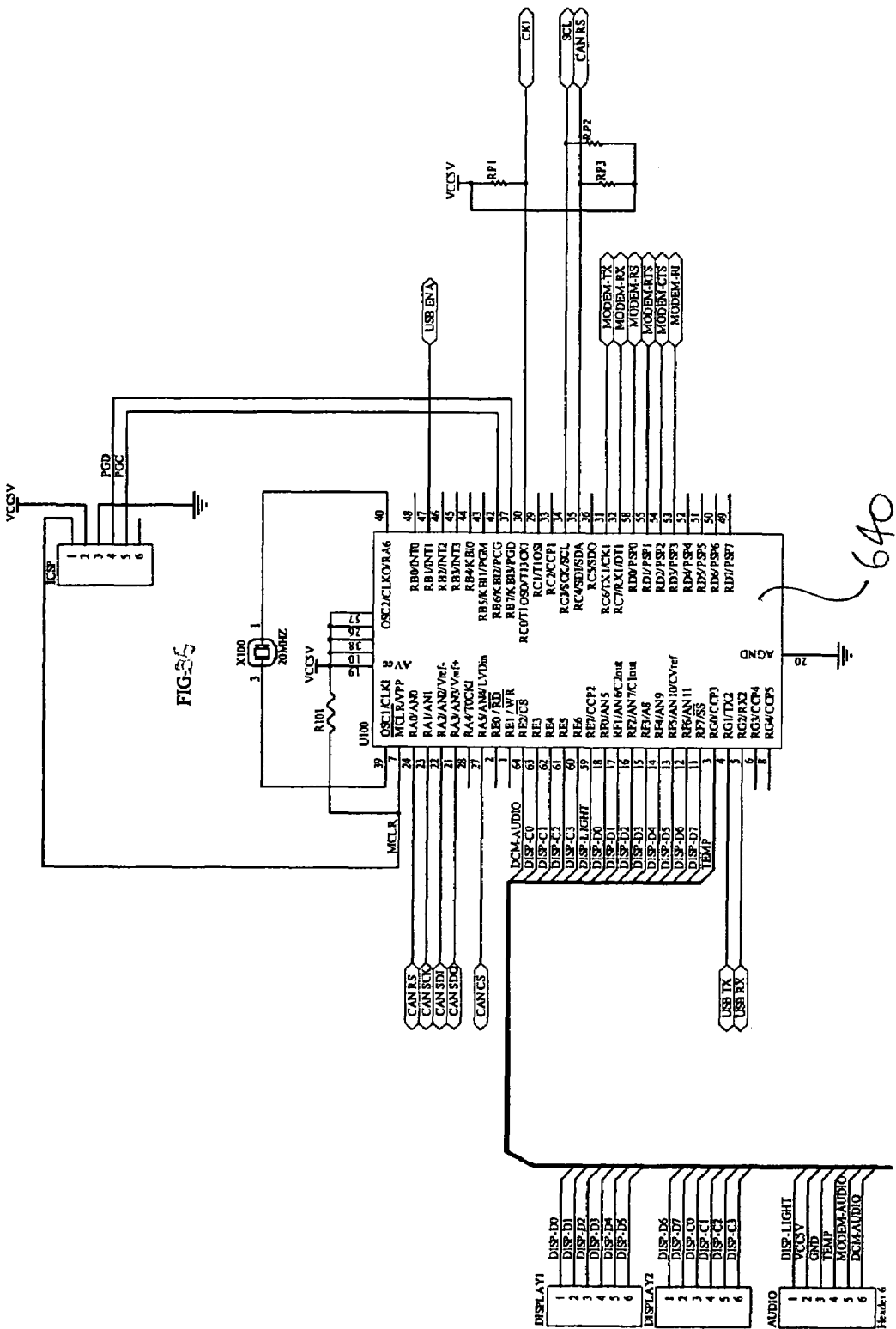
FIG. 35 is a schematic diagram of the microcontroller shown in FIG. 34.

As shown in FIGS. 34 and 35, the microcontroller or CPU 640 executes a stored software control program to control all of the other components of the data collection module 636.

Figure 36:
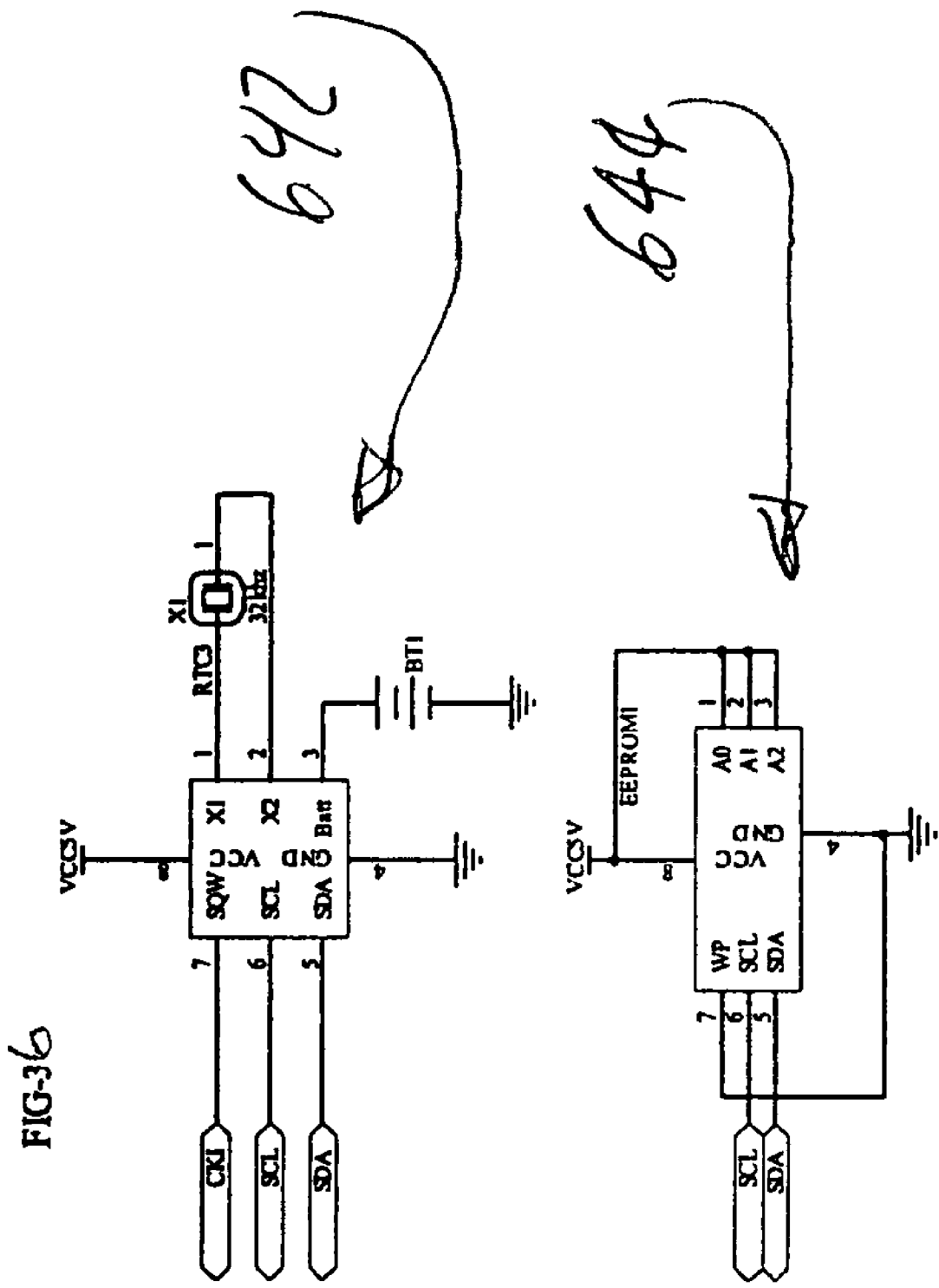
FIG. 36 is a schematic diagram of the real time clock of the battery monitoring apparatus shown in FIG. 34.

The real time clock 642 shown in detail in FIG. 36, generates time and date information. The CPU 640 uses the real time clock 642 to send commands to other components of the data collection module 636 that require or request a time-date tag.

The memory or EEPROM1 644 acts a storage place for data. Data is collected from the pods 626 which are connected to the data collection module 636 by the CANbus interface 646. By example only, collected data may include time and date, data collection module ID number, pod ID number, battery string number, battery number within each string, pod volts DC, pod low volts, pod peak high volts, pod milliohms, and pod temp. This data is stored in the memory 644 until the CPU 640 requests the data to be sent to the end user via the modem 645.

The modem 645 is, by example only, E-device chip modem, model number EDmod100. The modem 645 connects directly to the CPU 640. By using stored program commands, the modem 645 and the microcontroller 640 access and store at least one dial out telephone number to a remote controller or CPU.

The controller area network bus 646, shown in detail in FIG. 38, carries communications between the microcontroller (CANbus) 640 and the pods 626. The microcontroller 640 uses the CANbus 646 to send and receive data to and from the pods 626 and any other devices connected to the CANbus 646.

As shown in FIG. 38, pins 2 and 5 of connector J20 provide a five volt output to power external five volt devices.

Figure 4:
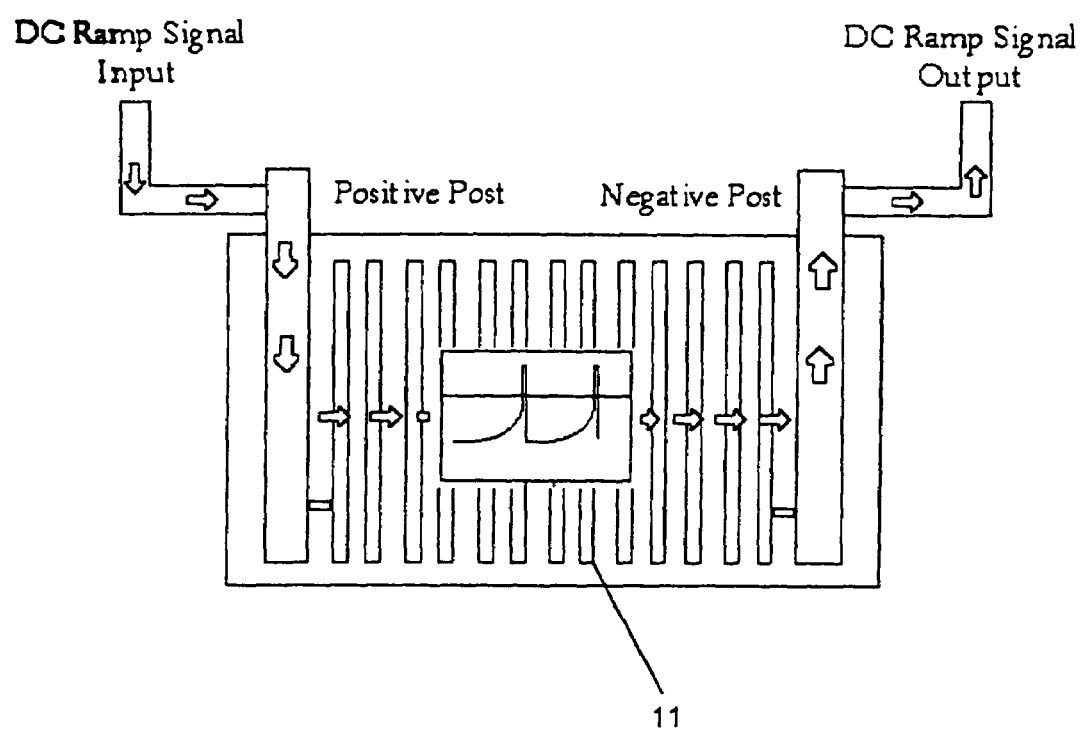
FIG. 4 is a pictorial representation showing one aspect of the battery monitoring test.
Figure 5:
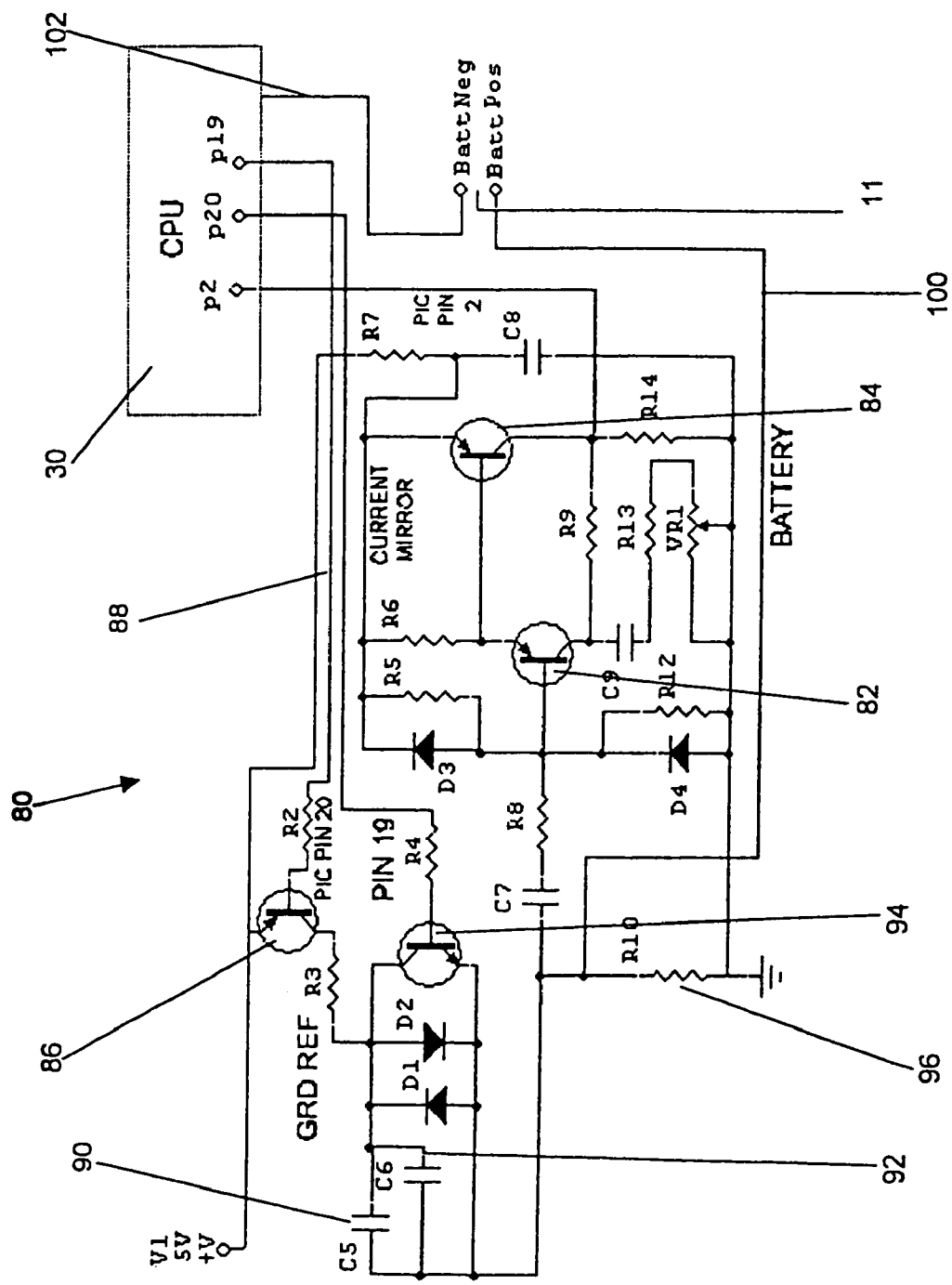
FIG. 5 is a circuit diagram of the DC ramp generator circuit utilized in the aspect shown in FIGS. 2-4.

The universal serial bus (USB) 648, shown in FIG. 34, and in greater detail in FIG. 39, provides a communication link between the microcontroller 640 and a user set up device or verifier 654 shown in FIG. 4. Using a TERM program, such as Microsoft™ HyperTerminal, the end user can set up the data collection module 636 by filling in fields displayed in the term window.

As shown in FIG. 34, in a greater detail in FIG. 40, the display 650 is, by example only, a 2×16 LCD display. The display 650 is used to show the status of the modem 645. Integrated circuit model number CD4050B makes up an audio section to output sound inputs 658 through an audio device, such as a speaker 662. The audio output from the speaker 662 can be used as an audio able confirmation during pod set up as well as to audibly indicate the modem dialing status.

Integrated circuit 660 make up the visual indicator portion of the display 650.

As shown in FIG. 41, the speaker 662 is mounted on the front panel of a housing 663 of the data collection module 636. The display 650 is also mounted in the front panel along with a system status light or LED 664 and a modem status light 666.

The rear panel of the housing 663 includes a five volt modem input connector 668 (see also FIG. 37), telephone line input to the modem 670, (see also FIG. 37), the CANbus connector J20 (see FIG. 38), and a USB port connector J100 (see FIG. 39).

Figure 37:
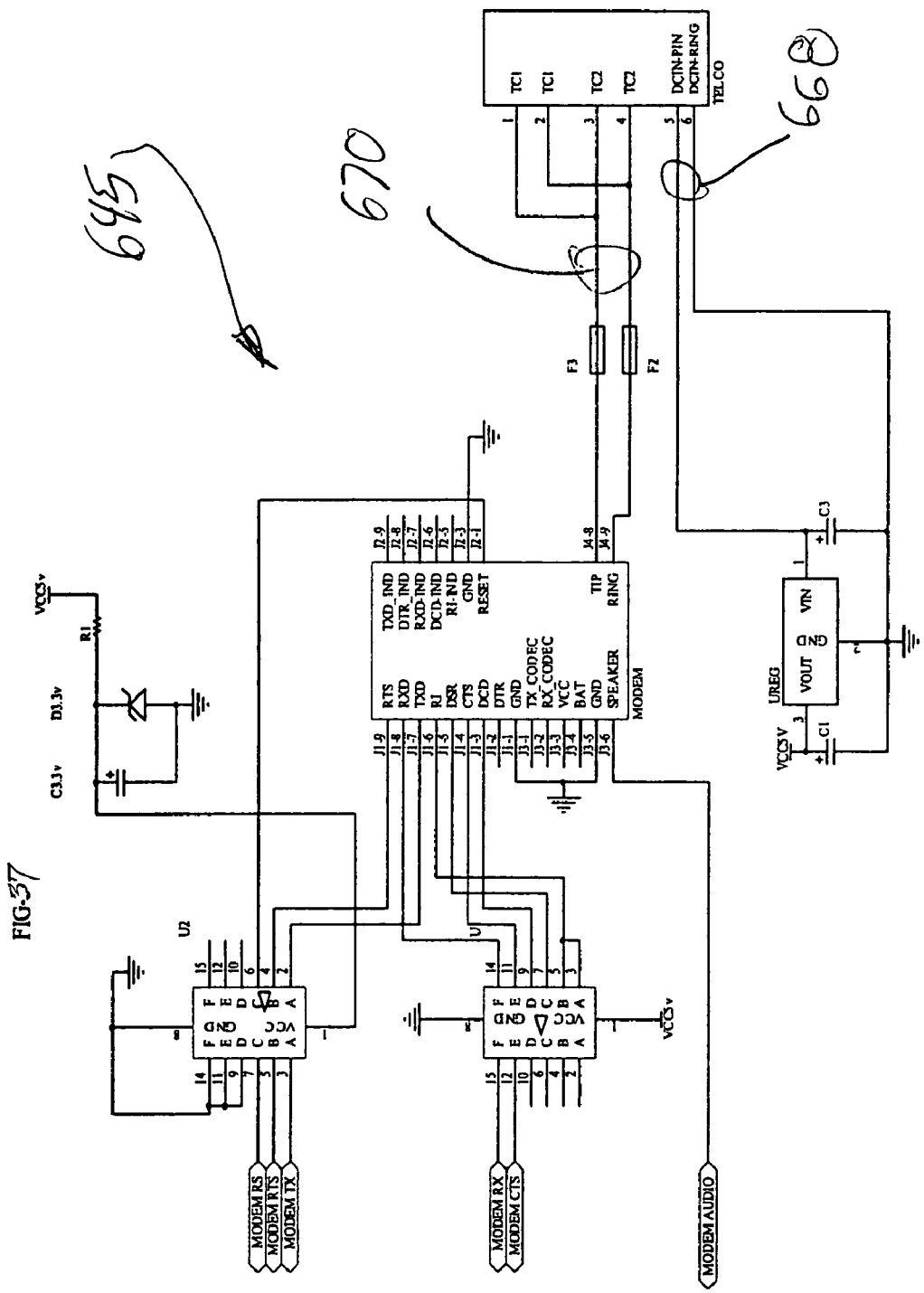
FIG. 37 is a schematic diagram of the modem used in the battery monitoring apparatus shown in FIG. 34.
Figure 58:
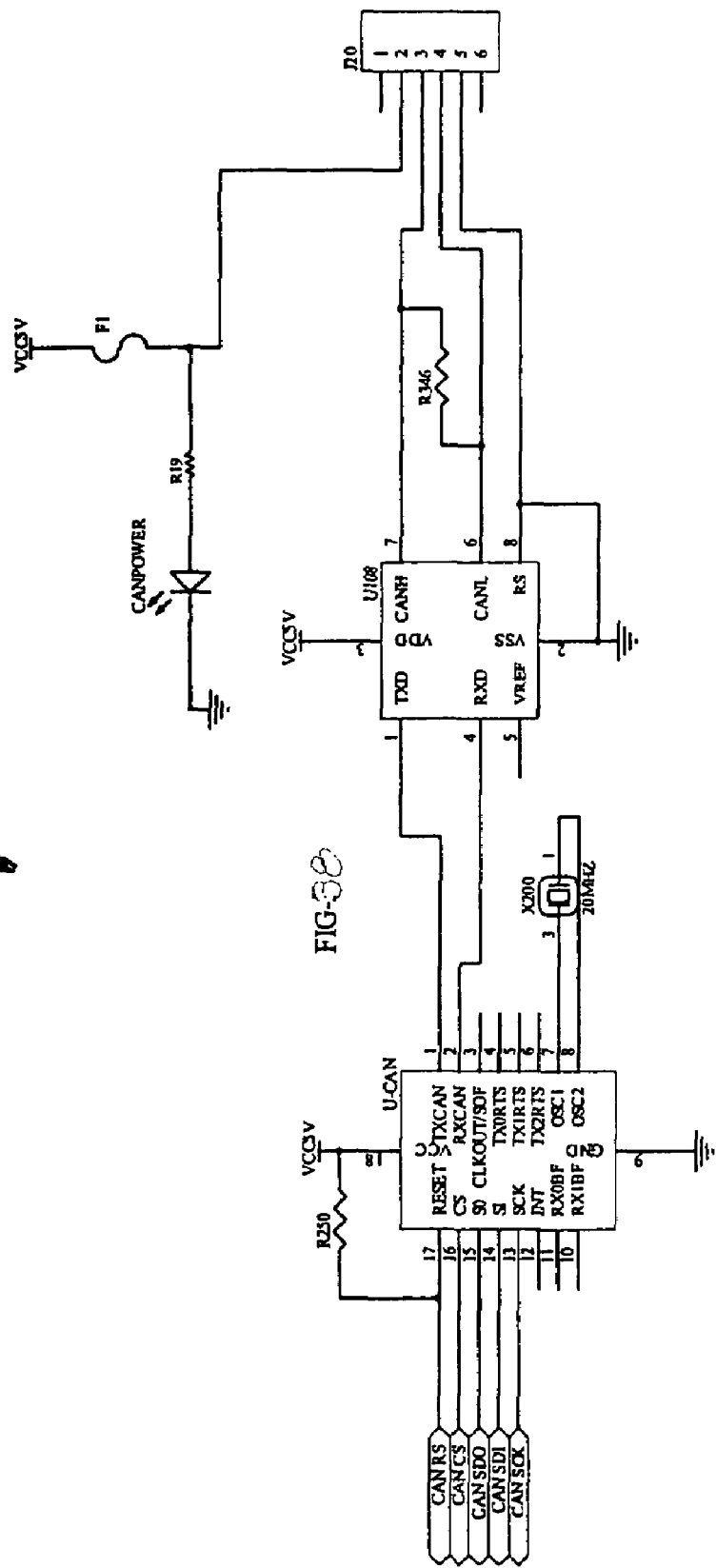

Power supplied to the data collection module 636 to a five volt power input vcc5v, as shown in FIG. 37. The power source can be directly from the twelve or forty-eight volt battery string voltage wherein the battery under test powers the data collection module 636 or through an AC power adapter from a 120VAC power source.

Once electric power is supplied to the data collection module 636 connection is made by the data collection module 636 to the first pod 626 in the first battery string 616 via the CANbus pins 3 and 4 of the J20 connector shown in FIG. 38. The CANbus can be customized to use pins 2 and 5 of the J20 connector to allow a five volt output feed for other five volt devices, such as a current flow meter 634 in FIG. 42. The series of connections via the CANbus 632 are made from pod 626 to pod 626. The last pod 626 on each string 616 or 618 of pod 626 will have an open CANbus connector. This connector can be used of other devices, such as the current flow meter 634 or alarm monitoring devices.

A standard telecommunication phone line is connected to the data collection module by using a standard RJ11 type connector to the female RJ11 of the data collection module as shown in FIG. 37. This provides connection between the data collection module 636 and the outside world.

A connection can be made from the data collection module 636 USB port, JP100, shown in FIG. 39, to any laptop or other device 654 running Microsoft™ HyperTerminal software. The CPU 640 is programmed to detect such a connection. Once the connection is made between the data collection module 636 and the terminal program, the system status light or LED, D1 in FIG. 40, turns green confirming that the connection has been made.

After the system status LED D1 turns green, the user can press the enter key on the keyboard of the laptop or verifier 654. A confirmation menu appears in the HyperTerminal window as well as being displayed on the LCD display 650. The displayed menu allows for new setup or editing of the existing system. During setup of a new system, the user selects commands from the menu. These commands are sent to the microcontroller 640 and then on through the CANbus 626 to any or all devices on the CANbus network.

During the setup of one of the pods 626, a request for pod data is sent from the data collection module 636 via the HyperTerminal menu through the CANbus 632. The user then presses a button 651, FIG. 45, on each of the pods 626 in order from one through the last pod 626. As each pod button 681 is pressed, a tone or a beep is a heard through the speaker 662 of the data collection module 636 as acknowledgement that the particular pod setup is complete. This process is continued until the data collection module 636 detects all devices connected to the CANbus network. Data that is gathered during pod setup is then stored in the memory 644. After all the data is gathered and stored, the user then begins the setup process of the test timing cycle and enters telephone dial-out information. Using the HyperTerminal menu, the user inputs a time and date stamp as to when the data collection module 636 will start its normal testing cycle.

Upon completion of this setup process, the user then sets up the dial-out information needed by the modem 645. Using the HyperTerminal menu, the user can input a three to eleven digit telephone number. This information is stored directly in the modem 645.

Setup is now complete. Using the HyperTerminal menu, the user selects the Start Test Cycle option. A tone or beep is heard from the speakers 662 as acknowledgement that the system setup is complete. Upon removing the USB connection from the data collection module 636, the data collection module 636 will begin the testing cycle. The system status LED 666 begins to flash green to indicate that the system is in the test cycle mode.

The data collection module 636 is configured to monitor lead acid battery state of health via the pod 626 as well as to monitor itself. The connected pod 626 listen to the CANbus for directions from the data collection module 636. The data collection module 636 requests a report of the state of health of the battery that each pod 626 is connected to. When the pods 626 receive the run test command from the data collection module 636, each pod 626 begins running its program test cycle. This test cycle gathers at least one and, by example, three data points to determine the state of battery health, including, battery nominal voltage, internal battery resistance, and battery post temperature.

Prior to sending the requested battery data to the data collection module 636, the pod 626 compares collected data to the pre-programmed threshold of the battery. The data is then sent on to the data collection module 636 via the CANbus network. If all three data points fall within the threshold boundaries, the data is sent to the data collection module 636. If any of the three data points are out of the threshold boundaries, the pod 626 flags the data with an alarm tag *Baseline Error* for that pod 626 as shown in FIG. 43. This data is sent to the data collection module 636 for storage in the memory 644 until the data collection module 636 requests that the data be sent via the modem 645 to an external CPU.

The time to send the stored data is set by the user, such as, once every twenty-four hours, etc.

There may be one or more types of priority battery alarm thresholds, such as, low battery voltage and high battery temperature. If either of these thresholds is out of the threshold boundaries, the data collection module 636 commands the modem 645 to send this data a priority signal overriding the present user set time for the data to be sent.

The data collection module 636 may also have the ability to monitor itself for failed components. Upon connecting electric power to the data collection module 636, a P.O.S.T. (power on self test) sequence begins. During the P.O.S.T., the system status light 664 is red. The microcontroller 640 sends a command to each section of the data collection module 636, the CANbus controller 646, the modem 645, the memory 644 and the real time clock 642. As each of these components or sections are being tested, the microcontroller command is displayed in the display 650. As each section replies to the microcontroller 640 command, the display 650 displays the tag line INIT at the end of the section name, such as, "RTC . . . INIT" confirming communications between the microcontroller 640 and that section.

After all the sections have received the INIT status, the display 650 displays the time, date, and temperature of the data collection module 636 on the first line and Ready on the second line of the display 650. The system status light 664 begins to flash green. A beep is output through the speaker 666 indicating that all of the sections of components of the data collection module 636 are ready.

If during the P.O.S.T. sequence, a section fails to INIT, the display 650 displays the messages "Time Out" after that section has failed, such as, "CANbus . . . Time Out", indicating that that section is not communicating with the microcontroller 640. If a Time Out is reported to the display 650, the data collection module 636 should be replaced in its entirety.

Referring now to FIGS. 42A and 42B, the details of the Current Flow Meter (CFM) 634 will be described. The CMF 634 is daisy chained to the DCM 636 through the CANbus 646. The CFM 634 is a DC current measuring device. Its purpose is to measure the amount of current flowing from the charging unit into the battery or batteries. It also can measure the amount of current being drawn from a battery or batteries.

By monitoring the amount of incoming current from a charging unit, over charging and under charging can be monitored to prevent damage to the battery or batteries.

During an AC failure monitoring the amount of current being drawn from a battery or batteries can determine the amp per hour draw. By knowing this factor the amount of battery up time can be determined.

As shown in the detailed circuit in FIG. 42 B, a current flow sensor or CSI 635 can be a single-axis integrated Hall effect magnetic field sensor for AC and DC current measurement applications, with a linear output voltage proportional to a magnetic field. The CSI 635 can be a surface mount IC. Its design allows for a power lead to be placed on top of it. No cutting or removal of the power leads is necessary.

Depending on the direction of current flow, the CSI 635 outputs a DC micro voltage, with a positive voltage output for one direction and negative output voltage for the opposite direction of current flow.

Using an A/D converter 637 the micro voltage output is converted from an analog voltage to a digital voltage and fed to a micro controller 639.

The CFM 634 connects to open CANbus connector 647 on the last Smart Pod. This connection provides the 5-volt power source for CFM 646 circuit as well as the data path to the DCM 636.

Referring now to FIGS. 44-52, there was depicted a construction and operation of each pod 626.

Figure 44:
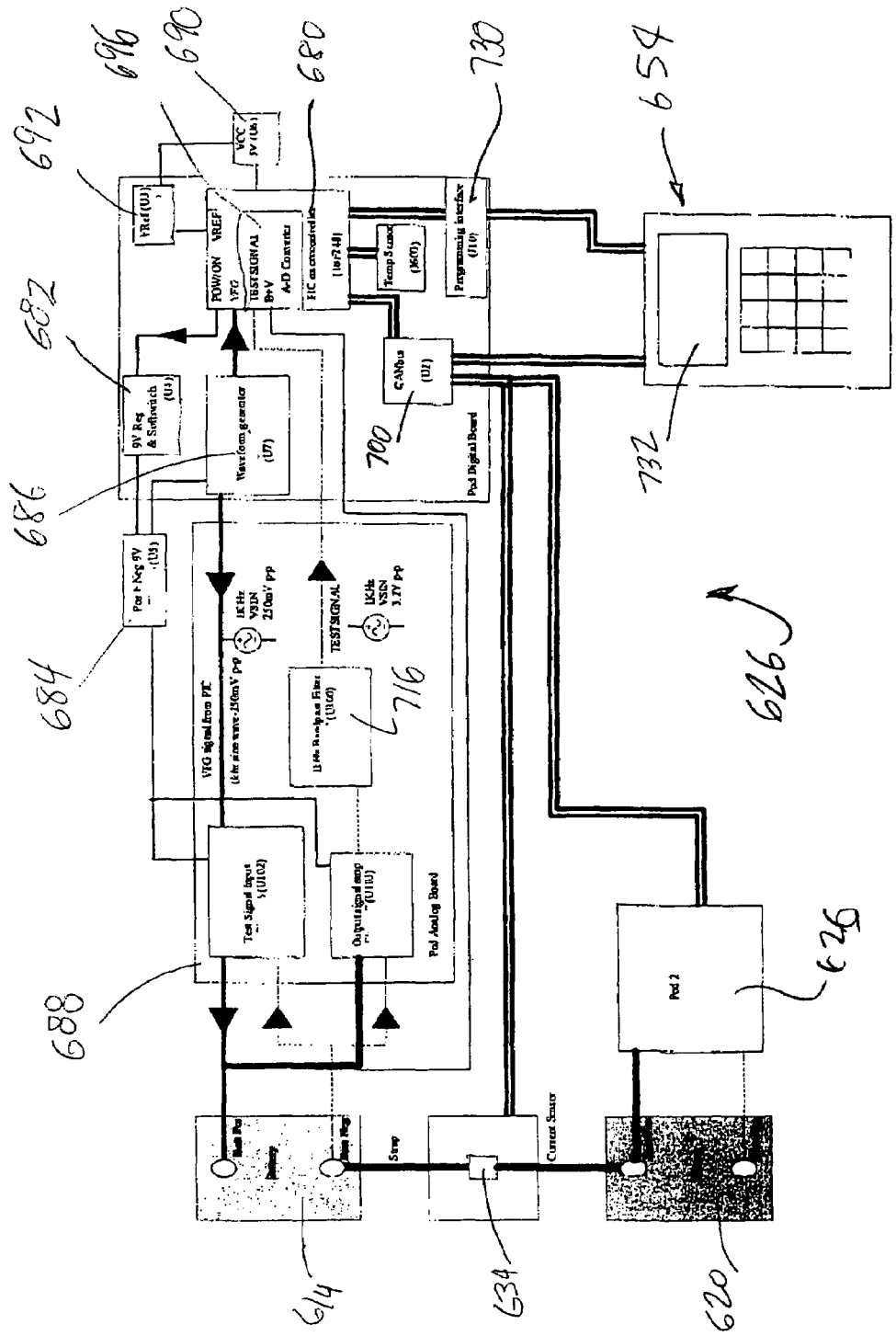
FIG. 44 is a flow chart and block diagram of a pod of the battery monitoring apparatus shown in FIG. 34.
Figure 45:
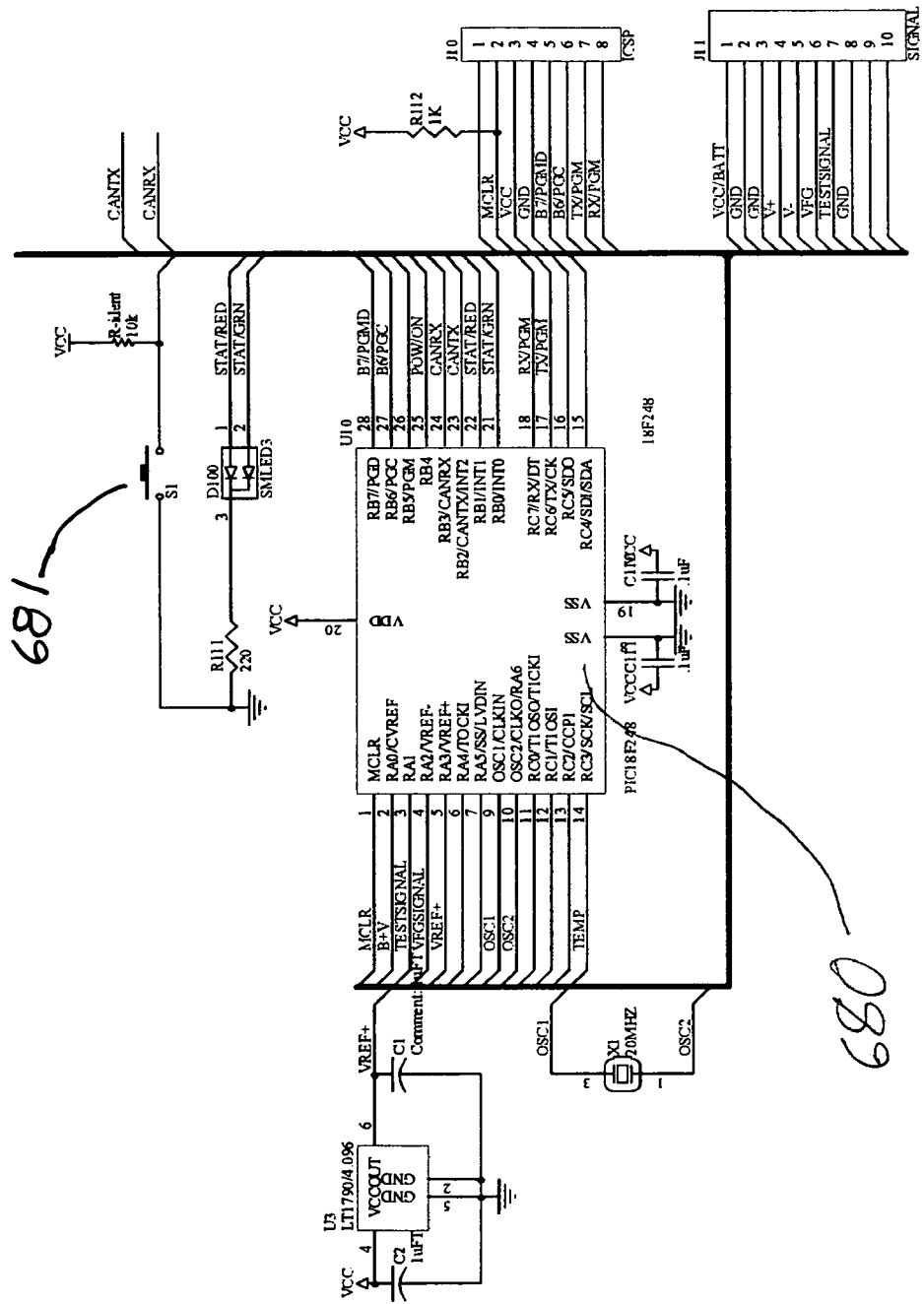
FIG. 45 is a schematic diagram of the microcontroller used in the pod depicted in FIG. 44.
Figure 46:
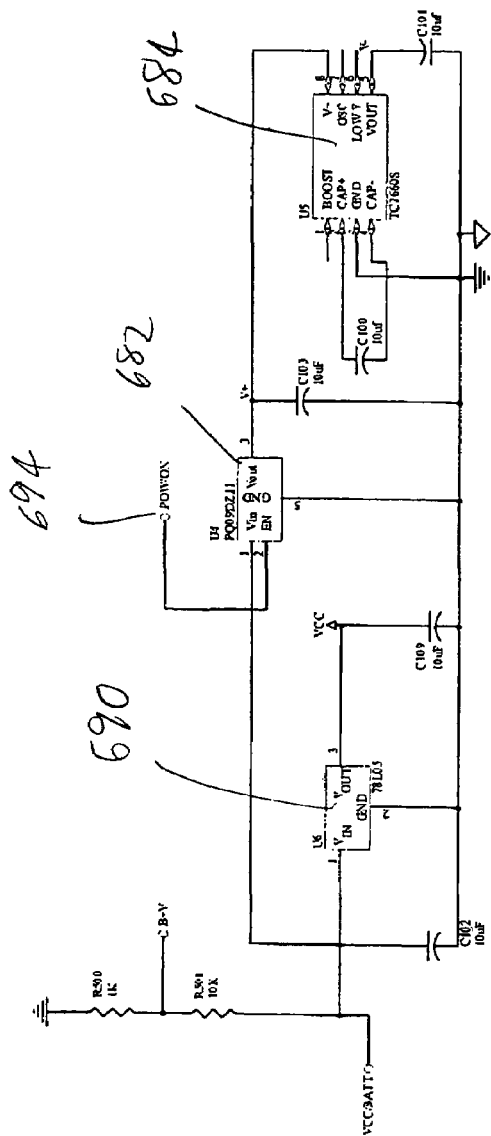
FIG. 46 is a schematic diagram of the power supply for the pod shown in FIG. 44.

As shown in FIGS. 44 and 45, each pod 626 includes a CPU 680 in the form of a PIC 18F248 microcontroller, for example. The microcontroller 680 starts the testing sequence by sending a power up signal to a soft switch 682 enabling the application of the dual rail 9V voltage from voltage regulator 684 to the waveform generator 686 and a pod analog circuit board 688.

A +5V power supply 690 supplies power to the microcontroller 680 and the voltage reference circuit 692. The +9V and −9V, generated by the charge pump rail splitter 682 and 684 provide dual ended supplies for the waveform generator 686 and the analog circuit board 688. The +−9V power is turned on by the microcontroller 680 through the POW/ON pin 694 in FIG. 46.

An analog to digital (A/D) converter 696 is formed of an external voltage reference 692 and part of the microcontroller 680. The voltage reference 692 generates a precision reference voltage of +4.92 volts applied to the VREF+ input for the internal A/D converters of the microcontroller 680 to generate the digital signal levels.

Figure 47:
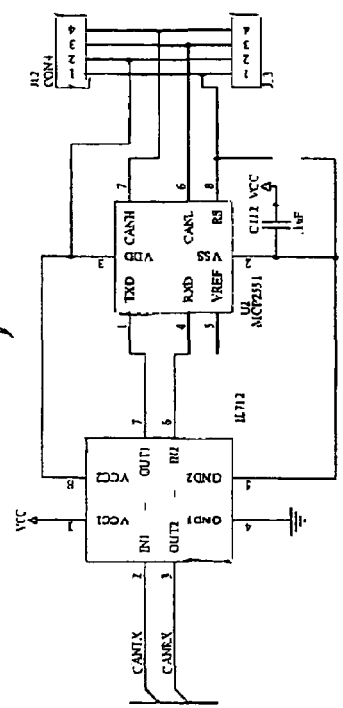
FIG. 47 is a schematic diagram of one aspect of a network bus connecting multiple pods shown in FIG. 34.

A CANbus transceiver 700 is mounted on the digital circuit board of each pod 626 as shown in FIGS. 44 and 47 to allow communication with the verifier 654 and other devices, such as the current flow meter 634.

When the waveform generator 686 and related resister/capacitor networks shown in FIG. 48, begin generating a 1 Khz sinewave (VFG). The signal is also returned to the microcontroller 680 as VFGSIGNL from the output of the waveform generator 686 for comparison with TESTSIGNAL in final processing.

The TESTSIGNAL VFG is a 1 Khz sinewave 250 mV peak to peak in amplitude which is routed from the waveform generator through connector J100 to a test signal input pin on the analog circuit board.

This A/C voltage (VFG) is superimposed on a much larger negative D/C voltage (−400 mV) to the inverting input of op-amp 711, which causes the op-amp output to go high and turn transistor 713 on. This allows battery current to flow through the high side current sensing amplifier 710. The output current of the amplifier 710 equals 1/2000 of the battery current.

The output of the amplifier 710 is fed back to the inverting input of the test signal input amplifier 711 which constitutes a servo control circuit providing a tightly controlled and predictable test signal which is applied to the battery to calculate the actual impedance of the battery under test.

Figure 51:
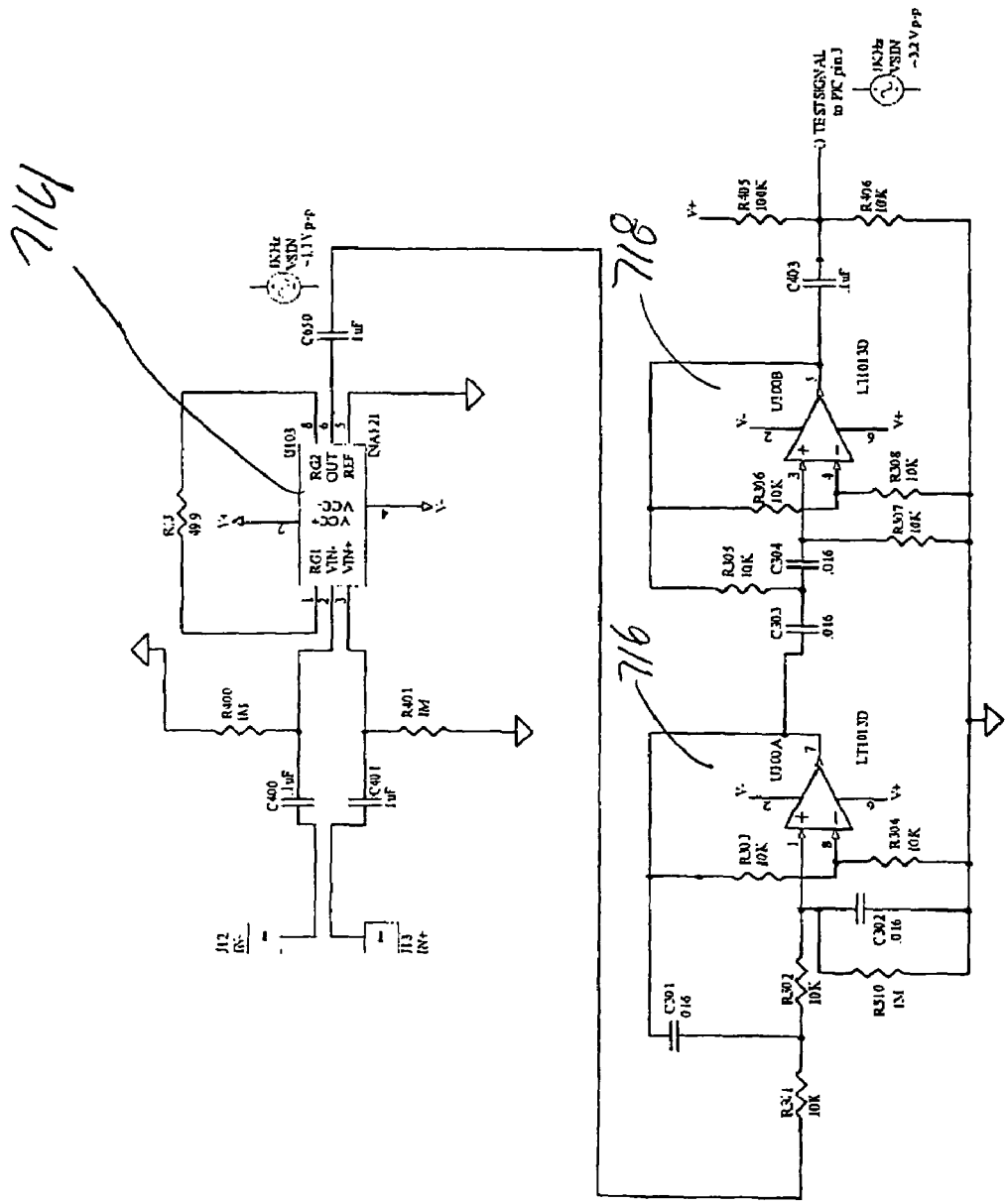
FIG. 51 is a schematic diagram of the test signal output circuit shown in FIG. 34.

As shown in FIG. 51, the return signal from the battery under test is picked up by instrumentation amplifier 714 across the battery terminals or posts 628 and 630 (Kelvin connection) and return to the microcontroller 680 through a high pass filter 716 and a low pass filter 718 to isolate and clean up TESTSIGNAL as it is returned to the microcontroller.

As shown in FIG. 50, each pod 626 has a temperature sensor 720 that plugs into a connector 722 which generates a temperature variable voltage. This voltage is read by the microcontroller 680.

The verifier or remote CPU 654 communicates through a programming interface connector 730 with the microcontroller 680. The verifier 654 is used to set baselines or threshold range boundaries for battery voltage, battery temperature and current, and output. The results are displayable on a graphical LCD display 732.

Figure 52:
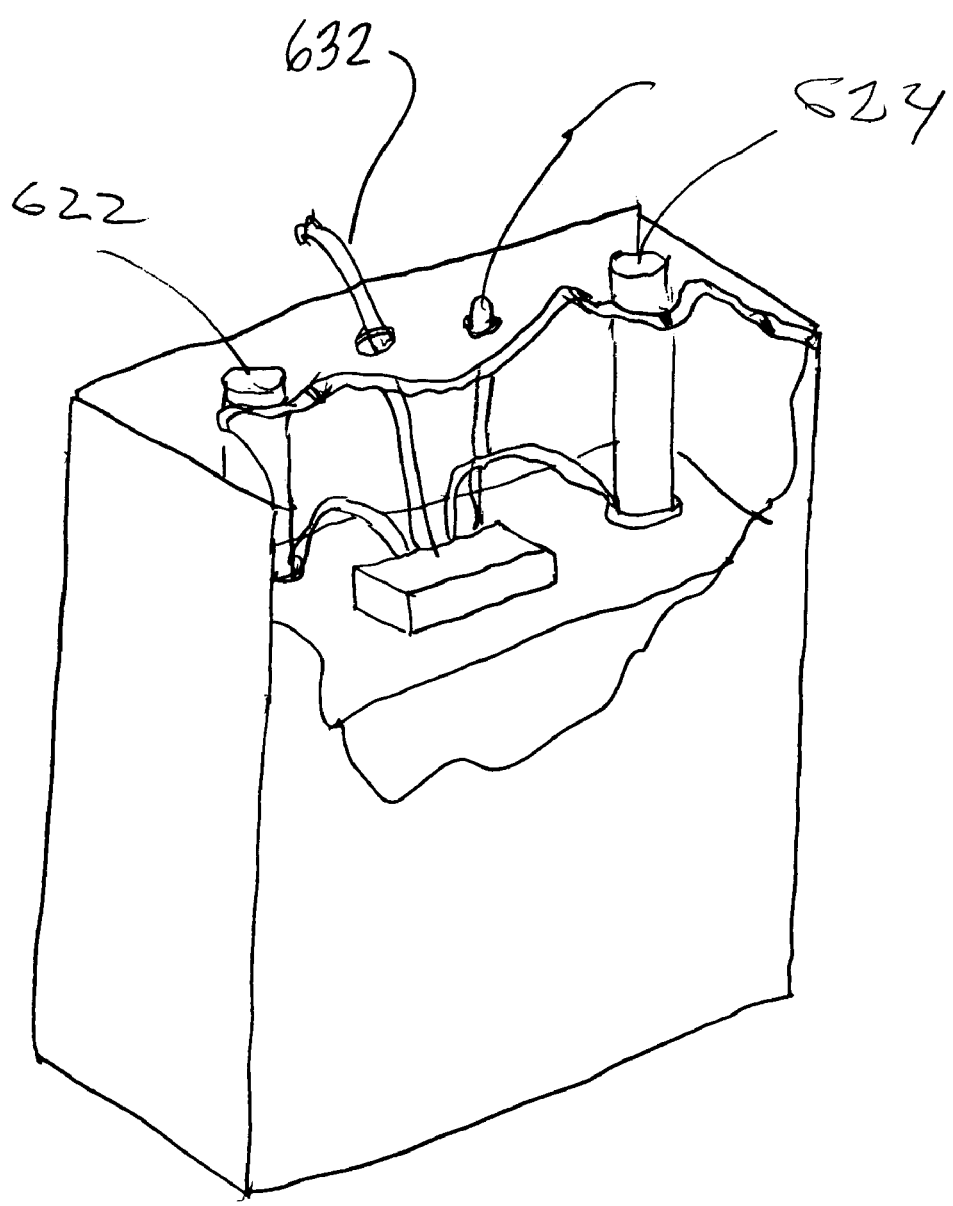
FIG. 52 is a pictorial representation of another aspect of a battery and pod mounting case.

Typically the pods 626 are mounted externally on each battery 614, etc. Alternately, the pods 626 may be encased within the battery casing itself, as shown in FIG. 52, to create a self-monitoring battery unit. In such a configuration, the battery case may be extended in at least height to accommodate the pod 626 or the pod may be incorporated directly into the standard battery case.

The Kelvin connections are permanently affixed to the battery terminals 622 and 624 during manufacture of the battery and when a pod 626 is enclosed within the battery. The pods 626 are connected via the CANbus connections through small openings in the case.

What is claimed is:

1. An apparatus for monitoring an operative condition of each of a plurality of batteries comprising:
   a control mounted on each battery and detecting a battery operating parameter;

the control comparing the detected battery operating parameter with a threshold value to determine an operative condition of the battery;

a data collection module including a processor and communicating with a data memory and executing a stored control program; and a central area network serially connecting the control on each of a plurality of batteries with the data collection module.

2. The apparatus of claim 1 wherein:

the control and the battery are mounted in a single case.

3. The apparatus of claim 2 further comprising:

an illuminatable element, activated by the control, to provide a visual indication of at least one of the battery test state and the determined battery operative condition.

4. The apparatus of claim 3 wherein:

the illuminatable element is mounted in proximity to the battery.

5. The apparatus of claim 2 further comprising:

an electric power source for supplying electric power to the control.

6. The apparatus of claim 5 further wherein the power source comprises:

Kelvin connections adapted to electrically connect the control to positive and negative terminals of a battery.

7. The apparatus of claim 1 wherein the control further comprises:

means for testing at least one of battery internal resistance, battery nominal voltage and battery terminal temperature.

8. The apparatus of claim 7 wherein the control stores the detected battery condition from a test of at least one of a battery internal resistance, nominal battery voltage and battery terminal temperature in the data memory.

9. The apparatus of claim 1 further comprising:

means for storing at least one of the time and day date in the data memory for communicating battery conditions to the data collection module.

10. The apparatus of claim 9 further comprising:

the control flagging the test data with an alarm tag when any of the battery test conditions are out of threshold boundaries; and the control transmitting the alarm tag to a remote controller at one of the set one of the time and the date, and immediately for at least one of the tested battery conditions.

11. The apparatus of claim 1 further comprising:

a modem, coupled to the data collection module, for communicating battery test data externally of the data collection module.

12. The apparatus of claim 1 further comprising:

a portable processor executing a stored control program connectable in data communication with the data collection module.

13. The apparatus of claim 12 further comprising:

a universal serial bus connection between the portable processor and the data collection module.

14. The apparatus of claim 1 further comprising:

a current flow meter serially connected to the batteries.

* * * * *